United States Patent
Aoki et al.

(10) Patent No.: US 9,935,617 B2
(45) Date of Patent: Apr. 3, 2018

(54) SEMICONDUCTOR DEVICE

(71) Applicant: Semiconductor Energy Laboratory Co., Ltd., Atsugi-shi, Kanagawa-ken (JP)

(72) Inventors: Takeshi Aoki, Kanagawa (JP); Munehiro Kozuma, Kanagawa (JP); Yoshiyuki Kurokawa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 109 days.

(21) Appl. No.: 14/574,884

(22) Filed: Dec. 18, 2014

(65) Prior Publication Data

US 2015/0188520 A1     Jul. 2, 2015

(30) Foreign Application Priority Data

Dec. 26, 2013 (JP) .................................. 2013-268613
Mar. 14, 2014 (JP) .................................. 2014-050958

(51) Int. Cl.
    *H03K 3/00*      (2006.01)
    *H03K 3/012*      (2006.01)
    (Continued)

(52) U.S. Cl.
    CPC ............. *H03K 3/012* (2013.01); *H03K 17/56* (2013.01); *H03K 19/173* (2013.01)

(58) Field of Classification Search
None
See application file for complete search history.

(56) References Cited

U.S. PATENT DOCUMENTS 5,731,856 A     3/1998     Kim et al.
5,744,864 A     4/1998     Cillessen et al.
(Continued)

FOREIGN PATENT DOCUMENTS

CN     001316827 A     10/2001
DE     69730775     9/2005
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Lincoln Donovan
*Assistant Examiner* — Khareem E Almo
(74) *Attorney, Agent, or Firm* — Fish & Richardson P.C.

(57) ABSTRACT

A semiconductor device that can operate normally with lower power consumption is provided. The semiconductor device includes a pair of first circuits which each include a first transistor and a second transistor capable of controlling the supply of a first signal to a gate of the first transistor, and a second circuit which is capable of generating a second signal which is to be supplied to a gate of the second transistor and which has a larger amplitude than the first signal. One of a source and a drain of one of the first transistors included in the pair of first circuits is electrically connected to one of a source and a drain of the other of the first transistors. The first signals supplied to the gates of the first transistors in the pair of first circuits have potentials with different logic levels.

20 Claims, 29 Drawing Sheets

(51) Int. Cl.
*H03K 17/56* (2006.01)
*H03K 19/173* (2006.01)

(56) References Cited

U.S. PATENT DOCUMENTS

| | | | |
|---|---|---|---|
| 6,111,427 A | 8/2000 | Fujii et al. |
| 6,294,274 B1 | 9/2001 | Kawazoe et al. |
| 6,404,230 B1 | 6/2002 | Cairns et al. |
| 6,426,261 B1 | 7/2002 | Fujii et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0110623 A1* | 5/2010 | Koyama .......... H01L 27/1248 361/679.01 |
| 2011/0175646 A1 | 7/2011 | Takemura et al. |
| 2012/0293200 A1 | 11/2012 | Takemura |
| 2013/0141157 A1* | 6/2013 | Takemura .......... G11C 19/184 327/534 |
| 2013/0293263 A1 | 11/2013 | Kurokawa |
| 2014/0103960 A1 | 4/2014 | Yamazaki et al. |
| 2014/0300403 A1* | 10/2014 | Okamoto .......... H03F 3/45076 327/333 |

FOREIGN PATENT DOCUMENTS

| | | |
|---|---|---|
| EP | 0809362 A | 11/1997 |
| EP | 1737044 A | 12/2006 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-007141 A | 1/1993 |
| JP | 05-251705 A | 9/1993 |
| JP | 08-264794 A | 10/1996 |
| JP | 10-065507 A | 3/1998 |
| JP | 11-505377 | 5/1999 |
| JP | 2000-044236 A | 2/2000 |
| JP | 2000-150900 A | 5/2000 |
| JP | 2001-274673 A | 10/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-236814 A | 9/2005 |
| JP | 2013-232548 A | 11/2013 |
| JP | 2013-251536 A | 12/2013 |
| KR | 2001-0092314 A | 10/2001 |
| TW | I270251 | 1/2007 |
| WO | WO-2004/114391 | 12/2004 |

OTHER PUBLICATIONS

Asaoka.Y et al., "29.1: Polarizer-Free Reflective LCD Combined With Ultra Low-Power Driving Technology", SID Digest '09 : SID

(56) References Cited

OTHER PUBLICATIONS

International Symposium Digest of Technical Papers, May 31, 2009, pp. 395-398.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Clark.S et al., "First Principles Methods Using CASTEP", Zeitschrift fur Kristallographie, 2005, vol. 220, pp. 567-570.
Coates.D et al., "Optical Studies of the Amorphous Liquid-Cholesteric Liquid Crystal Transition:The "Blue Phase"",Physics Letters, Sep. 10, 1973, vol. 45A, No. 2, pp. 115-116.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.
Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.
Hosono.H et al., "Working hypothesis to explore novel wide band gap electrically conducting amorphous oxides and examples", J. Non-Cryst. Solids (Journal of Non-Crystalline Solids), 1996, vol. 198-2000, pp. 165-169.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Ikeda.T et al., "Full-Functional System Liquid Crystal Display Using Cg-Silicon Technology", SID Digest '04 : SID International Symposium Digest of Technical Papers, 2004, vol. 35, pp. 860-863.
Janotti.A et al., "Native Point Defects in ZnO", Phys. Rev. B (Physical Review. B), Oct. 4, 2007, vol. 76, No. 16, pp. 165202-1-165202-22.
Janotti.A et al., "Oxygen Vacancies In ZnO ", Appl. Phys. Lett. (Applied Physics Letters) , 2005, vol. 87, pp. 122102-1-122102-3.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kim.S et al., "High-Performance oxide thin film transistors passivated by various gas plasmas", 214th ECS Meeting, 2008, No. 2317, ECS.
Kimizuka.N et al., "Spinel,YbFe2O4, and Yb2Fe3O7 Types of Structures for Compounds in the In2O3 and Sc2O3—A2O3—BO Systems [A; Fe, Ga, or Al; B; Mg, Mn, Fe, Ni, Cu,or Zn] at Temperatures over 1000° C.", Journal of Solid State Chemistry, 1985, vol. 60, pp. 382-384.
Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits , 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED ", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "SUFTLA Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3—Ga2ZnO4—ZnO system at 1350° C.", Journal of Solid State Chemistry, Aug. 1, 1991, No. 2, pp. 298-315.
Nakamura.M, "Synthesis of Homologous Compound with New Long-Period Structure", NIRIM Newsletter, Mar. 1, 1995, vol. 150, pp. 1-4.

(56) References Cited

OTHER PUBLICATIONS

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Park.S et al., "Challenge to Future Displays: Transparent AM-OLED Driven by PEALD Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO (Ga2O3—In2O3—ZnO) TFT", SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs ", IDW '02 : Proceedings of the 9th International Display Workshops, Dec. 4, 2002, pp. 295-298.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Okamoto.Y et al., "Novel Application of Crystalline Indium-Gallium-Zinc-Oxide Technology to LSI:Dynamically Reconfigurable Programmable Logic Device Based on Multi-Context Architecture", ECS Transactions, Jul. 7, 2013, vol. 54, No. 1, pp. 141-149, The Electrochemical Society.
International Search Report (Application No. PCT/IB2014/067302) Dated Apr. 21, 2015.
Written Opinion (Application No. PCT/IB2014/067302) Dated Apr. 21, 2015.

\* cited by examiner

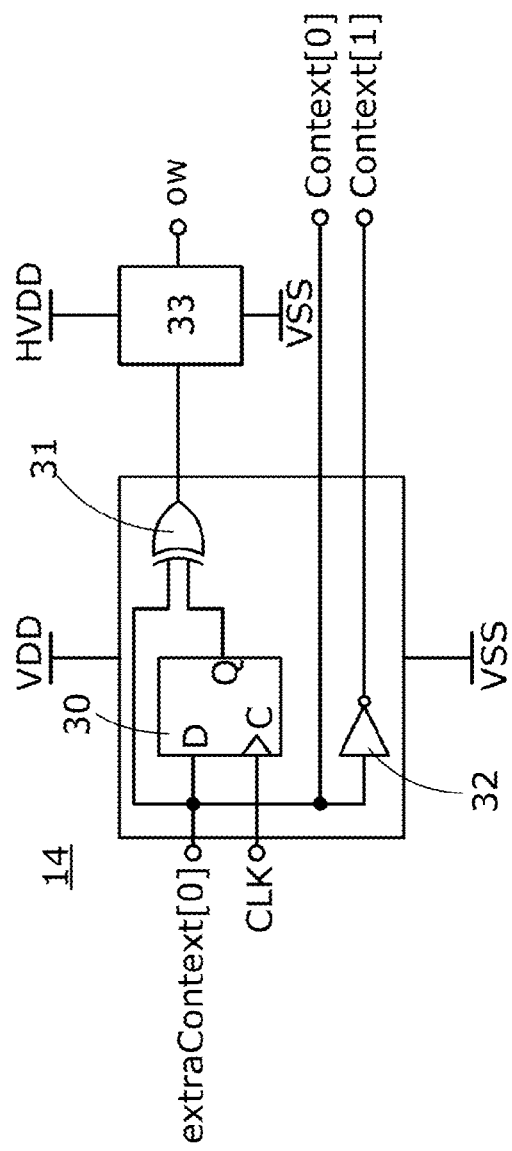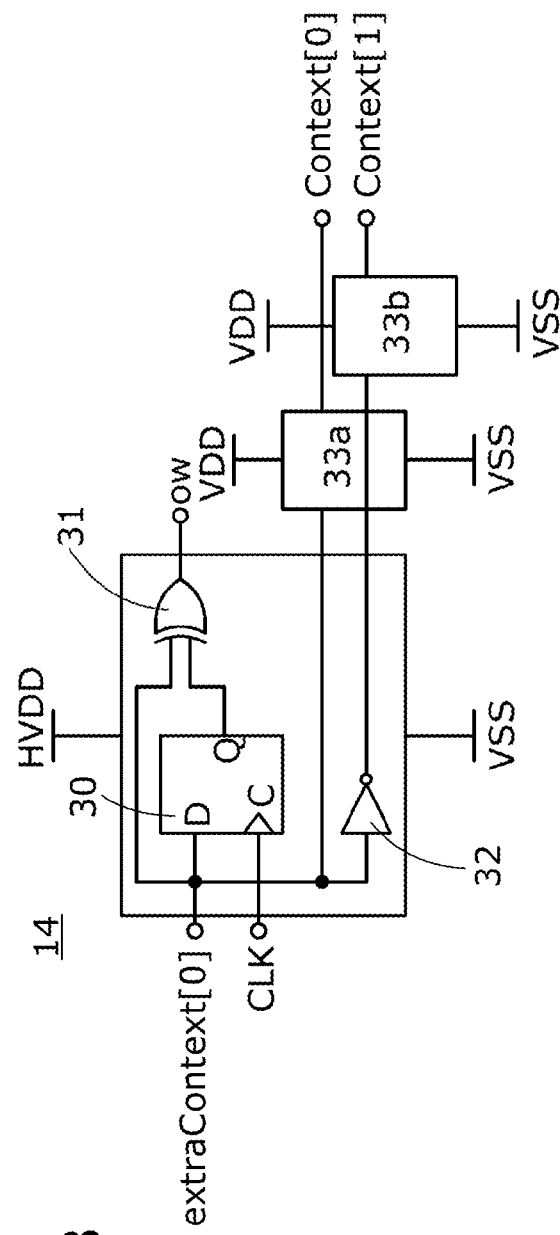
FIG. 9A
FIG. 9B

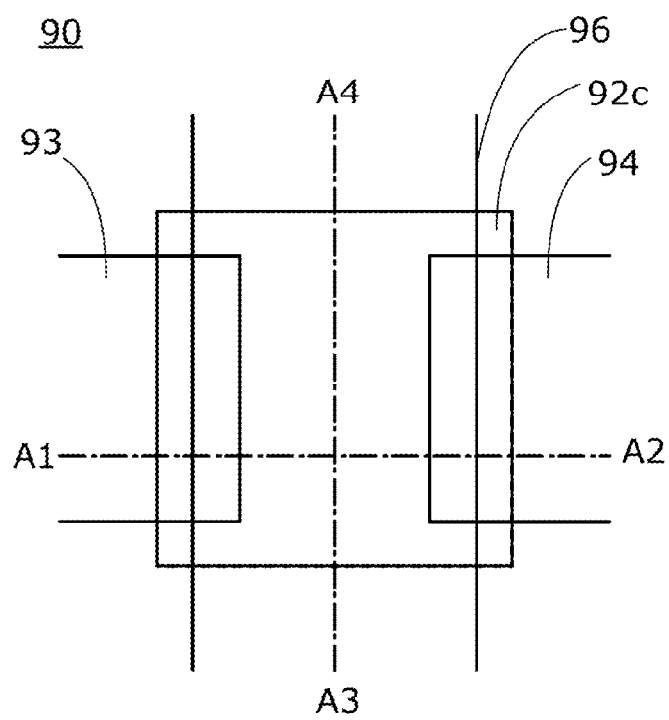
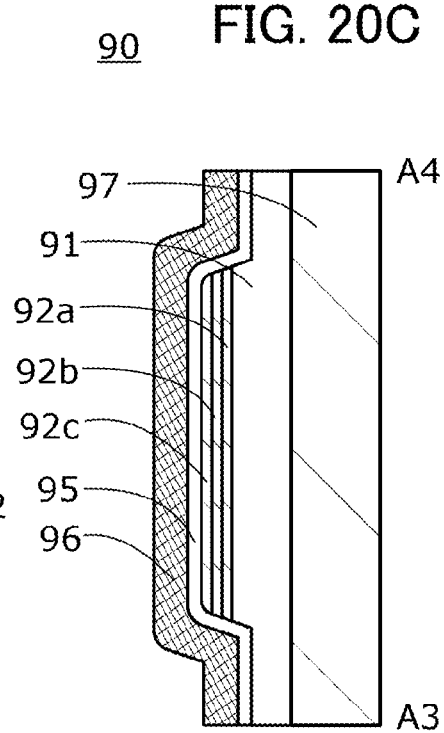
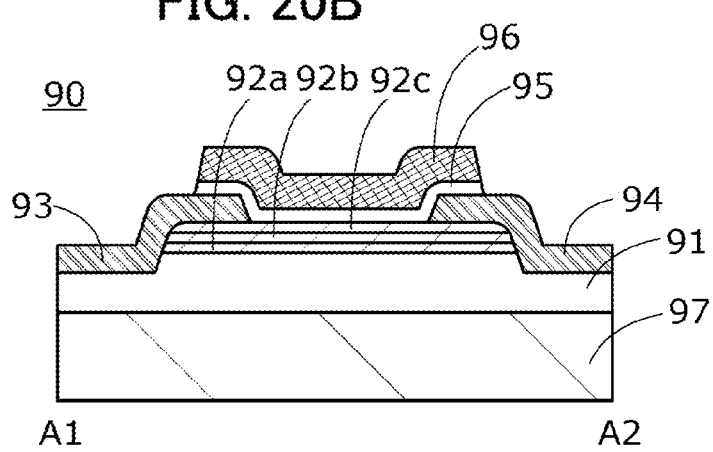

SEMICONDUCTOR DEVICE

TECHNICAL FIELD

The present invention relates to an object, a method, or a manufacturing method. In addition, the present invention relates to a process, a machine, manufacture, or a composition of matter. One embodiment of the present invention particularly relates to a semiconductor device, a display device, a light-emitting device, a power storage device, a memory device, a driving method thereof, or a manufacturing method thereof. For example, one embodiment of the present invention relates to a programmable logic device in which the configuration of hardware can be changed, and a semiconductor device including the programmable logic device.

BACKGROUND ART

A programmable logic device (PLD) including path transistors with a boosting function can operate at a high speed and has a high area efficiency because of having fewer elements than a conventional programmable logic device including an SRAM. Non-Patent Document 1 discloses a multi-context PLD including path transistors with a boosting function.

Non-Patent Document

[Non-Patent Document 1] Y Okamoto et al., "Novel Application of Crystalline Indium-Gallium-Zinc-Oxide Technology to LSI: Dynamically Reconfigurable Programmable Logic Device Based on Multi-Context Architecture," ECS Trans., Vol. 54, No. 1, pp. 141-149, June 2013.

DISCLOSURE OF INVENTION

To evaluate the performance of a semiconductor device such as a PLD, low power consumption is an important factor. However, when power supply voltage is decreased to reduce the power consumption of the semiconductor device, the on-state current of a transistor is decreased. In a multi-context PLD including path transistors with a boosting function, a lower power supply voltage leads to a lower current supply capability of boosting transistors which control the supply of potentials to gates of the path transistors. This causes an increase in time for switching the potentials of the gates of the path transistors to switch contexts.

In the case where an n-channel transistor is used as the boosting transistor, a high-level potential applied to the gate of the path transistor is decreased by the threshold voltage of the boosting transistor. Thus, when the power supply voltage of the PLD is decreased to reduce power consumption, the potential of the gate becomes too low to turn on the path transistor, resulting in malfunction of the PLD.

In view of the above technical background, it is an object of one embodiment of the present invention to provide a semiconductor device which can operate normally with lower power consumption.

Note that it is an object of one embodiment of the present invention to provide a novel semiconductor device or the like. Note that the descriptions of these objects do not disturb the existence of other objects. Note that in one embodiment of the present invention, there is no need to achieve all the objects. Other objects are apparent from and can be derived from the description of the specification, the drawings, the claims, and the like.

A semiconductor device of one embodiment of the present invention includes a first circuit which includes a first transistor and a second transistor capable of controlling the supply of a first signal to a gate of the first transistor, and a second circuit which is capable of generating a second signal which is to be supplied to a gate of the second transistor and which has a larger amplitude than the first signal.

A semiconductor device of one embodiment of the present invention includes a first circuit which includes a first transistor and a second transistor capable of controlling the supply of a first signal to a gate of the first transistor, and a second circuit which is capable of generating a second signal which is to be supplied to a gate of the second transistor and which has a larger amplitude than the first signal. The high-level potential of a pulse signal included in the second signal is higher than that of the first signal.

A semiconductor device of one embodiment of the present invention includes a first circuit which includes a first transistor and a second transistor capable of controlling the supply of a first signal to a gate of the first transistor, and a second circuit which is capable of generating a second signal which is to be supplied to a gate of the second transistor and which has a larger amplitude than the first signal. The low-level potential of a pulse signal included in the second signal is lower than that of the first signal.

A semiconductor device of one embodiment of the present invention includes a pair of first circuits which each include a first transistor and a second transistor capable of controlling the supply of a first signal to a gate of the first transistor, and a second circuit which is capable of generating a second signal which is to be supplied to a gate of the second transistor and which has a larger amplitude than the first signal. One of a source and a drain of one of the first transistors included in the pair of first circuits is electrically connected to one of a source and a drain of the other of the first transistors. The first signals supplied to the gates of the first transistors in the pair of first circuits have potentials with different logic levels.

In the semiconductor device of one embodiment of the present invention, the second transistor may include a channel formation region in an oxide semiconductor film.

In the semiconductor device of one embodiment of the present invention, the oxide semiconductor film may contain In, Ga, and Zn.

With one embodiment of the present invention, a semiconductor device that can operate normally with lower power consumption can be provided.

Note that one embodiment of the present invention can provide a novel semiconductor device or the like. Note that the description of these effects does not disturb the existence of other effects. One embodiment of the present invention does not necessarily achieve all the above effects. Other effects will be apparent from and can be derived from the description of the specification, the drawings, the claims, and the like.

BRIEF DESCRIPTION OF DRAWINGS

FIGS. 9A and 9B each illustrate a structure of a circuit 14.

FIGS. 20A to 20C illustrate a structure of a transistor.

BEST MODE FOR CARRYING OUT THE INVENTION

Embodiments of the present invention will be described in detail below with reference to drawings. Note that the present invention is not limited to the following description, and it will be easily understood by those skilled in the art that various changes and modifications can be made without departing from the spirit and scope of the present invention. Therefore, the present invention should not be construed as being limited to the description in the following embodiments.

Note that a programmable logic device according to one embodiment of the present invention includes, in its category, a variety of semiconductor integrated circuits formed using semiconductor elements, such as microprocessors, image processing circuits, controllers for semiconductor display devices, digital signal processors (DSP), microcontrollers, control circuits for batteries such as secondary batteries, and protection circuits. A semiconductor device of one embodiment of the present invention includes, in its category, a variety of devices such as RF tags formed using any of the above semiconductor integrated circuits and semiconductor display devices. The semiconductor display device includes, in its category, liquid crystal display devices, light-emitting devices in which a light-emitting element typified by an organic light-emitting element (OLED) is provided in each pixel, electronic paper, digital micromirror devices (DMD), plasma display panels (PDP), field emission displays (FED), and other semiconductor display devices in which semiconductor elements are included in driver circuits.

Note that a "source" of a transistor in this specification means a source region that is part of a semiconductor film functioning as an active layer or a source electrode connected to the semiconductor film. Similarly, a "drain" of a transistor means a drain region that is part of the semiconductor film or a drain electrode connected to the semiconductor film. A "gate" means a gate electrode.

The terms "source" and "drain" of a transistor interchange with each other depending on the conductivity type of the transistor or levels of potentials applied to the terminals. In general, in an n-channel transistor, a terminal to which a lower potential is applied is called a source, and a terminal to which a higher potential is applied is called a drain. In a p-channel transistor, a terminal to which a lower potential is applied is called a drain, and a terminal to which a higher potential is applied is called a source. In this specification, although connection relation of the transistor is described assuming that the source and the drain are fixed for convenience in some cases, actually, the names of the source and the drain interchange with each other depending on the relation of the potentials.

<Structural Example 1 of Semiconductor Device>

Figure 1:
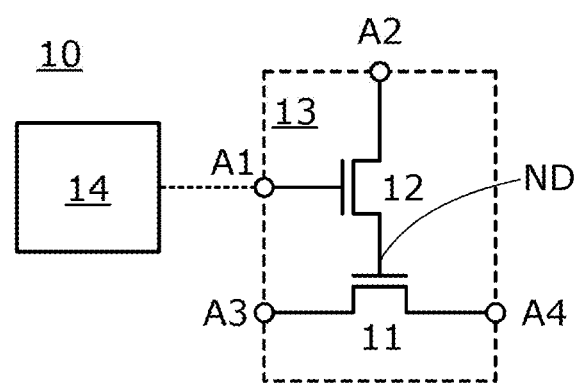
FIG. 1 illustrates a structure of a semiconductor device.

First, a structural example of a semiconductor device of one embodiment of the present invention will be described. FIG. 1 illustrates a structure of a semiconductor device 10 of one embodiment of the present invention.

The semiconductor device 10 of one embodiment of the present invention includes a circuit 13 which includes a transistor 11 and a transistor 12, and a circuit 14 which has a function of generating a signal to be supplied to a gate of the transistor 12. The transistor 12 has a function of controlling the supply of a signal input through a wiring A2 to a gate of the transistor 11.

Specifically, one of a source and a drain of the transistor 11 is electrically connected to a wiring A3, and the other thereof is electrically connected to a wiring A4. One of a source and a drain of the transistor 12 is electrically connected to the wiring A2, and the other thereof is electrically connected to the gate of the transistor 11. The gate of the transistor 12 is electrically connected to a wiring A1, and a signal generated by the circuit 14 is supplied to the gate of the transistor 12 through the wiring A1.

When the transistor 12 is turned on in accordance with the potential of the signal supplied to the wiring A1, the potential of the signal supplied to the wiring A2 is supplied to the gate of the transistor 11 (denoted by a node ND) through the transistor 12. The on/off state of the transistor 11 is controlled by the potential of the gate.

In one embodiment of the present invention, the signal generated by the circuit 14 and supplied to the wiring A1 has a larger amplitude than the signal supplied to the wiring A2. Specifically, in the case where the transistors 11 and 12 are n-channel transistors, the high-level potential of a pulse signal included in the signal supplied to the wiring A1 is higher than the high-level potential of the signal supplied to the wiring A2. In the case where the transistors 11 and 12 are p-channel transistors, the low-level potential of the pulse signal included in the signal supplied to the wiring A1 is lower than the low-level potential of the signal supplied to the wiring A2.

With the above-described structure of one embodiment of the present invention, in the case, for example, where the transistors 11 and 12 are n-channel transistors, a gate voltage corresponding to a voltage between the gate and the source of the transistor 12 can be set higher than a threshold voltage in a period where the pulse signal is supplied to the wiring A1. Thus, the high-level potential of the signal supplied to the wiring A2 can be prevented from decreasing by the threshold voltage of the transistor 11 when supplied to the gate of the transistor 11 through the transistor 12. Alternatively, with the above-described structure of one embodiment of the present invention, in the case, for example, where the transistors 11 and 12 are p-channel transistors, the gate voltage corresponding to the voltage between the gate and the source of the transistor 12 can be set lower than the threshold voltage in the period where the pulse signal is supplied to the wiring A1. Thus, the low-level potential of the signal supplied to the wiring A2 can be prevented from increasing by the threshold voltage of the transistor 11 when supplied to the gate of the transistor 11 through the transistor 12.

When the period where the pulse signal is supplied to the wiring A1 ends and a period where the pulse signal is not supplied to the wiring A1 starts, the transistor 12 is turned off. When the transistor 12 is off, the node ND corresponding to the gate of the transistor 11 is in a floating state. Thus, a potential supplied to the node ND is retained at the node ND.

Since the node ND becomes floating in the circuit 13 when the transistor 12 is off, a boosting effect described below can be expected. In other words, when the node ND is floating in the circuit 13, the potential of the node ND is increased by capacitance Cgs generated between the source and the gate of the transistor 11 as the potential of the wiring A3 is changed from a low level to a high level. The amount of increase in potential of the node ND depends on the level of the potential applied to the gate of the transistor 11.

Specifically, the amount of increase in potential of the node ND in the case where the transistors 11 and 12 are n-channel transistors is described as an example. When the potential applied to the gate of the transistor 11 is sufficiently low, i.e., close to the low-level potential of the signal supplied to the wiring A2, the transistor 11 is in a weak-inversion mode. Thus, the capacitance Cgs that contributes to the increase in potential of the node ND includes the capacitance Cos that is independent of the potential of the gate electrode, i.e., the potential of the node ND. Specifically, the capacitance Cos includes overlap capacitance generated in a region where the gate electrode and the source region overlap with each other, and parasitic capacitance generated between the gate electrode and the source electrode, for example.

When the potential applied to the gate of the transistor 11 is sufficiently high, i.e., close to the high-level potential of the signal supplied to the wiring A2, the transistor 11 is in a strong-inversion mode. Thus, the capacitance Cgs that contributes to the increase in potential of the node ND includes, in addition to the capacitance Cos, capacitance Cod generated between the gate electrode and the drain electrode and part of the capacitance Cox generated between a channel formation region and the gate electrode. This means that when the transistor 11 is in the strong-inversion mode, the capacitance Cgs of the transistor 11 that contributes to the increase in potential of the node ND is larger than when the transistor 11 is in the weak-inversion mode. Thus, in the case where the transistors 11 and 12 are n-channel transistors, the boosting effect of increasing the potential of the node ND in accordance with a change in potential of the wiring A3 is greater when the transistor 11 is in the strong-inversion mode than when the transistor 11 is in the weak-inversion mode. When the transistor 11 is in the strong-inversion mode, the switching speed of the transistor 11 can be increased in accordance with the change in potential of the wiring A3 because the boosting effect is greater. When the transistor 11 is in the weak-inversion mode, the transistor 11 is kept off because the boosting effect in accordance with the change in potential of the wiring A3 is smaller.

In one embodiment of the present invention, it is preferable that the off-state current of the transistor 12 be significantly low. A transistor in which a channel formation region is formed in a film of a semiconductor having a wider band gap and lower intrinsic carrier density than silicon can have significantly low off-state current. Thus, the transistor is suitable for the transistor 12. Examples of such a semiconductor are an oxide semiconductor and a compound semiconductor such as gallium nitride that each have a band gap more than twice as wide as that of silicon. A transistor including the above semiconductor can have significantly lower off-state current than a transistor formed using a normal semiconductor such as silicon or germanium.

Since the off-state current of the transistor 12 is extremely low, the node ND is floating (highly insulated from other electrodes and wirings) when the transistor 12 is off. Thus, the potential is retained at the node ND when the transistor 12 is off.

Note that off-state current in this specification refers to current flowing in a cut-off region between a source and a drain of a transistor, unless otherwise specified.

Alternatively, in the semiconductor device 10 of one embodiment of the present invention, the signal supplied to the wiring A1 and the signal supplied to the wiring A2 may each have a larger amplitude than the signal supplied to the wiring A3. Specifically, in the case where the transistors 11 and 12 are n-channel transistors, the high-level potential of the pulse signal included in the signal supplied to the wiring A1 and the high-level potential of the pulse signal included in the signal supplied to the wiring A2 may each be higher than the high-level potential of the signal supplied to the wiring A3. In the case where the transistors 11 and 12 are p-channel transistors, the low-level potential of the pulse signal included in the signal supplied to the wiring A1 and the low-level potential of the pulse signal included in the signal supplied to the wiring A2 may each be lower than the low-level potential of the signal supplied to the wiring A3.

With the above-described structure of one embodiment of the present invention, in the case, for example, where the transistors 11 and 12 are n-channel transistors, the potential of the node ND can be sufficiently increased owing to the boosting effect even if the high-level potential of the signal supplied to the wiring A2 is decreased by the threshold voltage of the transistor 11 when supplied to the gate of the transistor 11 through the transistor 12. Thus, the switching speed of the transistor 11 can be increased in accordance with the change in potential of the wiring A3. In the case, for example, where the transistors 11 and 12 are p-channel transistors, the potential of the node ND can be sufficiently decreased owing to the boosting effect even if the low-level potential of the signal supplied to the wiring A2 is increased by the threshold voltage of the transistor 11 when supplied to the gate of the transistor 11 through the transistor 12. Thus, the switching speed of the transistor 11 can be increased in accordance with the change in potential of the wiring A3.

<Operation Example of Semiconductor Device>

Figure 2:
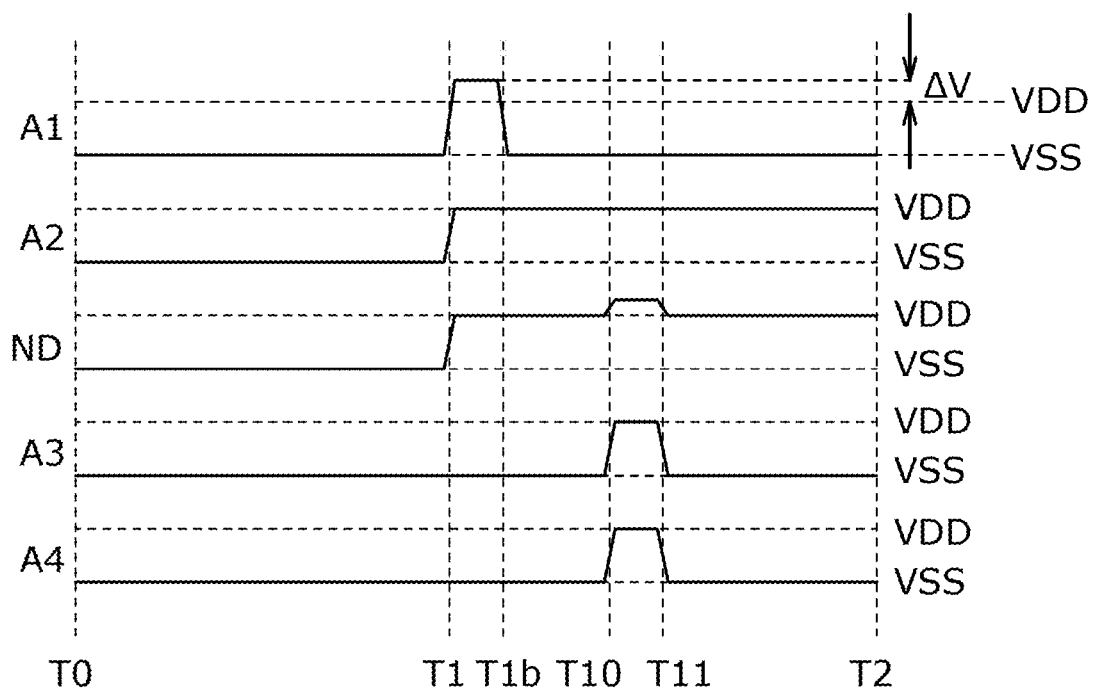
FIG. 2 is a timing chart illustrating an operation of a semiconductor device.

Next, a specific operation example of the semiconductor device 10 illustrated in FIG. 1 will be described using a timing chart of FIG. 2. FIG. 2 is an example of a timing chart where the transistors 11 and 12 are n-channel transistors.

First, in a period from time T0 to time T1, signals supplied to the wirings A1 to A3 all have a low-level potential VSS as illustrated in FIG. 2. The potential of the node ND is also the potential VSS. Thus, in the period from time T0 to time T1, the transistor 12 is off and the node ND is kept at the potential VSS. Since the node ND is at the potential VSS, the transistor 11 is also off.

Next, in a period from time T1 to time T1b, the signal supplied to the wiring A1 has a high-level potential, specifically, a potential VDD+ΔV. The signal supplied to the wiring A2 has a high-level potential, specifically, the potential VDD. Thus, the transistor 12 is turned on and the potential of the node ND is increased. In one embodiment of the present invention, a potential higher by ΔV than the potential of the signal supplied to the wiring A2 is supplied to the gate of the transistor 12. Therefore, the potential applied to the node ND can be prevented from decreasing by the threshold voltage of the transistor 12. Thus, at time T1b, the potential of the node ND can be extremely close to the potential VDD of the wiring A2.

In one embodiment of the present invention, since the potential higher by ΔV than the potential of the signal supplied to the wiring A2 is applied to the gate of the transistor 12, the current supply capability of the transistor 12 can be improved as compared with the case where the potential of the signal supplied to the wiring A2 is equal to the potential applied to the gate of the transistor 12. Thus, the potential of the node ND can be extremely close to the potential VDD even when the period from time T1 to time T1b is short.

In the period from time T1 to time T1b, the potential of the signal supplied to the wiring A3 is VSS.

Next, in a period from time T1b to time T10, the signal supplied to the wiring A1 has the potential VSS. Thus, the transistor 12 is turned off and the potential of the node ND is maintained. Although the potential of the signal supplied to the wiring A2 is held at the potential VDD in the period from time T1b to time T10 in FIG. 2, it is acceptable as long as the potential of the signal supplied to the wiring A2 is higher than a potential obtained by subtracting the threshold voltage of the transistor 12 from the potential VSS after the transistor 12 is turned off.

Next, in a period from time T10 to time T11, the signal supplied to the wiring A1 has the potential VSS. Thus, the transistor 12 is off. The potential of the signal supplied to the wiring A2 is higher than the potential obtained by subtracting the threshold voltage of the transistor 12 from the potential VDD or the potential VSS, as in the period from time T1b to time T10. In addition, in the period from time T10 to time T11, the signal supplied to the wiring A3 has the high-level potential, specifically, the potential VDD. Thus, the transistor 11 is on, and the potential of the wiring A4 is increased accordingly.

Note that since the node ND is at the potential VDD in the period from time T1b to time T10, the transistor 11 is in the strong-inversion mode. Therefore, when the potential of the signal supplied to the wiring A3 is increased from the potential VSS to the potential VDD at time T10, the potential of the node ND is further increased from the potential VDD owing to the boosting effect. Thus, in one embodiment of the present invention, a potential higher than the potential of the signal supplied to the wiring A3 is applied to the gate of the transistor 11 in the period from time T10 to time T11; therefore, the potential applied to the wiring A4 can be prevented from decreasing by the threshold voltage of the transistor 11. For this reason, at time T11, the potential of the wiring A4 is extremely close to the potential VDD of the wiring A3.

In one embodiment of the present invention, since the potential higher than the potential of the signal supplied to the wiring A3 is applied to the gate of the transistor 11, the current supply capability of the transistor 11 can be improved as compared with the case where the potential of the signal supplied to the wiring A3 is equal to the potential applied to the gate of the transistor 11. Thus, the potential of the wiring A4 can be extremely close to the potential VDD of the wiring A3 even when the period from time T10 to time T11 is short.

Next, in a period from time T11 to time T2, the signal supplied to the wiring A1 has the potential VSS. Thus, the transistor 12 is off. The potential of the signal supplied to the wiring A2 is higher than the potential obtained by subtracting the threshold voltage of the transistor 12 from the potential VDD or the potential VSS, as in the period from time T10 to time T11. In addition, in the period from time T11 to time T2, the signal supplied to the wiring A3 has the potential VSS. Thus, the potential of the node ND decreases and returns to the potential VDD. Since the transistor 11 is on and the potential of the wiring A3 is the potential VSS, the potential of the wiring A4 also decreases to the potential VSS.

Comparative Example 1

Figure 3A:
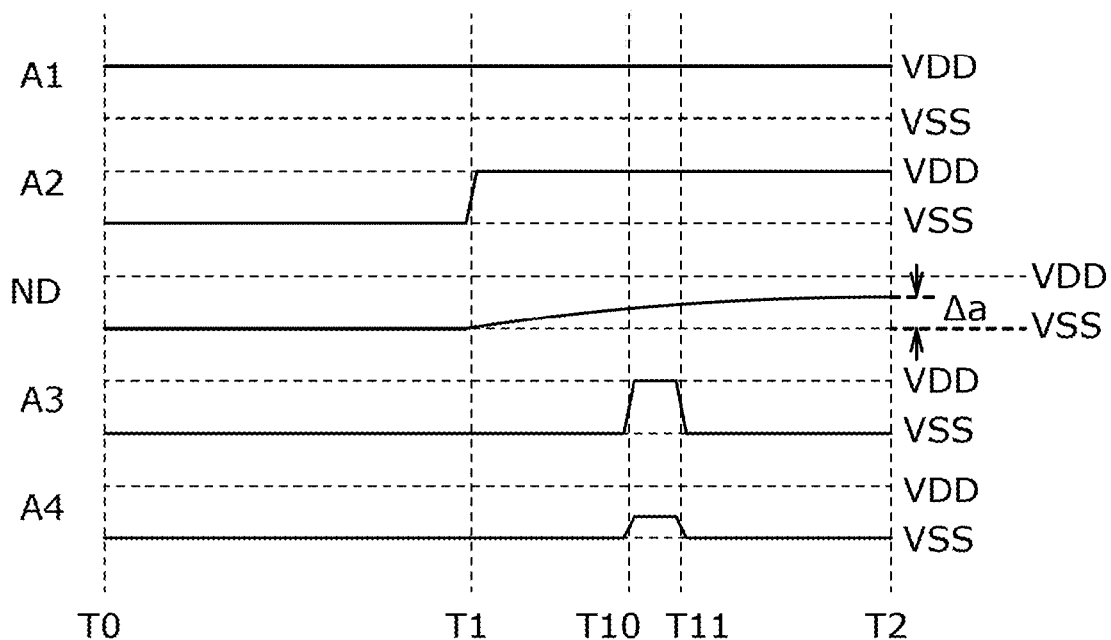
FIGS. 3A and 3B are timing charts illustrating an operation of a semiconductor device.

Another example of operation of the semiconductor device 10 illustrated in FIG. 1 will be described as a comparative example with reference to a timing chart in FIG. 3A. FIG. 3A is an example of a timing chart where the transistors 11 and 12 are n-channel transistors. Specifically, FIG. 3A is an example of a timing chart where the signal supplied to the wiring A1 is constantly at the potential VDD.

First, in the period from time T0 to time T1 in FIG. 3A, the signals supplied to the wirings A2 and A3 have the potential VSS, and the signal supplied to the wiring A1 has the potential VDD. Thus, in the period from time T0 to time T1, the transistor 12 is on and the node ND has the potential VSS. Since the node ND is at the potential VSS, the transistor 11 is off.

Next, in the period from time T1 to time T10, the potential of the signal supplied to the wiring A1 is held at the potential VDD. The signal supplied to the wiring A2 has a high-level potential, specifically, the potential VDD. Thus, the transistor 12 is on and the potential of the node ND is increased. Note that since the wiring A1 and the wiring A2 are at the same potential VDD in the period from time T1 to time T10 in FIG. 3A, the current supply capability of the transistor 12 is lower than when the potential higher by ΔV than the potential of the signal supplied to the wiring A2 is applied to the gate of the transistor 12 as in the period from time T1 to time T1b in FIG. 2. Therefore, it takes a longer time to increase the potential of the node ND.

In the case of the timing chart in FIG. 3A, since the wirings A1 and A2 are at the same potential VDD, the potential of the node ND is only increased eventually to a potential that is decreased by the threshold voltage of the transistor 12 even when the period from time T1 to time T10 is sufficiently long. FIG. 3A shows an example where the node ND at time T10 is at a potential VDD−Δa which is even lower than the potential that is decreased from the potential VDD by the threshold voltage of the transistor 12.

Next, in the period from time T10 to time T11, the signals supplied to the wirings A1 and A2 have the potential VDD.

Thus, the transistor 12 is on. In addition, in the period from time T10 to time T11, the signal supplied to the wiring A3 has a high-level potential, specifically, the potential VDD. Thus, since the transistor 11 is on, the potential of the wiring A4 is increased.

Note that in the case of the timing chart in FIG. 3A, since the transistor 12 is on in the period from time T10 to time T11, even when the potential of the signal supplied to the wiring A3 is increased from the potential VSS to the potential VDD at time T10, the potential of the node ND is in the process of increasing and its increase owing to the boosting effect cannot be expected. Since the potential of the node ND is in the process of the increase, Δ, the current supply capability of the transistor 11 is lower than that of the transistor 11 in the period from time T10 to time T11 in FIG. 2. Thus, the potential of the wiring A4 is only increased to a potential lower than the potential VDD.

Next, in the period from time T11 to time T2, the signals supplied to the wirings A1 and A2 have the potential VDD. Thus, the transistor 12 is on. In addition, in the period from time T11 to time T2, the signal supplied to the wiring A3 has the potential VSS. Thus, since the transistor 11 is on and the potential of the wiring A3 is the potential VSS, the potential of the wiring A4 also decreases to the potential VSS.

Comparative Example 2

Figure 3B:
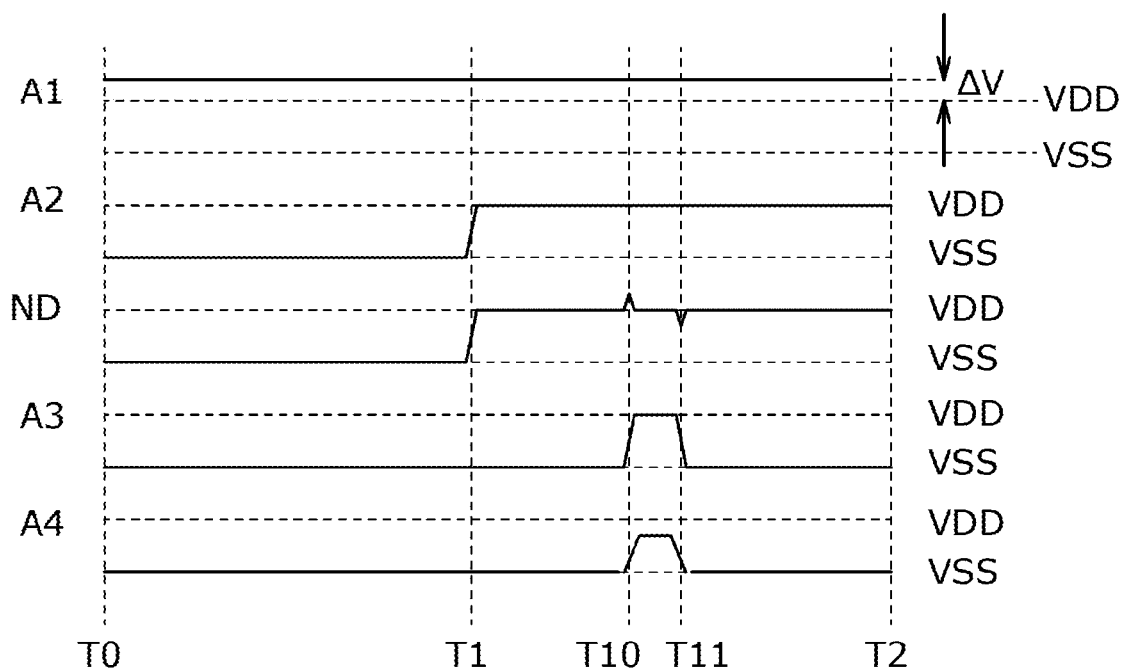

Next, another example of operation of the semiconductor device 10 illustrated in FIG. 1 will be described as a comparative example with reference to a timing chart in FIG. 3B. FIG. 3B is an example of a timing chart where the transistors 11 and 12 are n-channel transistors. Specifically, FIG. 3B is an example of a timing chart where the signal supplied to the wiring A1 is constantly at the potential VDD+ΔV.

First, in the period from time T0 to time T1 in FIG. 3B, the signals supplied to the wirings A2 and A3 have the potential VSS, and the signal supplied to the wiring A1 has the potential VDD+ΔV. Thus, in the period from time T0 to time T1, the transistor 12 is on and the node ND has the potential VSS. Since the node ND is at the potential VSS, the transistor 11 is off.

Next, in the period from time T1 to time T10, the potential of the signal supplied to the wiring A1 is held at the potential VDD+ΔV. In addition, the signal supplied to the wiring A2 has a high-level potential, specifically, the potential VDD. Thus, the transistor 12 is on and the potential of the node ND is increased.

In the period from time T1 to time T10 in the case of FIG. 3B, as in the period from time T1 to time T1b in FIG. 2, a potential higher by ΔV than the potential of the signal supplied to the wiring A2 is supplied to the gate of the transistor 12. Therefore, the potential applied to the node ND can be prevented from decreasing by the threshold voltage of the transistor 12. Thus, at time T10, the potential of the node ND can be extremely close to the potential VDD of the wiring A2.

In one embodiment of the present invention, since the potential higher by ΔV than the potential of the signal supplied to the wiring A2 is applied to the gate of the transistor 12, the current supply capability of the transistor 12 can be improved as compared with the case where the potential of the signal supplied to the wiring A2 is equal to the potential applied to the gate of the transistor 12. Thus, the potential of the node ND can be extremely close to the potential VDD even when the period from time T1 to time T1b is short.

Next, in the period from time T10 to time T11, the signal supplied to the wiring A1 has the potential VDD+ΔV. The signal supplied to the wiring A2 has the potential VDD. Thus, the transistor 12 is on. In addition, in the period from time T10 to time T11, the signal supplied to the wiring A3 has a high-level potential, specifically, the potential VDD. Thus, since the transistor 11 is on, the potential of the wiring A4 is increased.

Note that in the case of the timing chart in FIG. 3B, since the transistor 12 is on in the period from time T10 to time T11, even when the potential of the signal supplied to the wiring A3 is increased from the potential VSS to the potential VDD at time T10, an increase in the potential of the node ND owing to the boosting effect cannot be expected. Thus, since the node ND is at the potential VDD and the wiring A3 is also at the potential VDD, the potential of the wiring A4 is only increased to a potential that is decreased by the threshold voltage of the transistor 11.

Next, in the period from time T11 to time T2, the signal supplied to the wiring A1 has the potential VDD+ΔV. The signal supplied to the wiring A2 has the potential VDD. Thus, the transistor 12 is on. In addition, in the period from time T11 to time T2, the signal supplied to the wiring A3 has the potential VSS. Thus, since the transistor 11 is on and the potential of the wiring A3 is the potential VSS, the potential of the wiring A4 also decreases to the potential VSS.

Comparative Example 3

Figure 4:
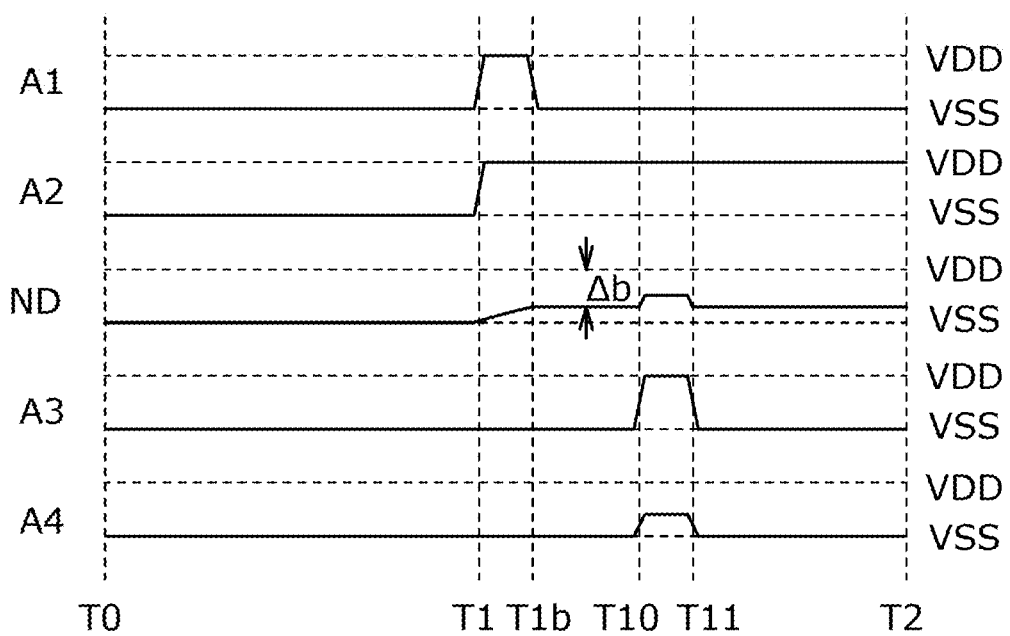
FIG. 4 is a timing chart illustrating an operation of a semiconductor device.

Next, another example of operation of the semiconductor device 10 illustrated in FIG. 1 will be described as a comparative example with reference to a timing chart in FIG. 4. FIG. 4 is an example of a timing chart where the transistors 11 and 12 are n-channel transistors. Specifically, FIG. 4 is an example of a timing chart where the signal supplied to the wiring A1 is at the potential VDD in the period from time T1 to time T1b and is at the potential VSS in the other periods.

First, in the period from time T0 to time T1 in FIG. 4, the signals supplied to the wirings A2 and A3 have the potential VSS. The potential of the node ND is also the potential VSS. Thus, in the period from time T0 to time T1, the transistor 12 is off and the node ND is kept at the potential VSS. Since the node ND is at the potential VSS, the transistor 11 is also off.

Next, in the period from time T1 to time T1b, the signals supplied to the wirings A1 and A2 have a high-level potential, specifically, the potential VDD. Thus, the transistor 12 is turned on and the potential of the node ND is increased. Note that since the wiring A1 and the wiring A2 are at the same potential VDD in the period from time T1 to time T1b in FIG. 4, the current supply capability of the transistor 12 is lower than when a potential higher by ΔV than the potential of the signal supplied to the wiring A2 is applied to the gate of the transistor 12 as in the period from time T1 to time T1b in FIG. 2. Therefore, it takes a longer time to increase the potential of the node ND.

In the case of the timing chart in FIG. 4, since the wirings A1 and A2 are at the same potential VDD, the potential of the node ND is only increased eventually to a potential that is decreased by the threshold voltage of the transistor 12 even when the period from time T1 to time T1b is sufficiently long. FIG. 4 shows an example where the node ND in a period from time T1b to time T10 is at a potential VDD−Δb which is even lower than the potential that is decreased from the potential VDD by the threshold voltage of the transistor 12.

Next, in the period from time T10 to time T11, the signal supplied to the wiring A1 has the potential VSS. The signal supplied to the wiring A2 has the potential VDD. Thus, the transistor 12 is off. In addition, in the period from time T10 to time T11, the signal supplied to the wiring A3 has a high-level potential, specifically, the potential VDD. Thus, since the transistor 11 is on, the potential of the wiring A4 is increased.

Note that in the case of the timing chart in FIG. 4, the potential of the node ND at time T10 is as low as VDD−Δb. Therefore, even when the potential of the signal supplied to the wiring A3 at time T10 is increased from the potential VSS to the potential VDD, the amount of increase in potential of the node ND owing to the boosting effect is smaller than that in the period from time T10 to time T11 in FIG. 2. Thus, the potential of the wiring A4 is only increased to a potential lower than the potential VDD.

Next, in the period from time T11 to time T2, the signal supplied to the wiring A1 has the potential VSS. The signal supplied to the wiring A2 has the potential VDD. Thus, the transistor 12 is off. In addition, in the period from time T11 to time T2, the signal supplied to the wiring A3 has the potential VSS. Thus, since the transistor 11 is on and the potential of the wiring A3 is the potential VSS, the potential of the wiring A4 also decreases to the potential VSS.

<Structural Example 2 of Semiconductor Device>

Figure 5:
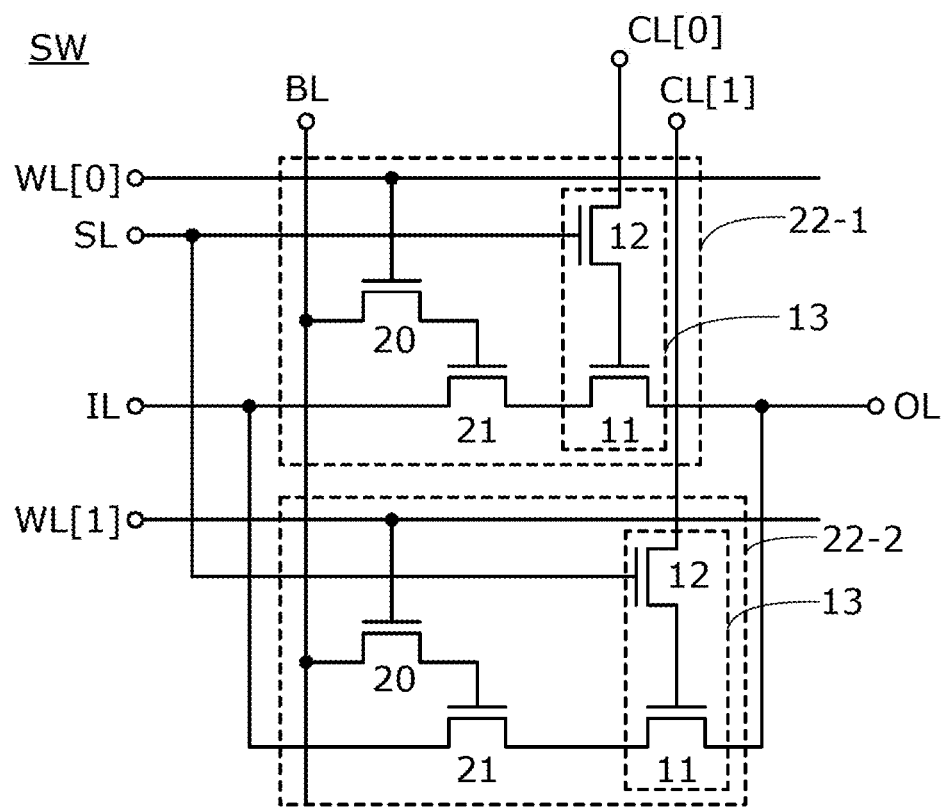
FIG. 5 illustrates a structure of a switch circuit.

FIG. 5 illustrates a structural example of a switch circuit SW including the circuit 13 as a component. The switch circuit SW of one embodiment of the present invention has a plurality of circuits 13, and a plurality of circuits 22 each including a transistor 20 and a transistor 21. Specifically, FIG. 5 illustrates an example in which the switch circuit SW has two circuits 22 (a circuit 22-1 and a circuit 22-2).

A gate of the transistor 20 is electrically connected to one of a plurality of wirings WL (a wiring WL[0] and a wiring WL[1]). One of a source and a drain of the transistor 20 is electrically connected to a wiring BL, and the other of the source and the drain of the transistor 20 is electrically connected to a gate of the transistor 21. One of a source and a drain of the transistor 21 is electrically connected to a wiring IL, and the other of the source and the drain of the transistor 21 is electrically connected to one of the source and the drain of the transistor 11 of the circuit 13. The other of the source and the drain of the transistor 11 is electrically connected to a wiring OL. A gate of the transistor 12 of the circuit 13 is electrically connected to a wiring SL. One of the source and the drain of the transistor 12 is electrically connected to one of a plurality of wirings CL (a wiring CL[0] and a wiring CL[1]). The other of the source and the drain of the transistor 12 is electrically connected to a gate of the transistor 11.

In the switch circuit SW illustrated in FIG. 5, in the circuit 13 of the circuit 22-1, the wiring CL[0] corresponds to the wiring A2 illustrated in FIG. 1. The wiring SL corresponds to the wiring A1 in FIG. 1. The other of the source and the drain of the transistor 21 corresponds to the wiring A3. The wiring OL corresponds to the wiring A4 in FIG. 1.

In the switch circuit SW illustrated in FIG. 5, in the circuit 13 of the circuit 22-2, the wiring CL[1] corresponds to the wiring A2 illustrated in FIG. 1. The wiring SL corresponds to the wiring A1 in FIG. 1. The other of the source and the drain of the transistor 21 corresponds to the wiring A3. The wiring OL corresponds to the wiring A4 in FIG. 1.

Figure 6:
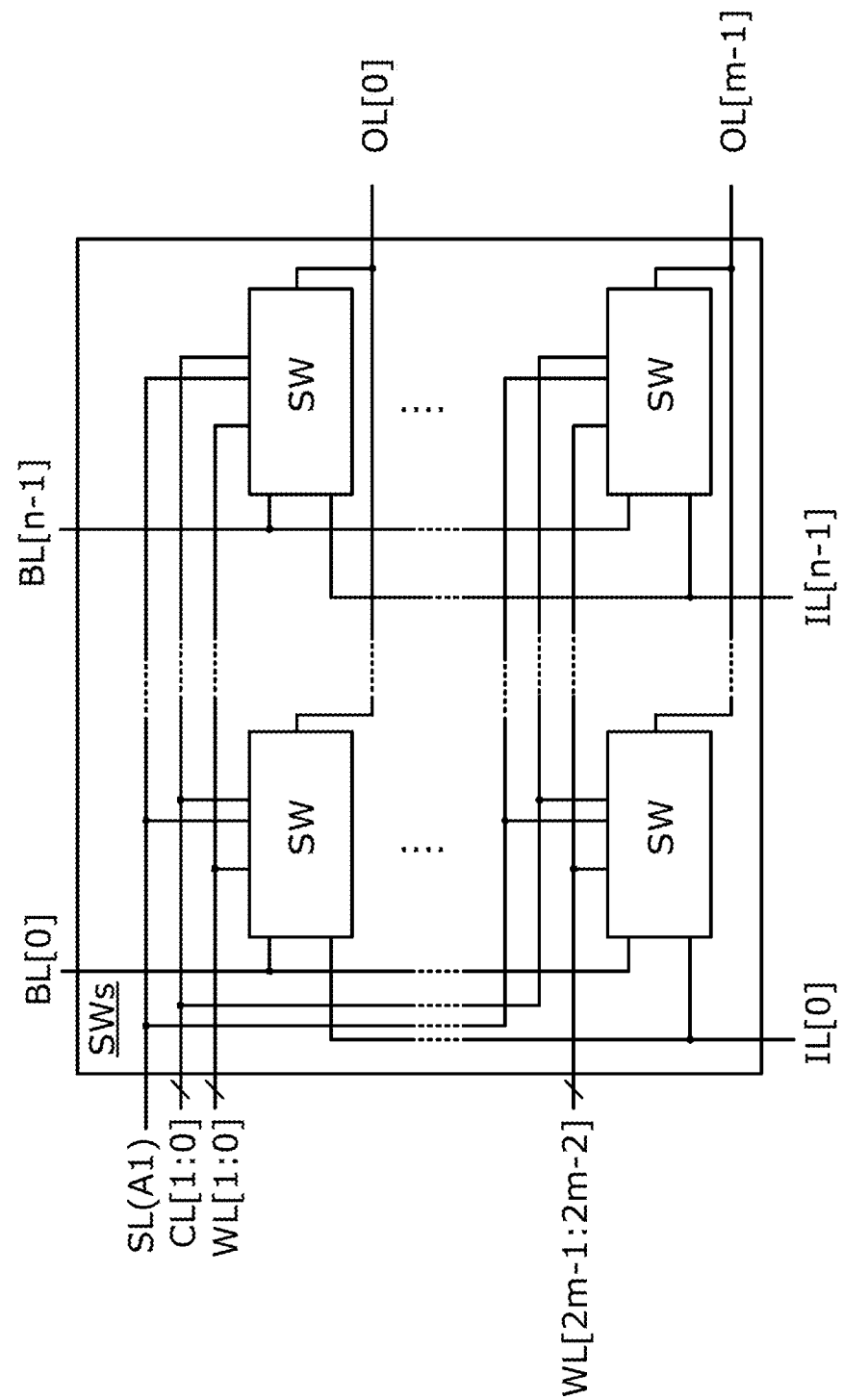
FIG. 6 illustrates a structure of a switch circuit.

FIG. 6 illustrates a structural example of a switch circuit SWs including a plurality of switch circuits SW illustrated in FIG. 5. In FIG. 6, the plurality of switch circuits SW are arranged in m rows and n columns. The switch circuit SW in an i-th column and a j-th row (i represents a natural number smaller than or equal to n, and j represents a natural number smaller than or equal to m) is electrically connected to a wiring BL[i−1], the wiring SL, a wiring CL[1:0], a wiring WL[2j−1:2j−2], a wiring IL[i−1], and a wiring OL[j−1].

Note that the wiring CL[1:0] refers to the wiring CL[0] and the wiring CL[1]. The wiring WL[2m−1:2m−2] refers to the wiring WL[2m−2] and the wiring WL[2m−1].

Figure 7:
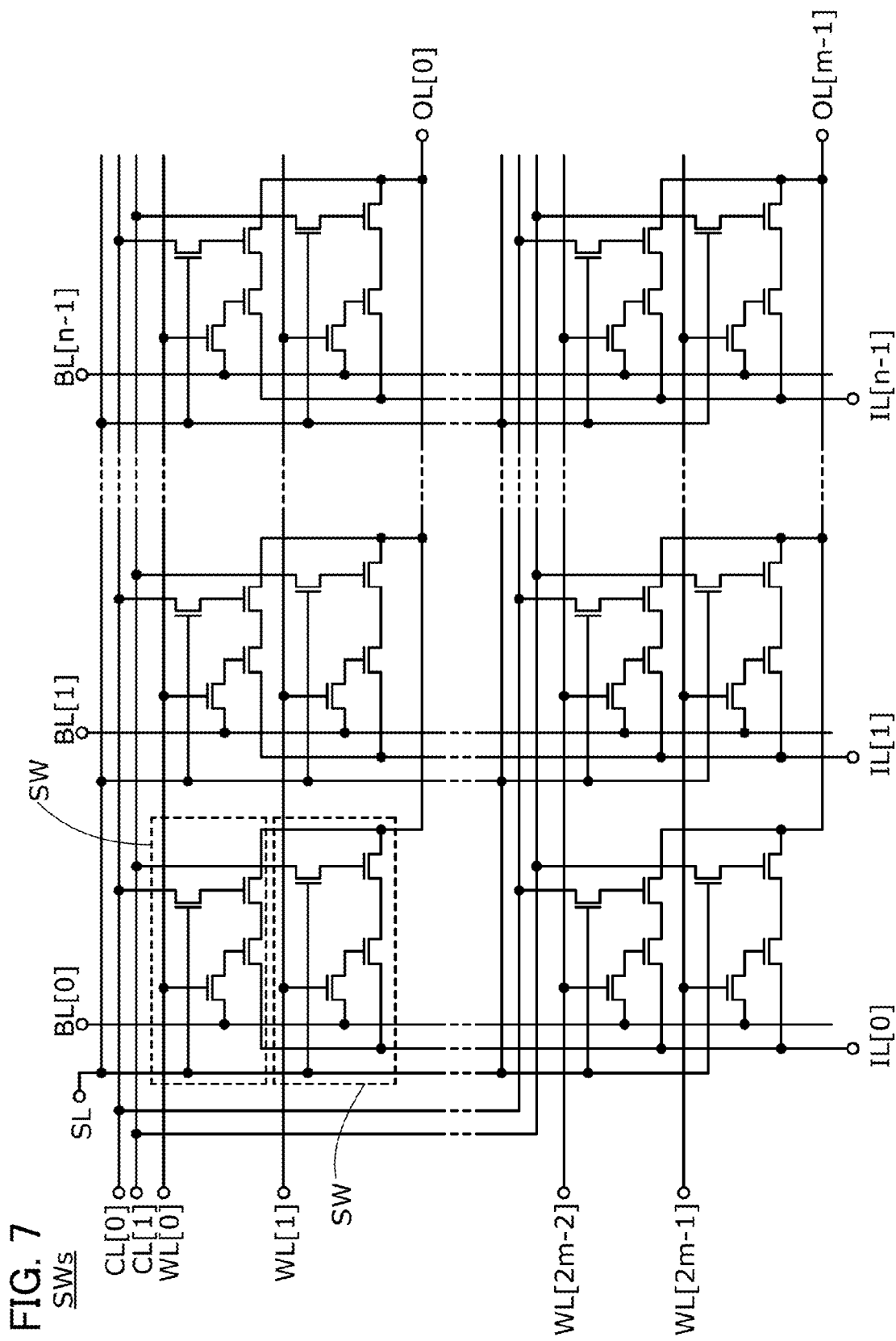
FIG. 7 illustrates a structure of a switch circuit.
Figure 8:
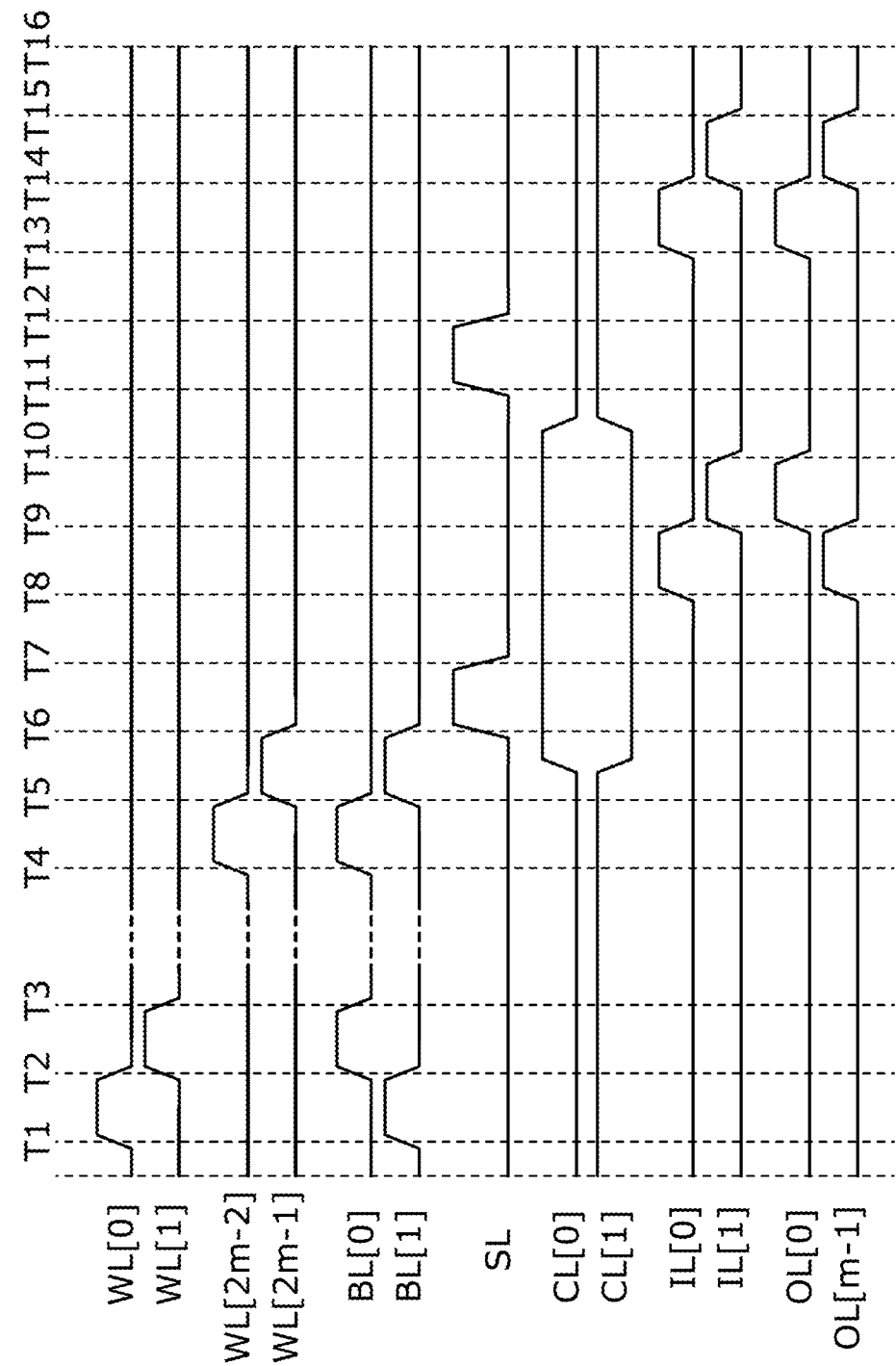
FIG. 8 is a timing chart illustrating an operation of a switch circuit.

Next, an operation example of the switch circuit SWs will be described using a specific structural example of the switch circuit SWs illustrated in FIG. 6. FIG. 7 illustrates the specific structural example of the switch circuit SWs illustrated in FIG. 6. FIG. 8 is an example of a timing chart for the switch circuit SWs illustrated in FIG. 7 where all transistors in the switch circuit SWs are n-channel transistors.

First of all, data writing to the switch circuit SWs in a period from time T1 to time T6 is described. In the period from time T1 to time T6, a low-level potential is applied to the wiring SL and all the wirings IL.

First, in a period from time T1 to time T2, a high-level potential is applied to the wiring WL[0], and a low-level potential is applied to all the wirings WL except the wiring WL[0]. A potential of a signal containing data is applied to the wirings BL[0] to BL[n−1]. FIG. 8 illustrates an example in which a high-level potential is applied to the wiring BL[1] and a low-level potential is applied to all the wirings BL except the wiring BL[1].

Accordingly, data is written to the switch circuit SW electrically connected to the wiring WL[0]. Specifically, in the switch circuit SW electrically connected to the wiring WL[0] and the wiring BL[1], data corresponding to a logical value "1" is stored when a high-level potential is applied to the gate of the transistor 21. In the plurality of switch circuits SW electrically connected to the wiring WL[0] and the wirings BL except the wiring BL[1], data corresponding to a logical value "0" is stored when a low-level potential is applied to the gates of the transistors 21.

Next, in a period from time T2 to time T3, the high-level potential is applied to the wiring WL[1], and the low-level potential is applied to all the wirings WL except the wiring WL[1]. A potential of a signal containing data is applied to the wirings BL[0] to BL[n−1]. FIG. 8 illustrates an example in which the high-level potential is applied to the wiring BL[0] and the low-level potential is applied to all the wirings BL except the wiring BL[0].

Accordingly, data is written to the switch circuit SW electrically connected to the wiring WL[1]. Specifically, in the switch circuit SW electrically connected to the wiring WL[1] and the wiring BL[0], data corresponding to the logical value "1" is stored when the high-level potential is applied to the gate of the transistor 21. In the plurality of switch circuits SW electrically connected to the wiring WL[1] and the wirings BL except the wiring BL[0], data corresponding to the logical value "0" is stored when the low-level potential is applied to the gates of the transistors 21.

Similarly, in a period from time T3 to time T4, data is sequentially written to the switch circuits SW electrically connected to the wirings WL[3] to WL[2m−3].

Next, in a period from time T4 to time T5, the high-level potential is applied to the wiring WL[2m−2], and the low-level potential is applied to all the wirings WL except the wiring WL[2m−2]. A potential of a signal containing data is applied to the wirings BL[0] to BL[n−1]. FIG. 8 illustrates an example in which the high-level potential is applied to the wiring BL[0] and the low-level potential is applied to all the wirings BL except the wiring BL[0].

Accordingly, data is written to the switch circuit SW electrically connected to the wiring WL[2m-2]. Specifically, in the switch circuit SW electrically connected to the wiring WL[2m-2] and the wiring BL[0], data corresponding to the logical value "1" is stored when the high-level potential is applied to the gate of the transistor 21. In the plurality of switch circuits SW electrically connected to the wiring WL[2m-2] and the wirings BL except for the wiring BL[0], data corresponding to the logical value "0" is stored when the low-level potential is applied to the gates of the transistors 21.

Next, in a period from time T5 to time T6, the high-level potential is applied to the wiring WL[2m-1], and the low-level potential is applied to all the wirings WL except the wiring WL[2m-1]. A potential of a signal containing data is applied to the wirings BL[0] to BL[n-1]. FIG. 8 illustrates an example in which the high-level potential is applied to the wiring BL[1] and the low-level potential is applied to all the wirings BL except the wiring BL[1].

Accordingly, data is written to the switch circuit SW electrically connected to the wiring WL[2m-1]. Specifically, in the switch circuit SW electrically connected to the wiring WL[2m-1] and the wiring BL[1], data corresponding to the logical value "1" is stored when the high-level potential is applied to the gate of the transistor 21. In the plurality of switch circuits SW electrically connected to the wiring WL[2m-1] and the wirings BL except for the wiring BL[1], data corresponding to the logical value "0" is stored when the low-level potential is applied to the gates of the transistors 21.

Next, a switching operation between electrical connection and disconnection of the wiring IL and the wiring OL to and from each other is described. The switching operation is performed in a period from time T6 to time T16 in accordance with data stored in the switch circuit SW. In the period from time T6 to time T16, the low-level potential is applied to all the wirings WL.

First, in the period from time T6 to time T7, a high-level potential is applied to the wiring CL[0], and a low-level potential is applied to the wiring CL[1]. A high-level potential higher than the potential applied to the wiring CL[0] is applied to the wiring SL. Accordingly, in the switch circuit SW electrically connected to the wiring CL[0], the transistor 11 is turned on. Thus, electrical connection and disconnection of the wiring IL and the wiring OL to and from each other can be switched in accordance with data stored in the switch circuit SW electrically connected to the wiring CL[0].

Specifically, in the switch circuit SW electrically connected to the wiring BL[1] among the plurality of switch circuits SW electrically connected to the wiring WL[0], data corresponding to the logical value "1" is stored. Thus, the wiring IL[1] and the wiring OL[0] are electrically connected to each other. In the switch circuit SW electrically connected to the wiring BL[0] among the plurality of switch circuits SW electrically connected to the wiring WL[2m-2], data corresponding to the logical value "1" is stored. Thus, the wiring IL[0] and the wiring OL[m-1] are electrically connected to each other.

Next, in the period from time T7 to time T8, the low-level potential is applied to the wiring SL. Accordingly, in the switch circuit SW electrically connected to the wiring CL[0], the transistor 12 is switched from an on state to an off state.

Next, in the period from time T8 to time T9, the low-level potential is applied to the wiring SL. The potential of the wiring IL[0] is switched from the low level to a high level. Accordingly, the potential of the wiring OL[m-1] is switched from a low level to a high level.

Next, in the period from time T9 to time T10, the low-level potential is applied to the wiring SL. The potential of the wiring IL[0] is switched from the high level to the low level. Accordingly, the potential of the wiring OL[m-1] is switched from the high level to the low level. The potential of the wiring IL[1] is switched from the low level to the high level. Accordingly, the potential of the wiring OL[0] is switched from the low level to the high level.

Next, in the period from time T10 to time T11, the low-level potential is applied to the wiring SL. The potential of the wiring IL[1] is switched from the high level to the low level. Accordingly, the potential of the wiring OL[0] is switched from the high level to the low level.

Next, in the period from time T11 to time T12, the low-level potential is applied to the wiring CL[0], and the high-level potential is applied to the wiring CL[1]. The high-level potential higher than the potential applied to the wiring CL[1] is applied to the wiring SL. Accordingly, in the switch circuit SW electrically connected to the wiring CL[1], the transistor 11 is turned on. Thus, electrical connection and disconnection of the wiring IL and the wiring OL to and from each other can be switched in accordance with data stored in the switch circuit SW electrically connected to the wiring CL[1].

Specifically, in the switch circuit SW electrically connected to the wiring BL[0] among the plurality of switch circuits SW electrically connected to the wiring WL[1], data corresponding to the logical value "1" is stored. Thus, the wiring IL[0] and the wiring OL[0] are electrically connected to each other. In the switch circuit SW electrically connected to the wiring BL[1] among the plurality of switch circuits SW electrically connected to the wiring WL[2m-1], data corresponding to the logical value "1" is stored. Thus, the wiring IL[1] and the wiring OL[m-1] are electrically connected to each other.

Next, in the period from time T12 to time T13, the low-level potential is applied to the wiring SL. Accordingly, in the switch circuit SW electrically connected to the wiring CL[1], the transistor 12 is switched from the on state to the off state.

Next, in the period from time T13 to time T14, the low-level potential is applied to the wiring SL. The potential of the wiring IL[0] is switched from the low level to the high level. Accordingly, the potential of the wiring OL[0] is switched from the low level to the high level.

Next, in the period from time T14 to time T15, the low-level potential is applied to the wiring SL. The potential of the wiring IL[0] is switched from the high level to the low level. Accordingly, the potential of the wiring OL[0] is switched from the high level to the low level. The potential of the wiring IL[1] is switched from the low level to the high level. Accordingly, the potential of the wiring OL[m-1] is switched from the low level to the high level.

Next, in the period from time T15 to time T16, the low-level potential is applied to the wiring SL. The potential of the wiring IL[1] is switched from the high level to the low level. Accordingly, the potential of the wiring OL[m-1] is switched from the high level to the low level.

Note that at least in the period from time T6 to time T7 in which the high-level potential is applied to the wiring SL, the high-level potential is applied to the wiring CL[0] and the low-level potential is applied to the wiring CL[1]. In addition, at least in the period from time T11 to time T12 in which the high-level potential is applied to the wiring SL, the low-level potential is applied to the wiring CL[0] and the high-level potential is applied to the wiring CL[1]. Thus, in a period before time T6, a period after time T7 and before time T11, and a period after time T12, either the low-level potential or the high-level potential may be applied to each of the wirings CL[0] and CL[1].

<Structural Example of Circuit 14>

Next, a specific structural example of the circuit 14 illustrated in FIG. 1 is described.

FIG. 9A illustrates a structural example of the circuit 14. In FIG. 9A, the potential VSS and the potential VDD are applied to the circuit 14. FIG. 9A illustrates an example in which a level shifter is used to increase the amplitude of the pulse signal supplied to the wiring A1 by ΔV.

Specifically, the circuit 14 in FIG. 9A includes a D-type flip-flop (D-FF) 30, an XOR circuit 31, an inverter 32, and a level shifter (LS) 33.

When a signal extraContext[0] and a clock signal CLK are input to a D terminal and a C terminal of the D-FF 30, respectively, a signal obtained by delaying the signal extraContext[0] for one cycle of the clock signal is output from a terminal Q. When the signal output from the terminal Q and the signal extraContext[0] are input to the XOR circuit 31, the XOR circuit 31 outputs a pulse signal. The pulse signal has the high-level potential VDD in a period corresponding to one cycle of the clock signal CLK which starts from the time the potential of the signal extraContext[0] is switched.

The amplitude of the signal output from the XOR circuit 31 is increased in the LS 33. Specifically, the potential VSS and a potential HVDD are applied to the LS 33. The potential HVDD corresponds to the potential VDD+ΔV. The amplitude of the pulse signal output from the XOR circuit 31 is increased in the LS 33 from an amplitude corresponding to a difference between the potential VSS and the potential VDD to an amplitude corresponding to a difference between the potential VSS and the potential HVDD. A signal ow output from the LS 33 is supplied, for example, to the switch circuit SW illustrated in FIG. 5 through the wiring SL.

When the signal extraContext[0] is input to the inverter 32, the inverter 32 generates a signal Context[1] by inverting the polarity of the signal extraContext[0]. The signal Context[1] is supplied, for example, to the switch circuit SW illustrated in FIG. 5 through the wiring CL[1]. The signal extraContext[0] is supplied, for example, as the signal Context[0] to the switch circuit SW illustrated in FIG. 5 through the wiring CL[0].

FIG. 9B illustrates another structural example of the circuit 14. In FIG. 9B, the potential VSS and the potential HVDD are applied to the circuit 14. FIG. 9B illustrates an example in which a level sifter is used to decrease the amplitudes of the signal Context[0] and the signal Context[1].

Specifically, the circuit 14 in FIG. 9B includes the D-FF 30, the XOR circuit 31, the inverter 32, an LS 33a, and an LS 33b.

In the circuit 14 illustrated in FIG. 9B, as in the circuit 14 illustrated in FIG. 9A, a pulse signal is output from the XOR circuit 31. Note that the circuit 14 in FIG. 9B differs from the circuit 14 in FIG. 9A in that the pulse signal has the high-level potential HVDD. In FIG. 9B, the signal output from the XOR circuit 31 is supplied, for example, as the signal ow to the switch circuit SW illustrated in FIG. 5 through the wiring SL.

The potential VSS and the potential VDD are applied to the LS 33a and the LS 33b. In the LS 33a, the amplitude of the signal extraContext[0] is adjusted from the amplitude corresponding to the difference between the potential VSS and the potential HVDD to the amplitude corresponding to the difference between the potential VSS and the potential VDD. In the LS 33b, the amplitude of the signal Context[1] output from the inverter 32 is adjusted from the amplitude corresponding to the difference between the potential VSS and the potential HVDD to the amplitude corresponding to the difference between the potential VSS and the potential VDD.

The signal Context[1] having the adjusted amplitude is supplied, for example, as the signal Context[1] to the switch circuit SW illustrated in FIG. 5 through the wiring CL[1]. The signal extraContext[0] having the adjusted amplitude is supplied, for example, as the signal Context[0] to the switch circuit SW illustrated in FIG. 5 through the wiring CL[0].

Note that instead of the LS 33a or the LS 33b in FIG. 9B, an inverter, a buffer, or the like can be used.

Figure 10:
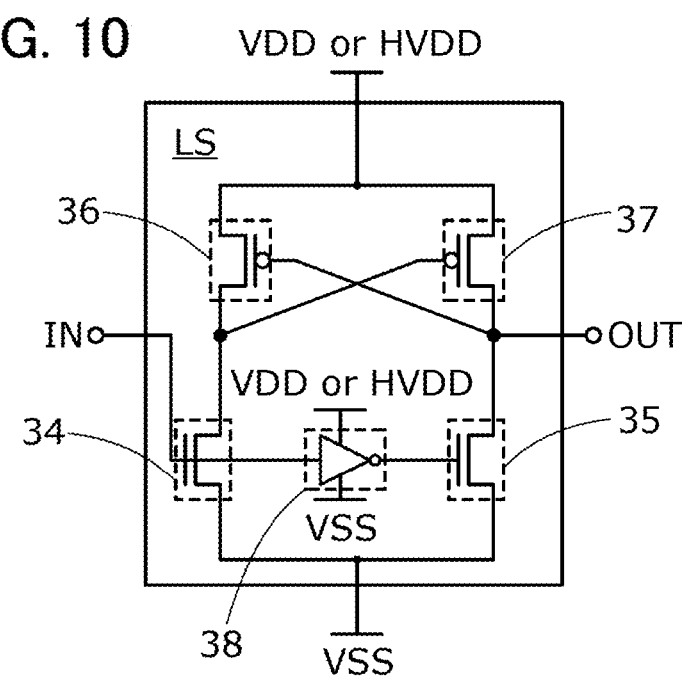
FIG. 10 illustrates a structure of a level shifter.

FIG. 10 illustrates a specific structural example of the LS 33 in FIG. 9A or the LS 33a or the LS 33b in FIG. 9B.

An LS in FIG. 10 (corresponding to the LS 33, the LS 33a, or the LS 33b) includes n-channel transistors 34 and 35, p-channel transistors 36 and 37, and an inverter 38.

A gate of the transistor 34 is electrically connected to an input terminal IN. One of a source and a drain of the transistor 34 is supplied with the potential VSS, and the other of the source and the drain of the transistor 34 is electrically connected to a gate of the transistor 37.

A gate of the transistor 36 is electrically connected to an output terminal OUT. One of a source and a drain of the transistor 36 is supplied with the potential VDD or the potential HVDD, and the other of the source and the drain of the transistor 36 is electrically connected to the gate of the transistor 37.

The inverter 38 is supplied with a potential of the input terminal IN and supplies an output potential to a gate of the transistor 35. In addition, the inverter 38 is supplied with a potential difference between the potential VSS and the potential VDD or the potential HVDD as a power supply voltage.

One of a source and a drain of the transistor 35 is supplied with the potential VSS, and the other of the source and the drain of the transistor 35 is electrically connected to the gate of the transistor 36.

One of a source and a drain of the transistor 37 is supplied with the potential VDD or the potential HVDD, and the other of the source and the drain of the transistor 37 is electrically connected to the gate of the transistor 36.

<Structural Example of Logic Array>

Next, a structural example of a PLD which corresponds to an example of a semiconductor device of one embodiment of the present invention is described.

Figure 11:
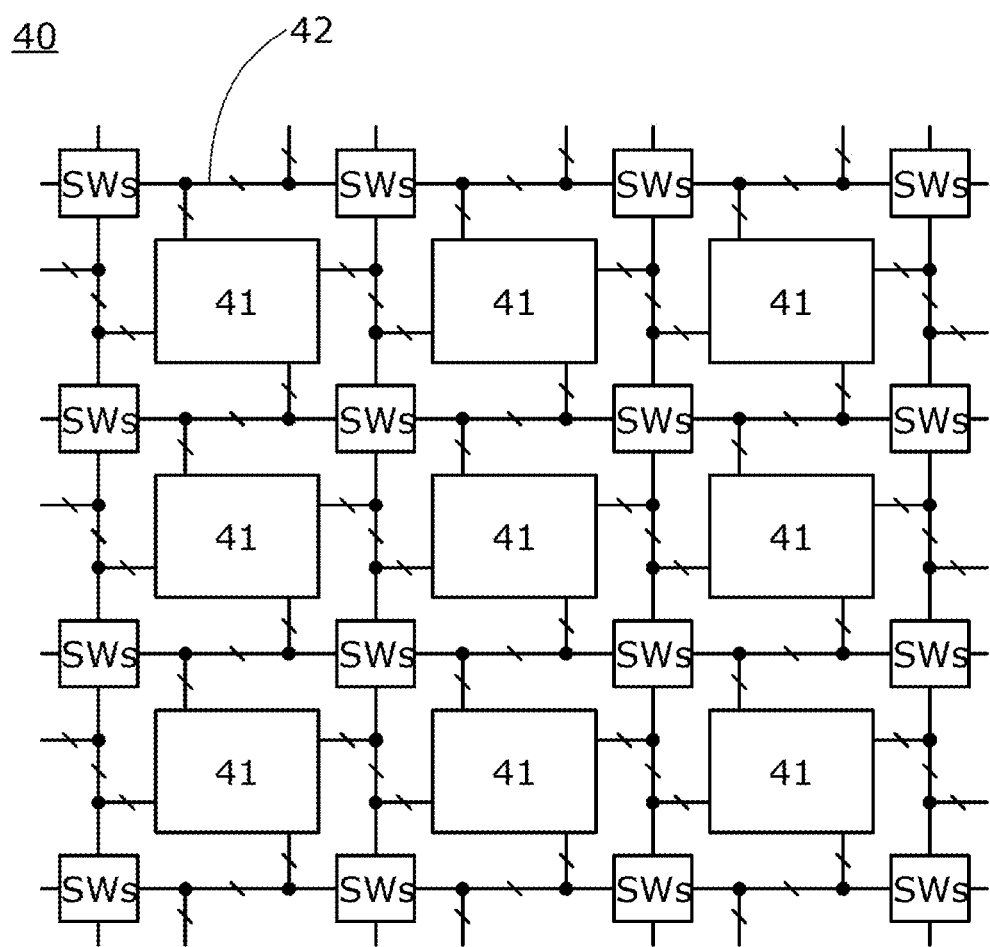
FIG. 11 illustrates a partial structure of a PLD.

FIG. 11 illustrates an example of a partial structure of a PLD 40. The PLD 40 includes a plurality of logic blocks 41, a plurality of wirings 42 electrically connected to input or output terminals of the plurality of logic blocks 41, and a plurality of switch circuits SWs having a function of controlling electrical connection between the wirings 42. The electrical connection between the logic blocks 41 is controlled with the plurality of wirings 42 and the plurality of switch circuits SWs.

Note that in addition to the wirings 42 electrically connected to the input or output terminals of the plurality of logic blocks 41, the PLD 40 in FIG. 11 may be provided with wirings having a function of supplying a clock signal CLK or a signal RES to the logic blocks 41. The clock signal CLK can be used to control the timing of signal output from a flip-flop of the logic block 41, for example. The signal RES can be used to control the timing of initialization of data stored in the flip-flop of the logic block 41, for example.
<Structural Example of Logic Block>

Next, structural examples of the logic block 41 are described.

Figure 12A:
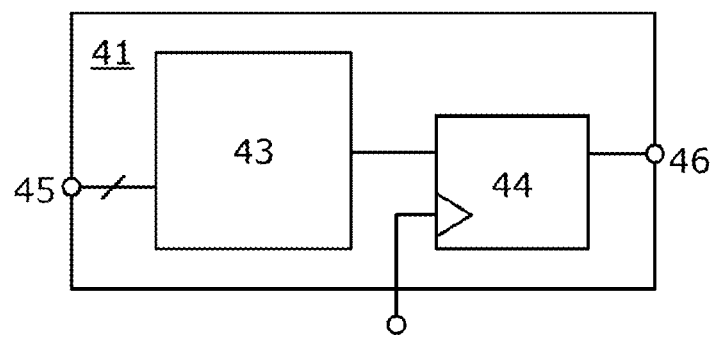
FIGS. 12A to 12D each illustrate a specific structure of a logic block.

FIG. 12A illustrates one embodiment of the logic block 41. The logic block 41 in FIG. 12A includes a look-up table (LUT) 43 and a flip-flop 44. In the LUT 43, the logical value of an output signal with respect to the logical value of an input signal that is input to an input terminal 45 is determined according to data including circuit information. The flip-flop 44 holds data contained in the output signal of the LUT 43 and outputs an output signal corresponding to the data in synchronization with a clock signal CLK from an output terminal 46.

The type of the flip-flop 44 may be determined by the data including circuit information. Specifically, the flip-flop 44 may have a function of any of a D flip-flop, a T flip-flop, a JK flip-flop, and an RS flip-flop depending on the data including circuit information.

Figure 12B:
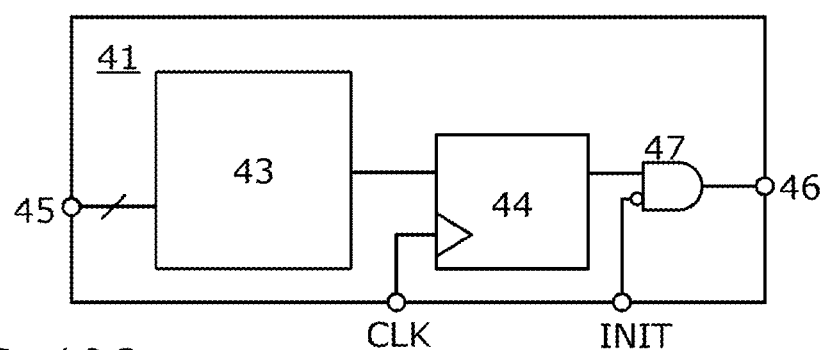

FIG. 12B illustrates another embodiment of the logic block 41. The logic block 41 illustrated in FIG. 12B includes an AND circuit 47 in addition to the components of the logic block 41 in FIG. 12A. To the AND circuit 47, a signal from the flip-flop 44 is supplied as an active high input, and the potential of a signal NIT is supplied as an active low input. With the above configuration, the potential of the output terminal 46 can be initialized according to the potential of the signal NIT.

Figure 12C:
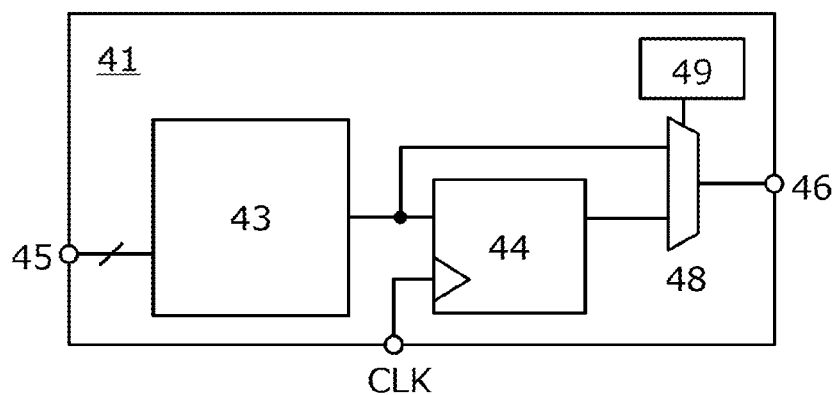

FIG. 12C illustrates another embodiment of the logic block 41. The logic block 41 in FIG. 12C includes a multiplexer 48 in addition to the components of the logic block 41 in FIG. 12A. In addition, the logic block 41 in FIG. 12C includes a memory circuit 49.

In the LUT 43, the logical value of an output signal with respect to the logical value of an input signal is determined according to data including circuit information. A signal output from the LUT 43 and a signal output from the flip-flop 44 are input to the multiplexer 48. The multiplexer 48 has functions of selecting and outputting one of the two output signals in accordance with data stored in the memory circuit 49. The signal output from the multiplexer 48 is output from the output terminal 46.

Figure 12D:
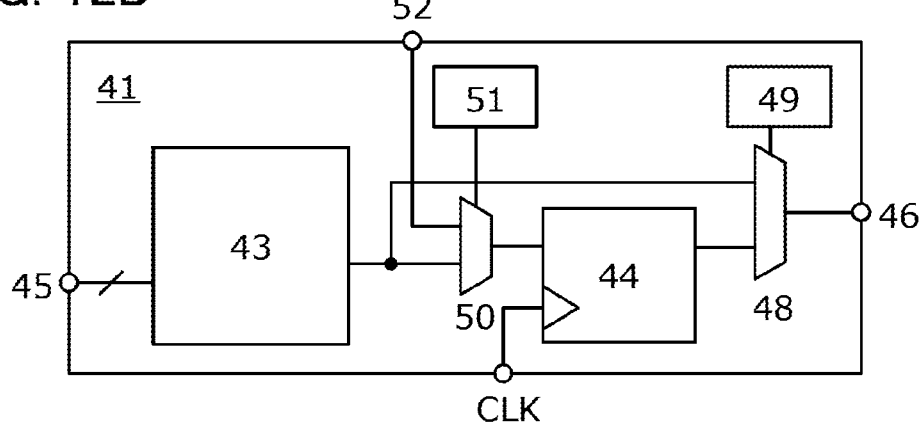

FIG. 12D illustrates another embodiment of the logic block 41. The logic block 41 in FIG. 12D includes a multiplexer 50 in addition to the components of the logic block 41 in FIG. 12C. In addition, the logic block 41 in FIG. 12D includes a memory circuit 51.

A signal output from the LUT 43 and a signal output from the flip-flop 44 of another logic block 41 and input through a terminal 52 are input to the multiplexer 50. The multiplexer 50 has functions of selecting and outputting one of the two output signals in accordance with data including circuit information which is stored in the memory circuit 51.
<Memory Circuit>

Next, a structural example of a memory circuit which is included in a logic block and has a function of storing circuit information is described.

Figure 13:
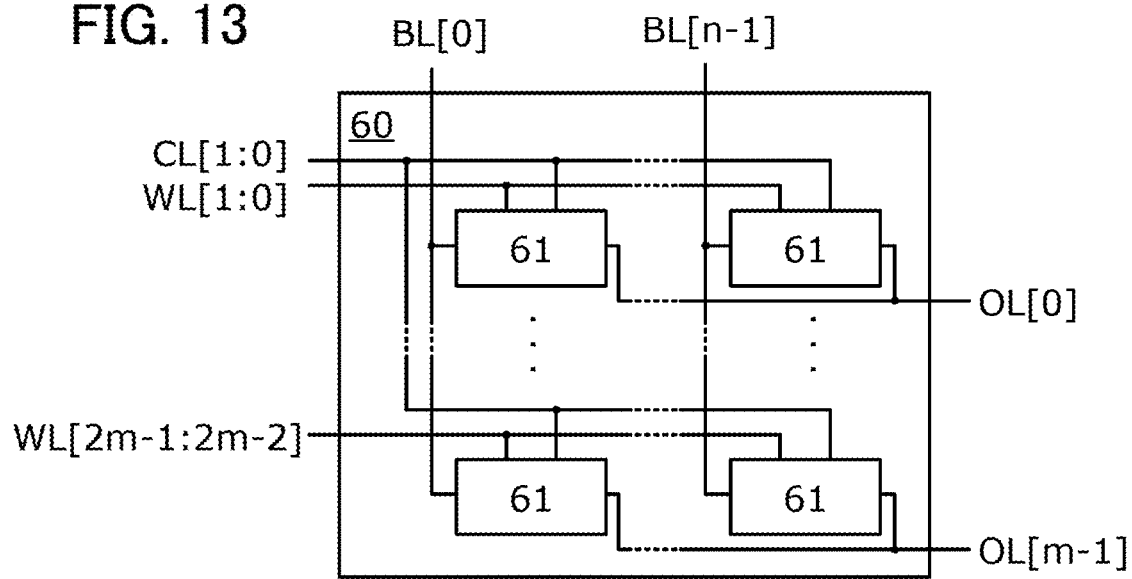
FIG. 13 illustrates a structure of a memory circuit.

FIG. 13 illustrates a structure of a memory circuit 60 as an example. The memory circuit 60 can be used as the memory circuit 49 in FIG. 12C or the memory circuit 49 or 51 in FIG. 12D. The memory circuit 60 can also be used as a memory circuit included in the LUT 43.

The memory circuit 60 includes a plurality of circuits 61 having a function of storing data. FIG. 13 illustrates an example in which the plurality of circuits 61 are arranged in m rows and n columns. The circuit 61 in an i-th column and a j-th row (i represents a natural number smaller than or equal to n, and j represents a natural number smaller than or equal to m) is electrically connected to a wiring BL[i−1], a wiring CL[1:0], a wiring WL[2j−1:2j−2], and a wiring OL[j−1].

Figure 14A:
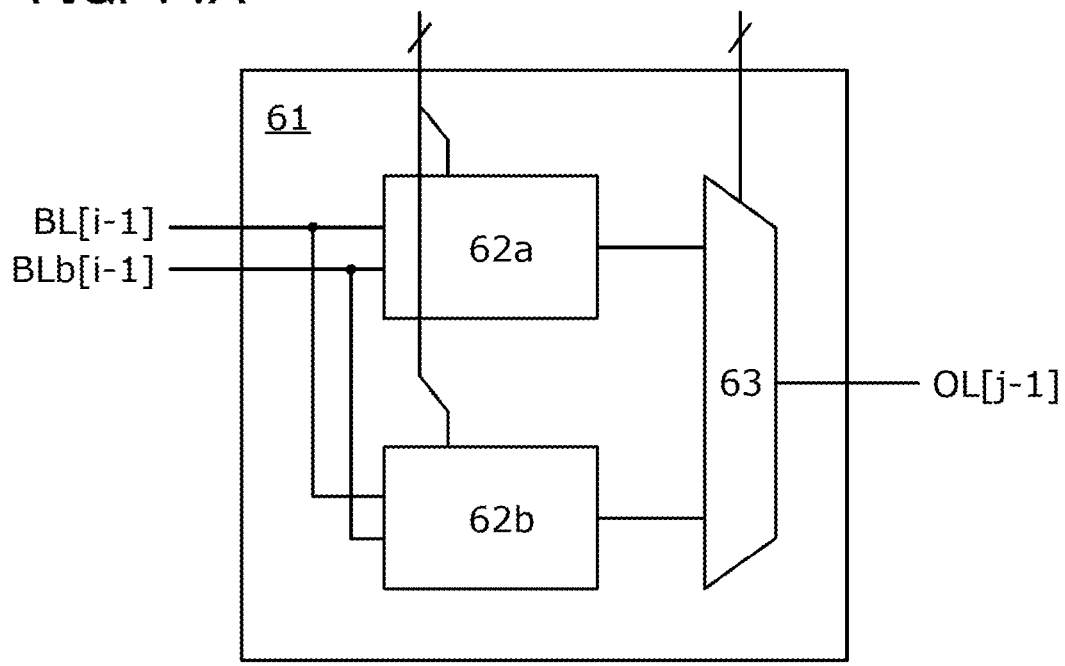
FIGS. 14A and 14B illustrate structures of circuits 61 and 62, respectively.

FIG. 14A illustrates a specific structural example of the circuit 61 in the i-th column and the j-th row. The circuit 61 includes a plurality of circuits 62 having a function of storing data and a multiplexer 63 having a function of selecting among data output from the plurality of circuits 62. Specifically, FIG. 14A illustrates an example in which the circuit 61 includes two circuits 62 (a circuit 62a and a circuit 62b).

Specifically, a wiring BL[i−1] and a wiring BLb[i−1] to which respective signals with inverted polarities are input are both electrically connected to the circuit 62a and the circuit 62b. The wiring WL[2j−2] and the wiring WL[2j−1] are electrically connected to each of the circuit 62a and the circuit 62b. The wiring CL[0] and the wiring CL[1] are electrically connected to the multiplexer 63. Either data output from the circuit 62a or data output from the circuit 62b is selected by the multiplexer 63 in accordance with data contained in signals supplied through the wiring CL[0] and the wiring CL[1].

Note that the number of circuits 62 in the circuit 61 may be three or more. In that case, it is preferable that the numbers of wirings WL and wirings CL electrically connected to the circuit 61 be also adjusted in accordance with the number of circuits 62. The number of circuits 62 in the circuit 61 may be one. In that case, it is preferable that the numbers of wirings WL and wirings CL be also adjusted in accordance with the number of circuits 62. Furthermore, in the case where the number of circuits 62 in the circuit 61 is one, the multiplexer 63 is not necessarily provided in the circuit 61, and data output from the circuit 62 may be input to the wiring OL[j−1].

Figure 14B:
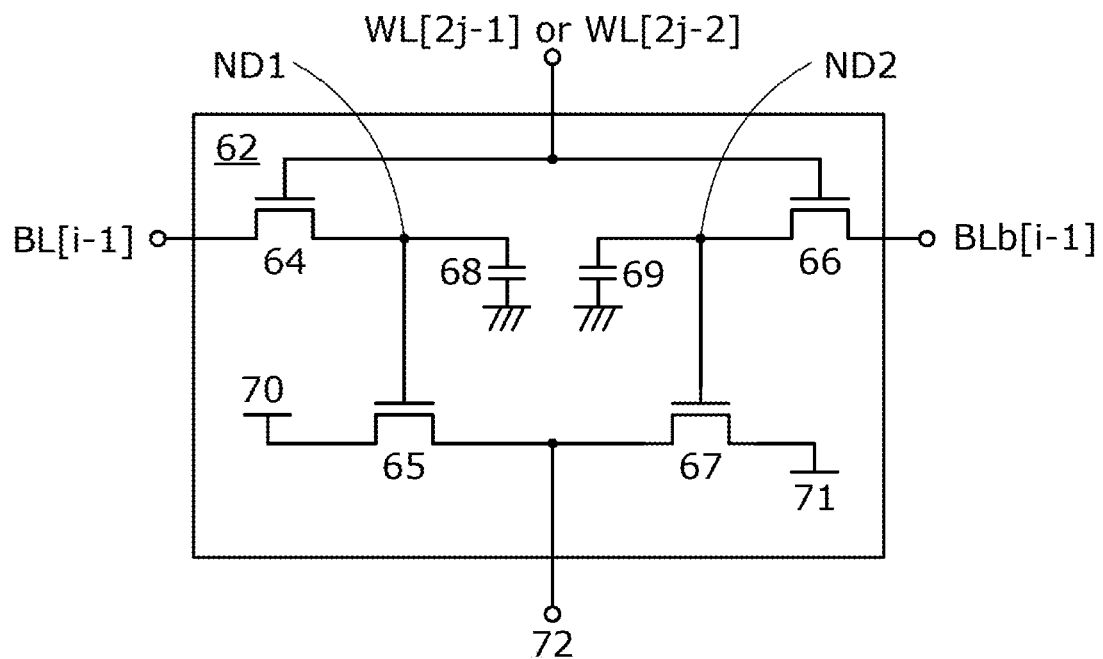

FIG. 14B illustrates a specific structure of the circuit 62 as an example. The circuit 62 in FIG. 14B includes at least transistors 64 to 67. The circuit 62 may include capacitors 68 and 69 as illustrated in FIG. 14B.

The transistor 64 has a function of controlling the supply of the potential of a first signal containing data to a node ND1 in the circuit 62. Specifically, when the transistor 64 is on, the potential of the first signal containing data which is supplied to the wiring BL[i−1] is supplied to the node ND1. When the transistor 64 is off, the potential of the node ND1 is held. One electrode of the capacitor 68 is electrically connected to the node ND1, and the capacitor 68 has a function of holding the potential of the node ND1. The other electrode of the capacitor 68 is connected to, for example, a wiring having a function of supplying a constant potential and is connected to, for example, a GND line. Note that the potential of the wiring is not limited to 0 V.

Whether the transistor 64 is turned on or off is selected in accordance with the potential of a signal supplied to the wiring WL[2j−1] or the wiring WL[2j−2].

The transistor 65 has a function of switching electrical connection and disconnection of a wiring 70 and a wiring 72 to and from each other in accordance with the potential of the node ND1. Specifically, when the transistor 65 is on, the wiring 70 and the wiring 72 are electrically connected to each other. When the transistor 65 is off, the wiring 70 and the wiring 72 are electrically disconnected from each other.

The transistor 66 has a function of controlling the supply of the potential of a second signal containing data to a node ND2 in the circuit 62. Specifically, when the transistor 66 is on, the potential of the second signal containing data which is supplied to the wiring BLb[i−1] is supplied to the node ND2. When the transistor 66 is off, the potential of the node ND2 is held. One electrode of the capacitor 69 is electrically connected to the node ND2, and the capacitor 69 has a function of holding the potential of the node ND2. The other electrode of the capacitor 69 is electrically connected to, for example, a wiring having a function of supplying a constant potential and is connected to, for example, a GND line. Note that the potential of the wiring is not limited to 0 V. The other electrode of the capacitor 69 may be electrically connected to the other electrode of the capacitor 68. However, one embodiment of the present invention is not limited thereto.

Whether the transistor 66 is turned on or off is selected in accordance with the potential of the signal supplied to the wiring WL[2j−1] or the wiring WL[2j−2].

The transistor 67 has a function of switching electrical connection and disconnection of a wiring 71 and the wiring 72 to and from each other in accordance with the potential of the node ND2. Specifically, when the transistor 67 is on, the wiring 71 and the wiring 72 are electrically connected to each other. When the transistor 67 is off, the wiring 71 and the wiring 72 are electrically disconnected from each other.

Note that the high-level potential VDD is applied to the wiring 70 and the low-level potential VSS is applied to the wiring 71. When data is to be written to the circuit 62, the potential of the first signal and the potential of the second signal are opposite in polarity, that is, have inverted logic levels. Thus, when one of the transistors 65 and 67 is on, the other is off. Which of the transistors 65 and 67 is on depends on the potentials of the first and second signals, that is, data. Accordingly, whether the potential applied to the wiring 72 is the high-level potential VDD or the low-level potential VSS depends on the data.

A signal containing data about the potential applied to the wiring 72 is input to the multiplexer 63 in FIG. 14A.

Note that transistors used as the transistors 64 and 66 in the circuit 62 illustrated in FIG. 14B preferably have extremely small off-state current because the transistors retain the potentials of the nodes ND1 and ND2. Transistors in which a channel formation region is formed in a film of a semiconductor having a wider band gap and lower intrinsic carrier density than silicon can have extremely small off-state current and thus are preferably used as the transistors 64 and 66. Examples of such a semiconductor are an oxide semiconductor and gallium nitride that have a band gap more than twice as wide as that of silicon. Consequently, the use of the transistors with the above structure as the transistors 64 and 66 can prevent leakage of electric charge held at the nodes ND1 and ND2.

In the case where an n-channel transistor is used as the transistor 64, it is easy to make the node ND1 have the potential VSS but it is difficult to make the node ND1 have the potential VDD in light of the threshold voltage of the transistor. For this reason, if a p-channel transistor is used as the transistor 65, it is difficult to turn off the transistor 65 completely and a shoot-through current is likely to flow through the transistor 65. Consequently, in the case where an n-channel transistor is used as the transistor 64, an n-channel transistor is preferably used as the transistor 65 in order to prevent shoot-through current. The same applies to the transistors 66 and 67. In other words, in the case where an n-channel transistor is used as the transistor 66, an n-channel transistor is preferably used as the transistor 67 in order to prevent shoot-through current.

In addition, in the case where a p-channel transistor is used as the transistor 64, it is easy to make the node ND1 have the potential VDD but it is difficult to make the node ND1 have the potential VSS in light of the threshold voltage of the transistor. For this reason, if an n-channel transistor is used as the transistor 65, it is difficult to turn off the transistor 65 completely and a shoot-through current is likely to flow through the transistor 65. Consequently, in the case where a p-channel transistor is used as the transistor 64, a p-channel transistor is preferably used as the transistor 65 in order to prevent shoot-through current. The same applies to the transistors 66 and 67. In other words, in the case where a p-channel transistor is used as the transistor 66, a p-channel transistor is preferably used as the transistor 67 in order to prevent shoot-through current.

<Structural Example of Multiplexer>

Next, a structural example of a multiplexer of one embodiment of the present invention will be described.

Figure 15:
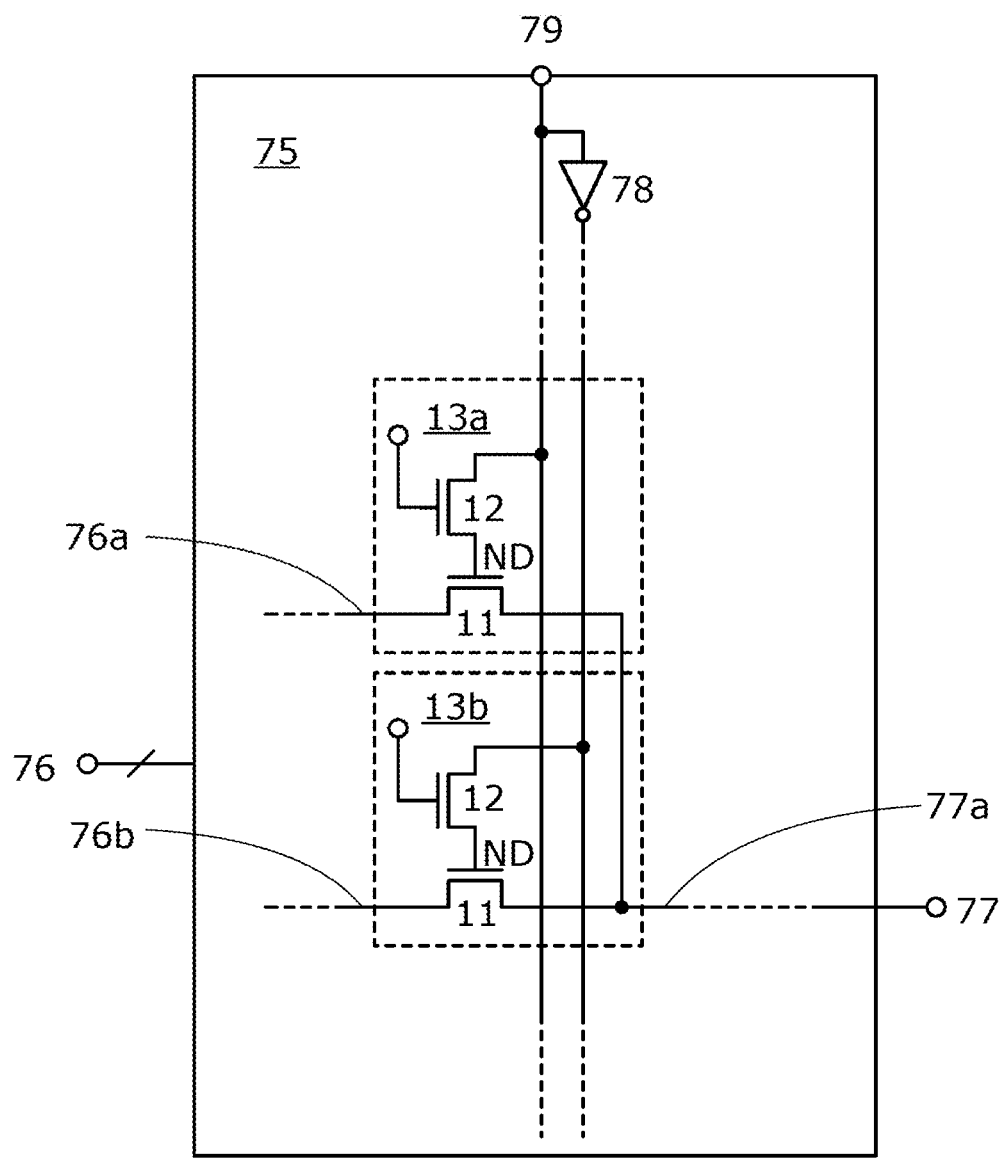
FIG. 15 illustrates a structure of a multiplexer.

FIG. 15 illustrates an example of a specific structure of a multiplexer (MUX) 75. A multiplexer of one embodiment of the present invention includes a plurality of circuits 13 illustrated in FIG. 1. Specifically, FIG. 15 illustrates a structure of the MUX 75 including a plurality of circuits 13 (a circuit 13a and a circuit 13b). The MUX 75 can select any one of signals input to a plurality of wirings 76 and supply the selected signal to a wiring 77 by controlling operations of the circuits 13a and 13b according to data including circuit information.

Specifically, assuming that a wiring 76a is one of the plurality of wirings 76, the circuit 13a has a function of controlling whether or not a signal input to the wiring 76a is supplied to a wiring 77a in accordance with a signal containing circuit information. Specifically, assuming that a wiring 76b is another one of the plurality of wirings 76, specifically, the circuit 13b has a function of controlling whether a signal input to the wiring 76b is supplied to the wiring 77a in accordance with a signal containing circuit information.

Note that each of the wirings 76a and 76b corresponds to the wiring A3 in FIG. 1, and the wiring 77a corresponds to the wiring A4 in FIG. 1.

Specifically, a signal including circuit information is input to one of the source and the drain of the transistor 12 through a wiring 79, and the other of the source and the drain of the transistor 12 is connected to the gate of the transistor 11. One of the source and the drain of the transistor 11 is connected to the wiring 76a or the wiring 76b, and the other of the source and the drain of the transistor 11 is connected to the wiring 77a.

Logic levels of signals including circuit information that are input to the circuits 13a and 13b are different from each other. Specifically, FIG. 15 illustrates an example in which the logic level of a signal input to the circuit 13a is inverted by an inverter 78 and the inverted signal is input to the circuit 13b. Alternatively, signals with different logic levels may be input to the circuits 13a and 13b without the use of the inverter 78.

Although FIG. 15 illustrates the structure where the inverter 78 is included in the MUX 75, the MUX 75 does not necessarily include the inverter 78.

With such a structure, the transistor 11 is turned on in one of the circuits 13a and 13b, and the transistor 11 is turned off in the other of the circuits 13a and 13b. That is, only one of the signals input to the wirings 76a and 76b is selected by the circuits 13a and 13b to be supplied to the wiring 77a.

Note that depending on the number of wirings 76, a plurality of circuits 13a and a plurality of circuits 13b may be provided in the MUX 75. In such a case, a plurality of wirings 77a to which signals selected by the plurality of circuits 13a and the plurality of circuits 13b are input are provided in the MUX 75. The MUX 75 described above also includes one or more circuits 13a and one or more circuits 13b for further selecting among the signals input to the plurality of wirings 77a. By selecting signals with the plurality of circuits 13a and 13b repeatedly, one signal is eventually supplied to the wiring 77.

In one embodiment of the present invention, it is preferable that the off-state current of the transistor 12 be significantly lower than that of the transistor 11. A transistor in which a channel formation region is formed in a film of a semiconductor having a wider band gap and lower intrinsic carrier density than silicon has significantly low off-state current and thus is preferably used as the transistor 12. Examples of such a semiconductor are an oxide semiconductor and gallium nitride that each have a band gap more than twice as wide as that of silicon.

The transistor 12 with such a structure can prevent leakage of charge held at the node ND connected to the gate of the transistor 11 when the transistor 12 is off. The on/off state of the transistor 11 is maintained by the charge held at the node ND; thus, a signal is selected continuously by the circuit 13a or the circuit 13b.

Figure 16:
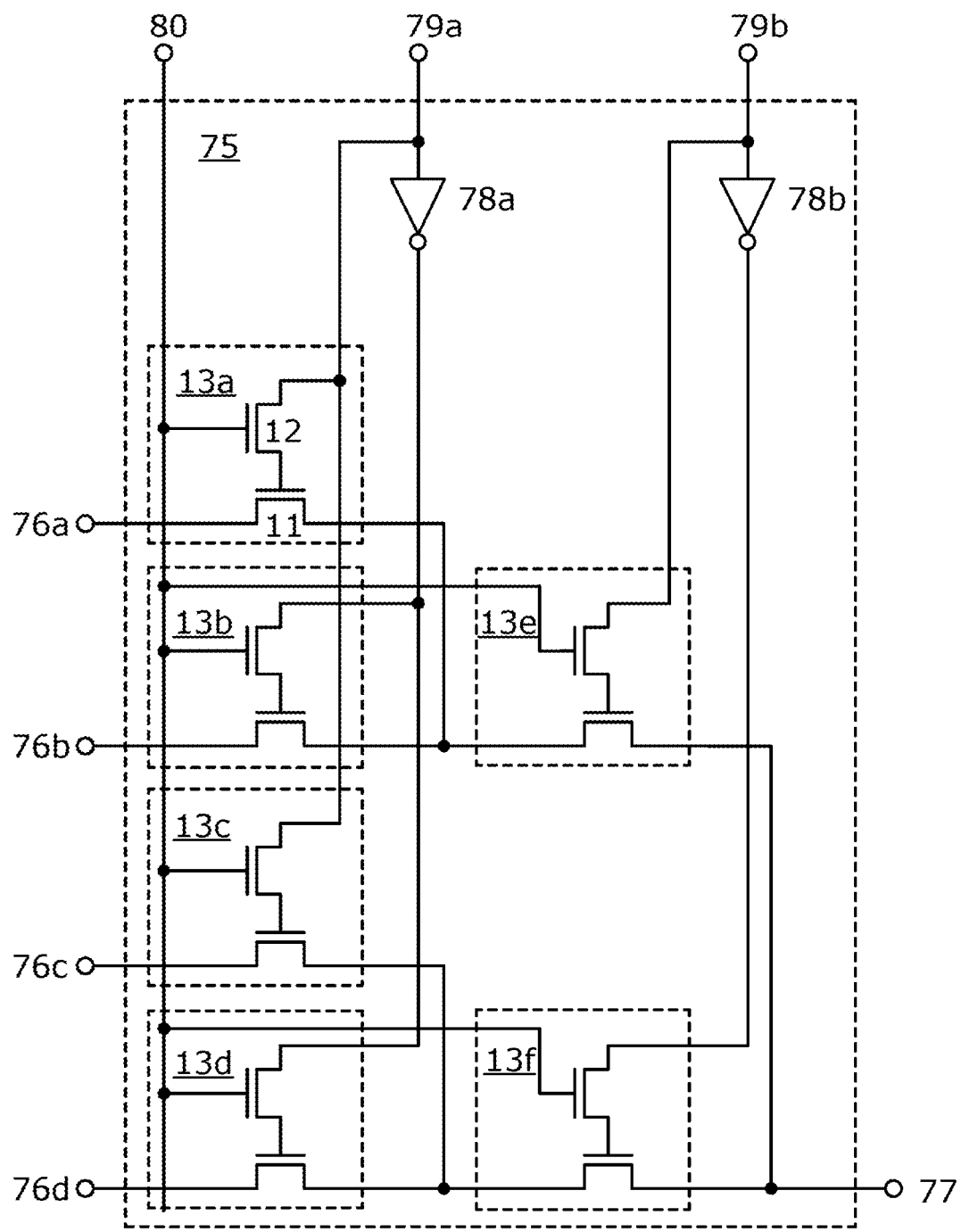
FIG. 16 illustrates a structure of a multiplexer.

FIG. 16 illustrates a structural example of the MUX 75 to which a 2-bit signal is input. The MUX 75 in FIG. 16 includes six circuits 13 (circuits 13a to 13f). The circuits 13a to 13f each include the transistors 11 and 12. Connection between the transistors 11 and 12 is the same as that in the MUX 75 illustrated in FIG. 15.

Note that in the MUX 75 in FIG. 16, one of the source and the drain of the transistor 12 included in each of the circuits 13a and 13c is connected to a wiring 79a. One of the source and the drain of the transistor 12 in each of the circuits 13b and 13d is connected to an output terminal of an inverter 78a. An input terminal of the inverter 78a is connected to the wiring 79a. One of the source and the drain of the transistor 12 in the circuit 13e is connected to a wiring 79b. One of the source and the drain of the transistor 12 in the circuit 13f is connected to an output terminal of an inverter 78b. An input terminal of the inverter 78b is connected to the wiring 79b.

In addition, in the MUX 75 in FIG. 16, one of the source and the drain of the transistor 11 in each of the circuits 13a to 13d is connected to a corresponding one of wirings 76a to 76d. The other of the source and the drain of the transistor 11 in each of the circuits 13a and 13b is connected to one of the source and the drain of the transistor 11 in the circuit 13e. The other of the source and the drain of the transistor 11 in each of the circuits 13c and 13d is connected to one of the source and the drain of the transistor 11 in the circuit 13f. The other of the source and the drain of the transistor 11 in each of the circuits 13e and 13f is connected to the wiring 77.

In the MUX 75 in FIG. 16, the on/off states of the transistors 11 are determined in accordance with signals including circuit information that are input from the wirings 79a and 79b. Any one of signals input to the wirings 76a to 76d is selected by the circuits 13a to 13f in accordance with the above signals and is input to the wiring 77.

Note that in the multiplexer in FIG. 15, a boosting effect can be obtained in the circuits 13a and 13b when a signal supplied to the wiring 79 is a signal including circuit information. It is thus preferable that the multiplexer in FIG. 15 be used as the multiplexer 48 of the logic block 41 in FIG. 12C or the multiplexer 48 or 50 of the logic block 41 in FIG. 12D, rather than as the multiplexer in the LUT 43 of the logic block 41 in each of FIGS. 12A to 12D because the boosting effect can be obtained in the circuits 13a and 13b.

<Structural Example of PLD>

Figure 17:
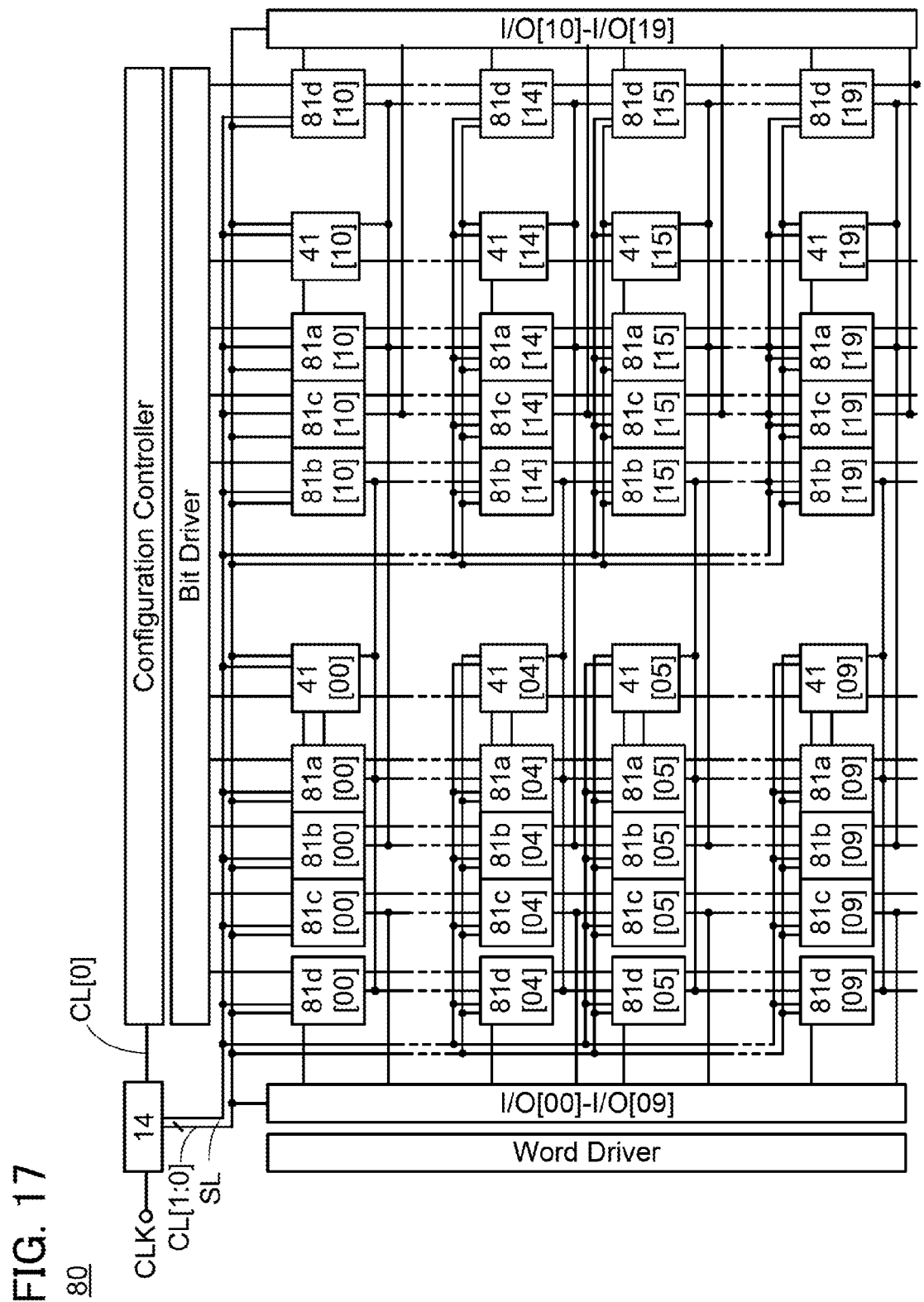
FIG. 17 illustrates a structure of a PLD.

FIG. 17 illustrates a structural example of a PLD 80. FIG. 17 illustrates an example in which the PLD 80 includes a plurality of logic blocks 41 arranged in two columns and ten rows. Specifically, FIG. 17 illustrates a logic block 41 [xy] as a logic block 41 in an (x+1)-th column and a (y+1)-th row (x+1 is a natural number smaller than or equal to 2, and y+1 is a natural number smaller than or equal to 10).

The PLD 80 in FIG. 17 includes a plurality of switch circuits SWs. Specifically, FIG. 17 illustrates a switch circuit 81a[0y] as a switch circuit SWs that controls the input of a signal to a logic block 41[0y]. In addition, FIG. 17 illustrates a switch circuit 81b[0y] as a switch circuit SWs that controls the input of a signal from a logic block 41[1y] to a logic block 41[0y].

An I/O includes a plurality of I/O blocks. The I/O block functions as an interface that controls input and output of signals from and to an external circuit of the PLD 80. The PLD 80 in FIG. 17 includes I/O blocks [00] to [09] (I/O [00]-I/O[09]) and I/O blocks [10] to [19] (I/O[10]-I/O[19]).

FIG. 17 illustrates a switch circuit 81c[0y] as a switch circuit SWs that controls the input of a signal from the I/O block [0y] to the logic block 41[0y]. FIG. 17 also illustrates a switch circuit 81d[0y] as a switch circuit SWs that controls the input of a signal from the logic block 41[0y] to the I/O block [0y].

FIG. 17 also illustrates a switch circuit 81a[1y] as a switch circuit SWs that controls the input of a signal to a logic block 41[1y]. FIG. 17 also illustrates a switch circuit 81b[1y] as a switch circuit SWs that controls the input of a signal from the logic block 41[0y] to the logic block 41[1y].

FIG. 17 also illustrates a switch circuit 81c[1y] as a switch circuit SWs that controls the input of a signal from the I/O block [1y] to the logic block 41[1y]. FIG. 17 also illustrates a switch circuit 81d[1y] as a switch circuit SWs that controls the input of a signal from the logic block 41[1y] to the I/O block [1y].

Wirings through which output signals are supplied to adjacent logic blocks without passing through the switch circuits may be provided in the PLD 80. These wirings are effective in configuring a shift register, an adder circuit, a subtractor circuit, or the like with a plurality of logic blocks. When a 1-bit half adder circuit or full adder circuit is added to the logic block, an intended arithmetic circuit can be configured with a smaller number of logic blocks; for example, an adder circuit or a subtractor circuit that is generally composed of a plurality of logic blocks can be configured by one logic block.

The PLD 80 also includes a driver circuit (Bit Driver) that controls the supply of signals to wirings BL of the memory circuits 60 in the logic blocks 41 or to wirings BL of the switch circuits SWs, a driver circuit (Configuration Controller) that selects potentials to be supplied to a plurality of wirings CL, and a driver circuit (Word Driver) that controls the supply of signals to wirings WL of the memory circuits 60 in the logic blocks 41 or to wirings WL of the switch circuits SWs.

<Example of Cross-Sectional Structure of Semiconductor Device>

Figure 18:
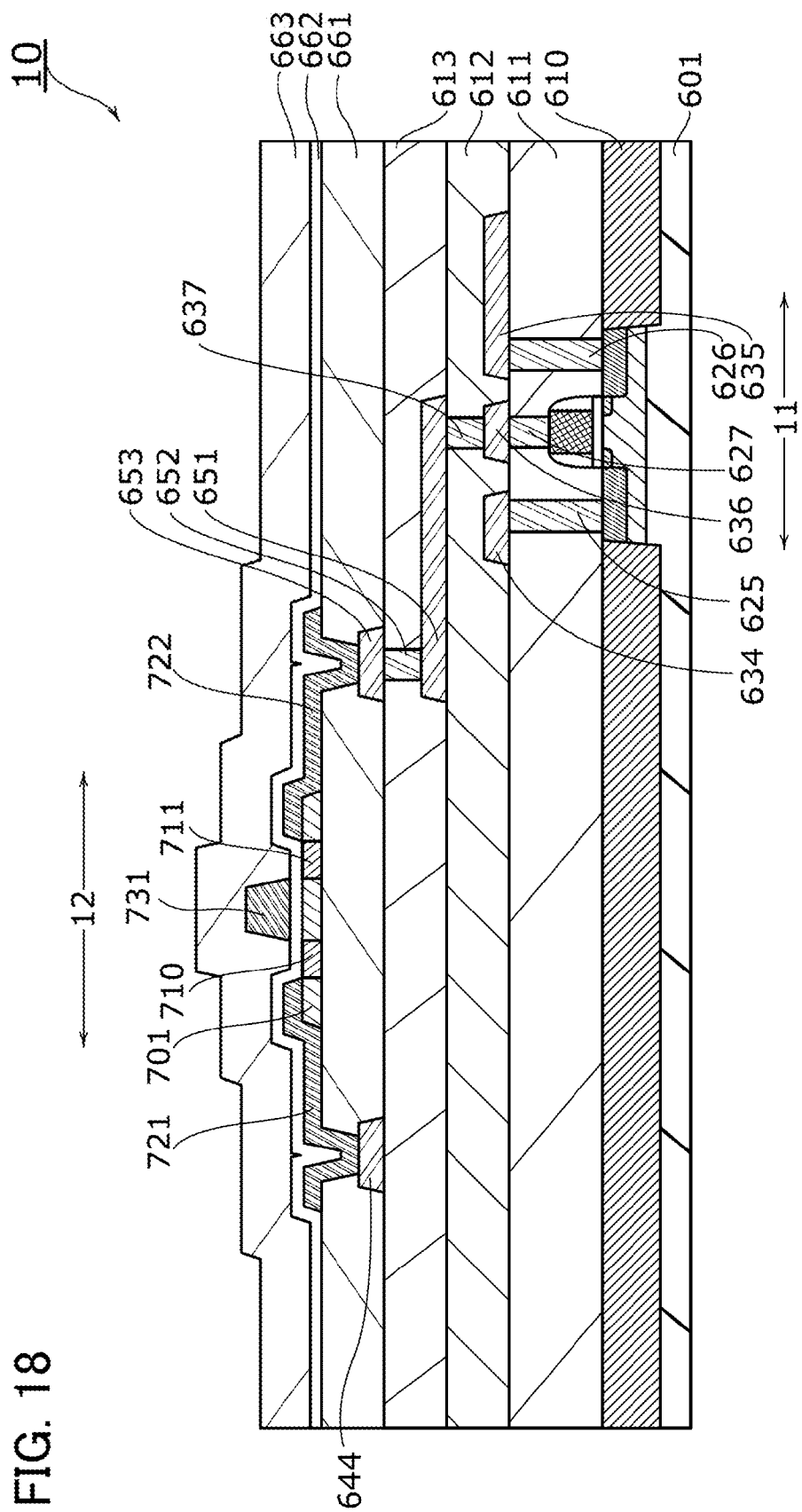
FIG. 18 illustrates a cross-sectional structure of a semiconductor device.

FIG. 18 illustrates an example of a cross-sectional structure of a semiconductor device including the circuit 13 in FIG. 1.

In FIG. 18, the transistor 12 including a channel formation region in an oxide semiconductor film is formed over the transistor 11 including a channel formation region in a single crystal silicon substrate.

The transistor 11 may include the channel formation region in a semiconductor film or a semiconductor substrate of silicon, germanium, or the like in an amorphous, microcrystalline, polycrystalline, or single crystal state. Alternatively, the transistor 11 may include the channel formation region in an oxide semiconductor film or an oxide semiconductor substrate. In the case where the transistors each include a channel formation region in an oxide semiconductor film or an oxide semiconductor substrate, the transistor 12 is not necessarily stacked over the transistor 11, and the transistors 12 and 11 may be formed in the same layer.

In the case where the transistor 11 is formed using a thin silicon film, any of the following can be used in the thin film: amorphous silicon formed by a sputtering method or a vapor phase growth method such as a plasma-enhanced CVD method; polycrystalline silicon obtained by crystallization of amorphous silicon by treatment such as laser annealing; single crystal silicon obtained by separation of a surface portion of a single crystal silicon wafer by implantation of hydrogen ions or the like into the silicon wafer; and the like.

A semiconductor substrate 601 where the transistor 11 is formed can be, for example, a silicon substrate, a germanium substrate, or a silicon germanium substrate. In FIG. 18, a single crystal silicon substrate is used as the semiconductor substrate 601.

The transistor 11 is electrically isolated by an element isolation method. As the element isolation method, a selective oxidation method (a local oxidation of silicon (LOCOS) method), a trench isolation method (a shallow trench isolation (STI) method), or the like can be used. FIG. 18 illustrates an example where the trench isolation method is used to electrically isolate the transistor 11. Specifically, in FIG. 18, the transistor 11 is electrically isolated by element isolation using an element isolation region 610 formed in such a manner that an insulator including silicon oxide or the like is buried in a trench formed in the semiconductor substrate 601 by etching or the like.

An insulating film 611 is provided over the transistor 11. Openings are formed in the insulating film 611. Conductive films 625 and 626 that are electrically connected to the source and the drain of the transistor 11 and a conductive film 627 that is electrically connected to the gate of the transistor 11 are formed in the openings.

The conductive film 625 is electrically connected to a conductive film 634 formed over the insulating film 611. The conductive film 626 is electrically connected to a conductive film 635 formed over the insulating film 611. The conductive film 627 is electrically connected to a conductive film 636 formed over the insulating film 611.

An insulating film 612 is formed over the conductive films 634 and 635. An opening is formed in the insulating film 612. A conductive film 637 electrically connected to the conductive film 636 is formed in the opening. The conductive film 637 is electrically connected to a conductive film 651 formed over the insulating film 612.

An insulating film 613 is formed over the conductive film 651. An opening is formed in the insulating film 613. A conductive film 652 electrically connected to the conductive film 651 is formed in the opening. The conductive film 652 is electrically connected to a conductive film 653 formed over the insulating film 613. A conductive film 644 is formed over the insulating film 613.

An insulating film 661 is formed over the conductive film 653 and the conductive film 644. In FIG. 18, the transistor 12 is formed over the insulating film 661.

The transistor 12 includes, over the insulating film 661, a semiconductor film 701 including an oxide semiconductor, conductive films 721 and 722 functioning as source and drain electrodes over the semiconductor film 701, a gate insulating film 662 over the semiconductor film 701 and the conductive films 721 and 722, and a gate electrode 731 overlapping with the semiconductor film 701 over the gate insulating film 662 and between the conductive films 721 and 722. Note that the conductive film 722 is electrically connected to the conductive film 653 in the opening formed in the insulating film 661.

In the semiconductor film 701 of the transistor 12, there is a region 710 between a region overlapping with the conductive film 721 and a region overlapping with the gate electrode 731. In addition, in the semiconductor film 701 of the transistor 12, there is a region 711 between a region overlapping with the conductive film 722 and the region overlapping with the gate electrode 731. When argon, an impurity which imparts p-type conductivity to the semiconductor film 701, or an impurity which imparts n-type conductivity to the semiconductor film 701 is added to the regions 710 and 711 using the conductive films 721 and 722 and the gate electrode 731 as a mask, the resistivity of the regions 710 and 711 can be made lower than that of the region overlapping with the gate electrode 731 in the semiconductor film 701.

An insulating film 663 is provided over the transistor 12.

In FIG. 18, the transistor 12 has the gate electrode 731 on at least one side of the semiconductor film 701; alternatively, the transistor 12 may have a pair of gate electrodes with the semiconductor film 701 positioned therebetween.

In the case where the transistor 12 has a pair of gate electrodes with the semiconductor film 701 positioned therebetween, one of the gate electrodes may be supplied with a signal for controlling the on/off state, and the other of the gate electrodes may be supplied with a potential from another element. In this case, potentials with the same level may be supplied to the pair of gate electrodes, or a fixed potential such as the ground potential may be supplied only to the other of the gate electrodes. By controlling the level of a potential supplied to the other of the gate electrodes, the threshold voltage of the transistor can be controlled.

In FIG. 18, the transistor 12 has a single-gate structure where one channel formation region corresponding to one gate electrode 731 is provided. However, the transistor 12 may have a multi-gate structure where a plurality of electrically connected gate electrodes are provided so that a plurality of channel formation regions are included in one active layer.

<Transistor>

Next, an example of a structure of a transistor 90 that includes a channel formation region in an oxide semiconductor film is described.

Figure 19A:
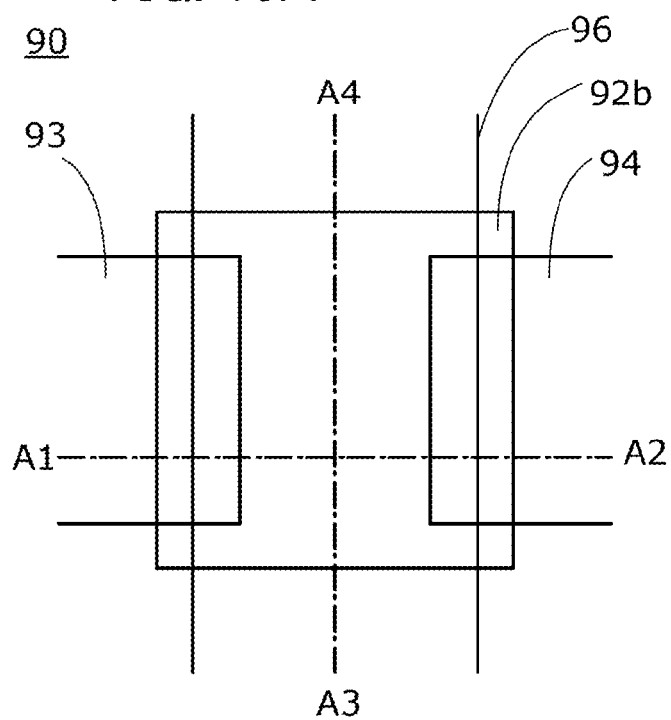
FIGS. 19A to 19C illustrate a structure of a transistor.
Figure 19C:
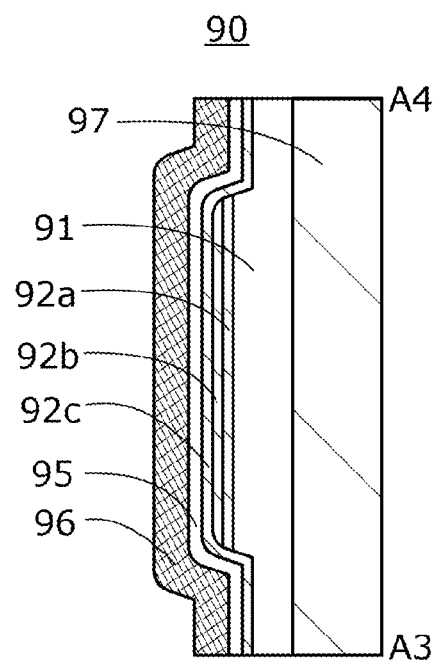
Figure 19B:
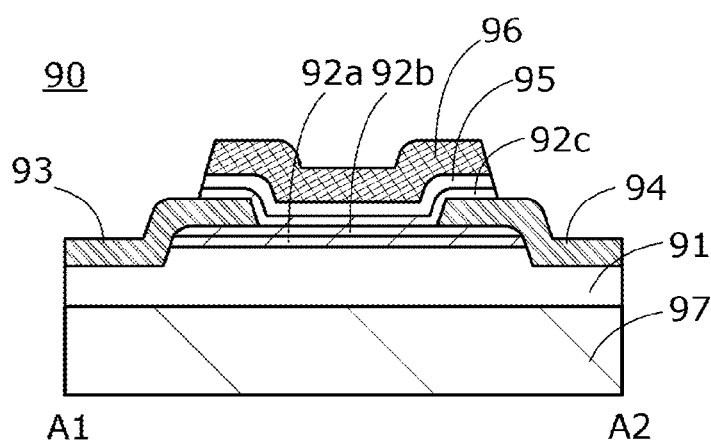

FIGS. 19A to 19C illustrate a structure of the transistor 90 that includes a channel formation region in an oxide semiconductor film as an example. FIG. 19A is a top view of the transistor 90. Note that insulating films are not illustrated in FIG. 19A in order to clarify the layout of the transistor 90. FIG. 19B is a cross-sectional view along the dashed line A1-A2 in the top view in FIG. 19A. FIG. 19C is a cross-sectional view along the dashed line A3-A4 in the top view in FIG. 19A.

As illustrated in FIGS. 19A to 19C, the transistor 90 includes an oxide semiconductor film 92a and an oxide semiconductor film 92b that are stacked in this order over an insulating film 91 formed over a substrate 97; a conductive film 93 and a conductive film 94 that are electrically connected to the oxide semiconductor film 92b and function as a source electrode and a drain electrode; an oxide semiconductor film 92c over the oxide semiconductor film 92b, the conductive film 93, and the conductive film 94; an insulating film 95 that functions as a gate insulating film and is located over the oxide semiconductor film 92c; and a conductive film 96 that functions as a gate electrode, lies over the insulating film 95, and overlaps with the oxide semiconductor films 92a to 92c. Note that the substrate 97 may be a glass substrate, a semiconductor substrate, or the like or may be an element substrate where semiconductor elements are formed over a glass substrate or on a semiconductor substrate.

FIGS. 20A to 20C illustrate another specific example of the structure of the transistor 90. FIG. 20A is a top view of the transistor 90. Note that insulating films are not illustrated in FIG. 20A in order to clarify the layout of the transistor 90. FIG. 20B is a cross-sectional view along the dashed line A1-A2 in the top view in FIG. 20A. FIG. 20C is a cross-sectional view along the dashed line A3-A4 in the top view in FIG. 20A.

As illustrated in FIGS. 20A to 20C, the transistor 90 includes the oxide semiconductor films 92a to 92c that are stacked in this order over the insulating film 91; the conductive films 93 and 94 that are electrically connected to the oxide semiconductor film 92c and function as a source electrode and a drain electrode; the insulating film 95 that functions as a gate insulating film and is located over the oxide semiconductor film 92c and the conductive films 93 and 94; and the conductive film 96 that functions as a gate electrode, lies over the insulating film 95, and overlaps with the oxide semiconductor films 92a to 92c.

FIGS. 19A to 19C and FIGS. 20A to 20C each illustrate the structure example of the transistor 90 in which the oxide semiconductor films 92a to 92c are stacked. However, the structure of the oxide semiconductor film included in the transistor 90 is not limited to a stacked-layer structure including a plurality of oxide semiconductor films and may be a single-layer structure.

In the case where the transistor 90 includes the semiconductor film in which the semiconductor films 92a to 92c are stacked in this order, each of the oxide semiconductor films 92a and 92c is an oxide film that contains at least one of metal elements contained in the oxide semiconductor film 92b and in which energy at the conduction band minimum is closer to the vacuum level than that in the oxide semiconductor film 92b is by higher than or equal to 0.05 eV, 0.07 eV, 0.1 eV, or 0.15 eV and lower than or equal to 2 eV, 1 eV, 0.5 eV, or 0.4 eV. The oxide semiconductor film 92b preferably contains at least indium because carrier mobility is increased.

In the case where the transistor 90 includes the semiconductor films with the above structure, when an electric field is applied to the semiconductor films by applying voltage to the gate electrode, a channel region is formed in the oxide semiconductor film 92b, which has the lowest conduction band minimum among the semiconductor films. That is, since the oxide semiconductor film 92c is provided between the oxide semiconductor film 92b and the insulating film 95, a channel region can be formed in the oxide semiconductor film 92b, which is separated from the insulating film 95.

Since the oxide semiconductor film 92c contains at least one of metal elements contained in the oxide semiconductor film 92b, interface scattering is unlikely to occur at the interface between the oxide semiconductor film 92b and the oxide semiconductor film 92c. Thus, the movement of carriers is unlikely to be inhibited at the interface, which results in an increase in the field-effect mobility of the transistor 90.

When an interface state is formed at an interface between the oxide semiconductor films 92b and 92a, a channel region is also formed in a region close to the interface; thus, the threshold voltage of the transistor 90 varies. However, since the oxide semiconductor film 92a contains at least one of metal elements contained in the oxide semiconductor film 92b, an interface state is unlikely to be formed at the interface between the oxide semiconductor film 92b and the oxide semiconductor film 92a. Accordingly, the above structure can reduce variations in electrical characteristics of the transistor 90, such as the threshold voltage.

Further, it is preferable that a plurality of oxide semiconductor films be stacked so that an interface state due to an impurity existing between the oxide semiconductor films, which inhibits carrier flow, is not formed at an interface between the oxide semiconductor films. This is because when an impurity exists between the stacked oxide semiconductor films, the energy continuity of the conduction band minimum between the oxide semiconductor films is lost, and carriers are trapped or disappear by recombination in the vicinity of the interface. By reducing an impurity existing between the films, a continuous junction (here, in particular, a well structure having a U shape in which the conduction band minimum is changed continuously between the films) is formed easily as compared with the case of merely stacking the plurality of oxide semiconductor films which contain at least one common metal as a main component.

In order to form such a continuous junction, it is necessary to form films continuously without being exposed to air, with use of a multi-chamber deposition apparatus (sputtering apparatus) including a load lock chamber. Each chamber in the sputtering apparatus is preferably subjected to high vacuum evacuation (to a vacuum of about $5 \times 10^{-7}$ Pa to $1 \times 10^{-4}$ Pa) with use of a suction vacuum evacuation pump such as a cryopump so that water or the like, which is an impurity for an oxide semiconductor, is removed as much as possible. Alternatively, a turbo molecular pump and a cold trap are preferably used in combination to prevent backflow of gas into the chamber through an evacuation system.

To obtain a highly purified intrinsic oxide semiconductor, not only high vacuum evacuation of the chambers but also high purification of a gas used in the sputtering is important. When an oxygen gas or an argon gas used as the above gas has a dew point of −40° C. or lower, preferably −80° C. or lower, further preferably −100° C. or lower and is highly purified, moisture and the like can be prevented from entering the oxide semiconductor film as much as possible. Specifically, in the case where the oxide semiconductor film 92b is an In-M-Zn oxide film (M represents Ga, Y, Zr, La, Ce, or Nd) and a target having the atomic ratio of metal elements of In:M:Zn=$x_1$:$y_1$:$z_1$ is used for forming the oxide semiconductor film 92b, $x_1/y_1$ is preferably greater than or equal to ⅓ and less than or equal to 6, further preferably greater than or equal to 1 and less than or equal to 6, and $z_1/y_1$ is preferably greater than or equal to ⅓ and less than or equal to 6, further preferably greater than or equal to 1 and less than or equal to 6. Note that when $z_1/y_1$ is greater than or equal to 1 and less than or equal to 6, a c-axis aligned crystalline oxide semiconductor (CAAC-OS) film as the oxide semiconductor film 92b is easily formed. Typical examples of the atomic ratio of the metal elements of the target are In:M:Zn=1:1:1 and In:M:Zn=3:1:2.

Specifically, in the case where the oxide semiconductor film 92a and the oxide semiconductor film 92c are an In-M-Zn oxide film (M represents Ga, Y, Zr, La, Ce, or Nd) and a target having the atomic ratio of metal elements of In:M:Zn=$x_2$:$y_2$:$z_2$ is used for forming the oxide semiconductor films 92a and 92c, $x_2/y_2$ is preferably less than $x_1/y_1$, and $z_2/y_2$ is preferably greater than or equal to $\frac{1}{3}$ and less than or equal to 6, further preferably greater than or equal to 1 and less than or equal to 6. Note that when $z_2/y_2$ is greater than or equal to 1 and less than or equal to 6, CAAC-OS films are easily formed as the oxide semiconductor films 92a and 92c. Typical examples of the atomic ratio of the metal elements of the target are In:M:Zn=1:3:2, In:M:Zn=1:3:4, In:M:Zn=1:3:6, In:M:Zn=1:3:8, and the like.

The oxide semiconductor film 92a and the oxide semiconductor film 92c each have a thickness of more than or equal to 3 nm and less than or equal to 100 nm, preferably more than or equal to 3 nm and less than or equal to 50 nm. The thickness of the oxide semiconductor film 92b is more than or equal to 3 nm and less than or equal to 200 nm, preferably more than or equal to 3 nm and less than or equal to 100 nm, further preferably more than or equal to 3 nm and less than or equal to 50 nm.

In the three-layer semiconductor film, the three oxide semiconductor films 92a to 92c can be either amorphous or crystalline. Note that the oxide semiconductor film 92b in which a channel region is formed preferably has a crystalline structure, in which case the transistor 90 can have stable electrical characteristics.

Note that a channel formation region refers to a region of a semiconductor film of the transistor 90 that overlaps with a gate electrode and is between a source electrode and a drain electrode. A channel region refers to a region through which current mainly flows in the channel formation region.

For example, when an In—Ga—Zn oxide film formed by a sputtering method is used as each of the oxide semiconductor films 92a and 92c, the oxide semiconductor films 92a and 92c can be deposited with the use of an In—Ga—Zn oxide target containing In, Ga, and Zn in an atomic ratio of 1:3:2. The deposition conditions can be as follows: an argon gas (flow rate: 30 sccm) and an oxygen gas (flow rate: 15 sccm) are used as the deposition gas; the pressure is 0.4 Pa; the substrate temperature is 200° C.; and the DC power is 0.5 kW.

Further, when the oxide semiconductor film 92b is a CAAC-OS film, the oxide semiconductor film 92b is preferably deposited with the use of a polycrystalline In—Ga—Zn oxide target containing In, Ga, and Zn in an atomic ratio of 1:1:1. The deposition conditions can be as follows: an argon gas (flow rate: 30 sccm) and an oxygen gas (flow rate: 15 sccm) are used as the deposition gas; the pressure is 0.4 Pa; the substrate temperature is 300° C.; and the DC power is 0.5 kW.

Although the oxide semiconductor films 92a to 92c can be formed by a sputtering method, they may be formed by another method, e.g., a thermal CVD method. A metal organic chemical vapor deposition (MOCVD) method or an atomic layer deposition (ALD) method may be employed as an example of a thermal CVD method.

There are few carrier generation sources in a highly purified oxide semiconductor (purified oxide semiconductor) obtained by reduction of impurities such as moisture and hydrogen serving as electron donors (donors) and reduction of oxygen vacancies; therefore, the highly purified oxide semiconductor can be an intrinsic (i-type) semiconductor or a substantially i-type semiconductor. For this reason, a transistor having a channel formation region in a highly purified oxide semiconductor film has extremely small off-state current and high reliability. Thus, a transistor in which a channel formation region is formed in the oxide semiconductor film easily has an electrical characteristic of a positive threshold voltage (also referred to as a normally-off characteristic).

Specifically, various experiments can prove a small off-state current of a transistor having a channel formation region in a highly purified oxide semiconductor film. For example, even when an element has a channel width of $1\times10^6$ μm and a channel length of 10 μm, off-state current can be less than or equal to the measurement limit of a semiconductor parameter analyzer, i.e., less than or equal to $1\times10^{-13}$ A, at voltage (drain voltage) between the source electrode and the drain electrode of from 1 V to 10 V. In that case, it can be seen that off-state current of the transistor normalized on the channel width is lower than or equal to 100 zA/μm. In addition, a capacitor and a transistor were connected to each other and off-state current was measured using a circuit in which charges flowing to or from the capacitor are controlled by the transistor. In the measurement, a highly purified oxide semiconductor film was used for a channel formation region of the transistor, and the off-state current of the transistor was measured from a change in the amount of charges of the capacitor per unit time. As a result, it can be seen that, in the case where the voltage between the source electrode and the drain electrode of the transistor is 3 V, a lower off-state current of several tens of yoctoamperes per micrometer (yA/μm) is obtained. Accordingly, the transistor including a channel formation region in the highly purified oxide semiconductor film has much lower off-state current than a crystalline silicon transistor.

In the case where an oxide semiconductor film is used as the semiconductor film, at least indium (In) or zinc (Zn) is preferably included as an oxide semiconductor. In addition, as a stabilizer for reducing variations in electrical characteristics among transistors formed using such an oxide semiconductor, gallium (Ga) is preferably contained in addition to In and Zn. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

Among oxide semiconductors, unlike silicon carbide, gallium nitride, or gallium oxide, an In—Ga—Zn oxide, an In—Sn—Zn oxide, or the like has an advantage of high mass productivity because a transistor with favorable electrical characteristics can be formed by a sputtering method or a wet process. Further, unlike silicon carbide, gallium nitride, or gallium oxide, with the use of the In—Ga—Zn oxide, a transistor with favorable electrical characteristics can be formed over a glass substrate. Further, a larger substrate can be used.

As another stabilizer, one or more lanthanoids selected from lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor, any of the following oxides can be used, for example: indium oxide, gallium oxide, tin oxide, zinc oxide, an In—Zn oxide, an Sn—Zn oxide, an Al—Zn oxide, a Zn—Mg oxide, an Sn—Mg oxide, an In—Mg oxide, an In—Ga oxide, an In—Ga—Zn oxide (also referred to as IGZO), an In—Al—Zn oxide, an In—Sn—Zn oxide, an Sn—Ga—Zn oxide, an Al—Ga—Zn oxide, an Sn—Al—Zn oxide, an In—Hf—Zn oxide, an In—La—Zn oxide, an In—Pr—Zn oxide, an In—Nd—Zn oxide, an In—Ce—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, and an In—Hf—Al—Zn oxide.

For example, an In—Ga—Zn oxide refers to an oxide containing In, Ga, and Zn, and there is no limitation on the ratio of In to Ga and Zn. Further, the In—Ga—Zn oxide may contain a metal element other than In, Ga, and Zn. The In—Ga—Zn oxide has sufficiently high resistance when no electric field is applied thereto, so that off-state current can be sufficiently reduced. Moreover, the In—Ga—Zn oxide has high mobility.

For example, high mobility can be obtained relatively easily in the case of using an In—Sn—Zn oxide. Meanwhile, when an In—Ga—Zn oxide is used, the mobility can be increased by reducing the defect density in a bulk.

In the transistor 90, a metal in the source and drain electrodes might extract oxygen from the oxide semiconductor film depending on a conductive material used for the source and drain electrodes. In such a case, a region of the oxide semiconductor film in contact with the source electrode or the drain electrode becomes an n-type region due to the formation of an oxygen vacancy. The n-type region serves as a source region or a drain region, resulting in a decrease in the contact resistance between the oxide semiconductor film and the source electrode or the drain electrode. Accordingly, the formation of the n-type region increases the mobility and on-state current of the transistor 90, achieving the high-speed operation of a semiconductor device using the transistor 90.

Note that the extraction of oxygen by a metal in the source electrode and the drain electrode is probably caused when the source electrode and the drain electrode are formed by a sputtering method or when heat treatment is performed after the formation of the source electrode and the drain electrode. The n-type region is more likely to be formed by forming the source electrode and the drain electrode with use of a conductive material which is easily bonded to oxygen. Examples of such a conductive material include Al, Cr, Cu, Ta, Ti, Mo, and W.

Furthermore, in the case where the semiconductor film including the stacked oxide semiconductor films is used in the transistor 90, the n-type region preferably extends to the oxide semiconductor film 92b serving as a channel region in order that the mobility and on-state current of the transistor 90 can be further increased and the semiconductor device can operate at higher speed.

The insulating film 91 preferably has a function of supplying part of oxygen to the oxide semiconductor films 92a to 92c by heating. It is preferable that the number of defects in the insulating film 91 be small, and typically the spin density of g=2.001 due to a dangling bond of silicon be lower than or equal to $1 \times 10^{18}$ spins/cm$^3$. The spin density is measured by electron spin resonance (ESR) spectroscopy.

The insulating film 91, which has a function of supplying part of oxygen to the oxide semiconductor films 92a to 92c by heating, is preferably an oxide. Examples of the oxide include aluminum oxide, magnesium oxide, silicon oxide, silicon oxynitride, silicon nitride oxide, gallium oxide, germanium oxide, yttrium oxide, zirconium oxide, lanthanum oxide, neodymium oxide, hafnium oxide, and tantalum oxide. The insulating film 91 can be formed by a plasma CVD (chemical vapor deposition) method, a sputtering method, or the like.

Note that in this specification, oxynitride contains more oxygen than nitrogen, and nitride oxide contains more nitrogen than oxygen.

Note that in the transistor 90 illustrated in FIGS. 19A to 19C or FIGS. 20A to 20C, the conductive film 96 overlaps with end portions of the oxide semiconductor film 92b including a channel region that do not overlap with the conductive films 93 and 94, i.e., end portions of the oxide semiconductor film 92b that are in a region different from a region where the conductive films 93 and 94 are located. When the end portions of the oxide semiconductor film 92b are exposed to plasma by etching for forming the end portions, a chlorine radical, a fluorine radical, or other radicals generated from an etching gas are easily bonded to a metal element contained in an oxide semiconductor. For this reason, it can be considered that, in the end portions of the oxide semiconductor film, oxygen bonded to the metal element is easily released, so that an oxygen vacancy is easily formed; thus, the end portions of the oxide semiconductor film easily have n-type conductivity. However, an electric field applied to the end portions can be controlled by controlling the potential of the conductive film 96 because the end portions of the oxide semiconductor film 92b that do not overlap with the conductive films 93 and 94 overlap with the conductive film 96 in the transistor 90 illustrated in FIGS. 19A to 19C or FIGS. 20A to 20C. Consequently, current that flows between the conductive films 93 and 94 through the end portions of the oxide semiconductor film 92b can be controlled by the potential applied to the conductive film 96. Such a structure of the transistor 90 is referred to as a surrounded channel (s-channel) structure.

With the s-channel structure, specifically, when a potential at which the transistor 90 is turned off is supplied to the conductive film 96, the amount of off-state current that flows between the conductive films 93 and 94 through the end portions can be reduced. For this reason, in the transistor 90, even when the distance between the conductive films 93 and 94 at the end portions of the oxide semiconductor film 92b is reduced as a result of reducing the channel length to obtain high on-state current, the transistor 90 can have low off-state current. Consequently, with the short channel length, the transistor 90 can have high on-state current when in an on state and low off-state current when in an off state.

With the s-channel structure, specifically, when a potential at which the transistor 90 is turned on is supplied to the conductive film 96, the amount of current that flows between the conductive films 93 and 94 through the end portions of the oxide semiconductor film 92b can be increased. The current contributes to an increase in the field-effect mobility and an increase in the on-state current of the transistor 90. When the end portions of the oxide semiconductor film 92b overlap with the conductive film 96, carriers flow in a wide region of the oxide semiconductor film 92b without being limited to a region in the vicinity of the interface between the oxide semiconductor film 92b and the insulating film 95, which results in an increase in the amount of carrier movement in the transistor 90. As a result, the on-state current of the transistor 90 is increased, and the field-effect mobility is increased to greater than or equal to 10 cm$^2$/V·s or to greater than or equal to 20 cm$^2$/V·s, for example. Note that here, the field-effect mobility is not an approximate value of the mobility as the physical property of the oxide semiconductor film but is the apparent field-effect mobility in a saturation region of the transistor, which is an index of current drive capability.

A structure of an oxide semiconductor film is described below.

An oxide semiconductor film is classified roughly into a single crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a CAAC-OS film, and the like.

The amorphous oxide semiconductor film has disordered atomic arrangement and no crystalline component. A typical example thereof is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor film. In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to a TEM image of the CAAC-OS film observed in a direction substantially parallel to a sample surface (cross-sectional TEM image), metal atoms are arranged in a layered manner in the crystal parts. Each metal atom layer has a morphology reflecting unevenness of a surface where the CAAC-OS film is formed (hereinafter, a surface where the CAAC-OS film is formed is also referred to as a formation surface) or a top surface of the CAAC-OS film, and is arranged parallel to the formation surface or the top surface of the CAAC-OS film.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "perpendicular" indicates that the angle formed between two straight lines is greater than or equal to 80° and less than or equal to 100°, and accordingly also includes the case where the angle is greater than or equal to 85° and less than or equal to 95°.

On the other hand, according to a TEM image of the CAAC-OS film observed in a direction substantially perpendicular to the sample surface (plan-view TEM image), metal atoms are arranged in a triangular or hexagonal configuration in the crystal parts. However, there is no regularity of arrangement of metal atoms between different crystal parts.

From the results of the cross-sectional TEM image and the plan-view TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle ($2\theta$) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray beam is incident on a sample in a direction substantially perpendicular to the c-axis, a peak appears frequently when $2\theta$ is around 56°. This peak is derived from the (110) plane of the $InGaZnO_4$ crystal. Here, analysis ($\varphi$ scan) is performed under conditions where the sample is rotated around a normal vector of a sample surface as an axis ($\varphi$ axis) with $2\theta$ fixed at around 56°. In the case where the sample is a single crystal oxide semiconductor film of $InGaZnO_4$, six peaks appear. The six peaks are derived from crystal planes equivalent to the (110) plane. On the other hand, in the case of a CAAC-OS film, a peak is not clearly observed even when $\varphi$ scan is performed with $2\theta$ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface of the CAAC-OS film. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added may be changed, and the degree of crystallinity in the CAAC-OS film might vary depending on regions.

Note that when the CAAC-OS film with an $InGaZnO_4$ crystal is analyzed by an out-of-plane method, a peak may also be observed when $2\theta$ is around 36°, in addition to the peak at $2\theta$ of around 31°. The peak at $2\theta$ of around 36° indicates that a crystal having no c-axis alignment is included in part of the CAAC-OS film. It is preferable that in the CAAC-OS film, a peak appear when $2\theta$ is around 31° and that a peak not appear when $2\theta$ is around 36°.

With the use of the CAAC-OS film in a transistor, variation in the electrical characteristics of the transistor due to irradiation with visible light or ultraviolet light is small. Thus, the transistor has high reliability.

Note that an oxide semiconductor film may be a stacked film including two or more kinds of an amorphous oxide semiconductor film, a microcrystalline oxide semiconductor film, and a CAAC-OS film, for example.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in a treatment chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like or pellet-like sputtered particle reaches the substrate, migration occurs on the substrate surface, so that a flat plane of the sputtered particle is attached to the substrate.

Furthermore, preferably, the proportion of oxygen in the deposition gas is increased and the power is optimized in order to reduce plasma damage at the deposition. The proportion of oxygen in the deposition gas is 30 vol % or higher, preferably 100 vol %.

As an example of the target, an In—Ga—Zn oxide target is described below.

The In—Ga—Zn oxide target, which is polycrystalline, is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y, and Z are given positive numbers. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powders and the molar ratio for mixing powders may be determined as appropriate depending on the desired target.

An alkali metal is not an element included in an oxide semiconductor and thus is an impurity. Likewise, an alkaline earth metal is an impurity when the alkaline earth metal is not a component of the oxide semiconductor. When an insulating film in contact with an oxide semiconductor film is an oxide, Na, among the alkali metals, diffuses into the insulating film and becomes $Na^+$. Further, in the oxide semiconductor film, Na cuts or enters a bond between metal and oxygen which are components of the oxide semiconductor. As a result, the electrical characteristics of the transistor deteriorate; for example, the transistor is placed in a normally-on state due to a negative shift of the threshold voltage or the mobility is decreased. In addition, the characteristics of transistors vary. Specifically, the measurement value of a Na concentration by secondary ion mass spectrometry is preferably $5\times10^{16}/cm^3$ or lower, further preferably $1\times10^{16}/cm^3$ or lower, still further preferably $1\times10^{15}/cm^3$ or lower. Similarly, the measurement value of a Li concentration is preferably $5\times10^{15}/cm^3$ or lower, further preferably $1\times10^{15}/cm^3$ or lower. Similarly, the measurement value of a K concentration is preferably $5\times10^{15}/cm^3$ or lower, further preferably $1\times10^{15}/cm^3$ or lower.

When metal oxide containing indium is used, silicon or carbon having higher bond energy with oxygen than indium might cut the bond between indium and oxygen, so that an oxygen vacancy may be formed. Accordingly, when silicon or carbon is contained in the oxide semiconductor film, the electrical characteristics of the transistor are likely to deteriorate as in the case of using an alkali metal or an alkaline earth metal. Thus, the concentrations of silicon and carbon in the oxide semiconductor film are preferably low. Specifically, the carbon concentration or the silicon concentration measured by secondary ion mass spectrometry is $1\times10^{18}/cm^3$ or lower. In this case, the deterioration of the electrical characteristics of the transistor can be prevented, so that the reliability of a semiconductor device can be improved.

<Example of Cross-Sectional Structure of Semiconductor Device>

Figure 21:
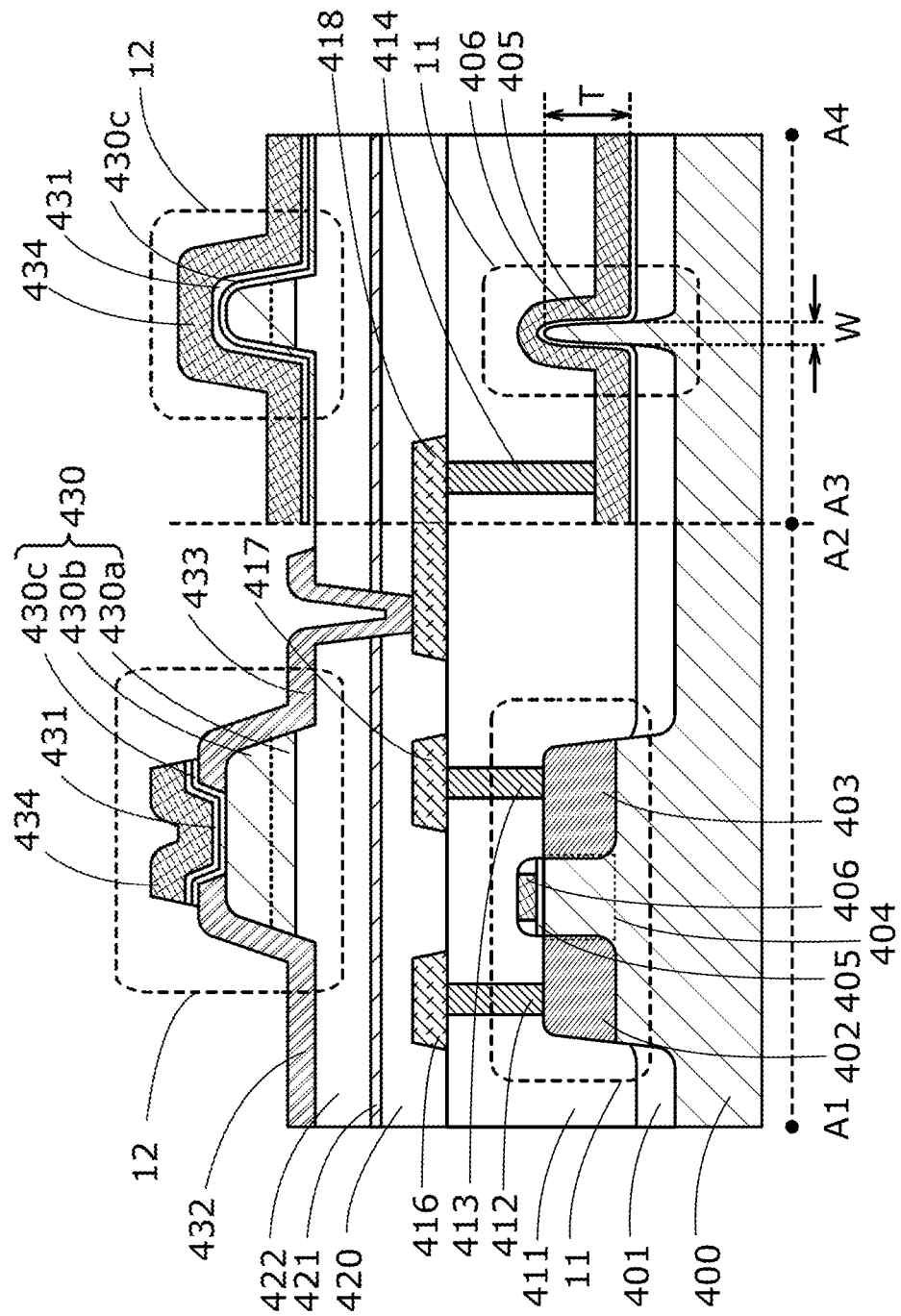
FIG. 21 illustrates a cross-sectional structure of a semiconductor device.

FIG. 21 illustrates an example of a cross-sectional structure of a semiconductor device including the circuit 13 in FIG. 1. A region along dashed line A1-A2 shows a structure of the transistors 11 and 12 in the channel length direction, and a region along dashed line A3-A4 shows a structure of the transistors 11 and 12 in the channel width direction. Note that in one embodiment of the present invention, the channel length direction of the transistor 11 is not necessarily aligned with the channel length direction of the transistor 12.

The channel length direction refers to a direction in which a carrier moves between a pair of impurity regions functioning as a source region and a drain region by the most direct way, and the channel width direction refers to a direction perpendicular to the channel length direction in a plane parallel to a substrate.

In FIG. 21, the transistor 12 including a channel formation region in an oxide semiconductor film is formed over the transistor 11 including a channel formation region in a single crystal silicon substrate.

The transistor 11 may include the channel formation region in a semiconductor film or a semiconductor substrate of silicon, germanium, or the like in an amorphous, microcrystalline, polycrystalline, or single crystal state. Alternatively, the transistor 11 may include the channel formation region in an oxide semiconductor film or an oxide semiconductor substrate. In the case where the transistors each include a channel formation region in an oxide semiconductor film or an oxide semiconductor substrate, the transistor 12 is not necessarily stacked over the transistor 11, and the transistors 12 and 11 may be formed in the same layer.

In the case where the transistor 11 is formed using a thin silicon film, any of the following can be used in the thin film: amorphous silicon formed by a sputtering method or a vapor phase growth method such as a plasma-enhanced CVD method; polycrystalline silicon obtained by crystallization of amorphous silicon by treatment such as laser annealing; single crystal silicon obtained by separation of a surface portion of a single crystal silicon wafer by implantation of hydrogen ions or the like into the silicon wafer; and the like.

A substrate 400 where the transistor 11 is formed can be, for example, a silicon substrate, a germanium substrate, or a silicon germanium substrate. In FIG. 21, a single crystal silicon substrate is used as the substrate 400.

The transistor 11 is electrically isolated by an element isolation method. As the element isolation method, a trench isolation method (a shallow trench isolation (STI) method) or the like can be used. FIG. 21 illustrates an example where the trench isolation method is used to electrically isolate the transistor 11. Specifically, in FIG. 21, the transistor 11 is electrically isolated by element isolation using an element isolation region 401 formed in such a manner that an insulator including silicon oxide or the like is buried in a trench formed in the substrate 400 by etching or the like and then the insulator is removed partly by etching or the like.

In a projection of the substrate 400 that exists in a region other than the trench, an impurity region 402 and an impurity region 403 of the transistor 11 and a channel formation region 404 placed between the impurity regions 402 and 403 are provided. Further, the transistor 11 includes an insulating film 405 covering the channel formation region 404 and a gate electrode 406 that overlaps with the channel formation region 404 with the insulating film 405 provided therebetween.

In the transistor 11, a side portion and an upper portion of the projection in the channel formation region 404 overlap with the gate electrode 406 with the insulating film 405 positioned therebetween, so that carriers flow in a wide area including the side portion and the upper portion of the channel formation region 404. Therefore, an area over the substrate occupied by the transistor 11 can be reduced, and the number of transferred carriers in the transistor 11 can be increased. As a result, the on-state current and field-effect mobility of the transistor 11 are increased. Suppose the length in the channel width direction (channel width) of the projection in the channel formation region 404 is W, and the thickness of the projection in the channel formation region 404 is T. When the aspect ratio of the thickness T to the channel width W is high, a region where carriers flow becomes larger. Thus, the on-state current of the transistor 11 can be further increased and the field-effect mobility of the transistor 11 can be further increased.

Note that when the transistor 11 is formed using a bulk semiconductor substrate, the aspect ratio is preferably 0.5 or more, further preferably 1 or more.

An insulating film 411 is provided over the transistor 11. Openings are formed in the insulating film 411. Conductive films 412 and 413 that are electrically connected to the impurity regions 402 and 403, respectively, and a conductive film 414 that is electrically connected to the gate electrode 406 are formed in the openings.

The conductive film 412 is electrically connected to a conductive film 416 formed over the insulating film 411. The conductive film 413 is electrically connected to a conductive film 417 formed over the insulating film 411. The conductive film 414 is electrically connected to a conductive film 418 formed over the insulating film 411.

An insulating film 420 is provided over the conductive films 416 to 418. An insulating film 421 having a blocking effect of preventing diffusion of oxygen, hydrogen, and water is provided over the insulating film 420. As the insulating film 421 has higher density and becomes denser or has a fewer dangling bonds and becomes more chemically stable, the insulating film 421 has a higher blocking effect. The insulating film 421 that has the effect of blocking diffusion of oxygen, hydrogen, and water can be formed using, for example, aluminum oxide, aluminum oxynitride, gallium oxide, gallium oxynitride, yttrium oxide, yttrium oxynitride, hafnium oxide, or hafnium oxynitride. The insulating film 421 having an effect of blocking diffusion of hydrogen and water can be formed using, for example, silicon nitride or silicon nitride oxide.

An insulating film 422 is provided over the insulating film 421, and the transistor 12 is provided over the insulating film 422.

The transistor 12 includes, over the insulating film 422, a semiconductor film 430 including an oxide semiconductor, conductive films 432 and 433 functioning as source and drain electrodes and electrically connected to the semiconductor film 430, a gate insulating film 431 covering the semiconductor film 430, and a gate electrode 434 overlapping with the semiconductor film 430 with the gate insulating film 431 positioned therebetween. Note that an opening is formed in the insulating films 420 to 422. The conductive film 433 is connected to the conductive film 418 in the opening.

Note that in FIG. 21, the transistor 12 includes at least the gate electrode 434 on one side of the semiconductor film 430, and may further include a gate electrode overlapping with the semiconductor film 430 with the insulating film 422 positioned therebetween.

In the case where the transistor 12 has a pair of gate electrodes, one of the gate electrodes may be supplied with a signal for controlling the on/off state, and the other of the gate electrodes may be supplied with a potential from another element. In this case, potentials with the same level may be supplied to the pair of gate electrodes, or a fixed potential such as the ground potential may be supplied only to the other of the gate electrodes. By controlling the level of a potential supplied to the other of the gate electrodes, the threshold voltage of the transistor can be controlled.

In FIG. 21, the transistor 12 has a single-gate structure where one channel formation region corresponding to one gate electrode 434 is provided. However, the transistor 12 may have a multi-gate structure where a plurality of electrically connected gate electrodes are provided so that a plurality of channel formation regions are included in one active layer.

FIG. 21 illustrates an example in which the semiconductor film 430 included in the transistor 12 includes oxide semiconductor films 430a to 430c that are stacked in this order over the insulating film 422. Note that in one embodiment of the present invention, the semiconductor film 430 of the transistor 12 may be formed using a single-layer metal oxide film.

<Examples of Electronic Device>

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are cellular phones, game machines including portable game machines, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and medical devices. FIGS. 22A to 22F illustrate specific examples of these electronic devices.

Figure 22A:
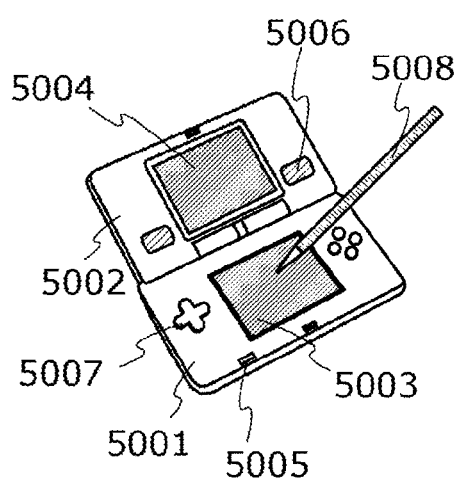
FIGS. 22A to 22F illustrate electronic devices.

FIG. 22A illustrates a portable game machine, which includes a housing 5001, a housing 5002, a display portion 5003, a display portion 5004, a microphone 5005, a speaker 5006, an operation key 5007, a stylus 5008, and the like. The semiconductor device of one embodiment of the present invention can be used for a variety of integrated circuits included in portable game machines. Although the portable game machine in FIG. 22A has the two display portions 5003 and 5004, the number of display portions included in a portable game machine is not limited to this.

Figure 22B:
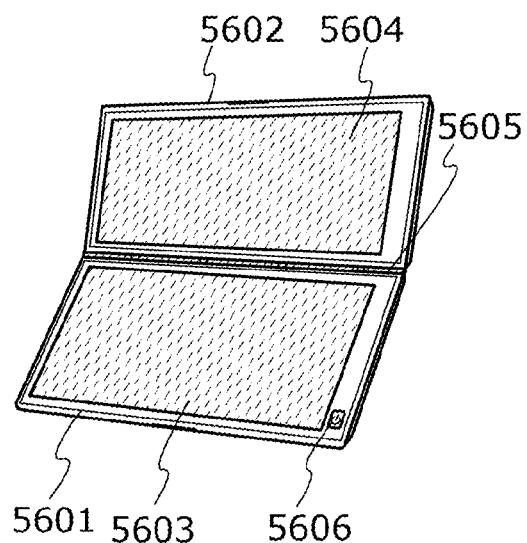

FIG. 22B illustrates a portable information terminal including a first housing 5601, a second housing 5602, a first display portion 5603, a second display portion 5604, a joint 5605, an operation key 5606, and the like. The semiconductor device of one embodiment of the present invention can be used for a variety of integrated circuits included in portable information terminals. The first display portion 5603 is provided in the first housing 5601, and the second display portion 5604 is provided in the second housing 5602. The first housing 5601 and the second housing 5602 are connected to each other with the joint 5605, and the angle between the first housing 5601 and the second housing 5602 can be changed with the joint 5605. Images displayed on the first display portion 5603 may be switched in accordance with the angle at the joint 5605 between the first housing 5601 and the second housing 5602. A display device with a position input function may be used as at least one of the first display portion 5603 and the second display portion 5604. Note that the position input function can be added by providing a touch panel in a display device. Alternatively, the position input function can be added by provision of a photoelectric conversion element called a photosensor in a pixel portion of a display device.

Figure 22C:
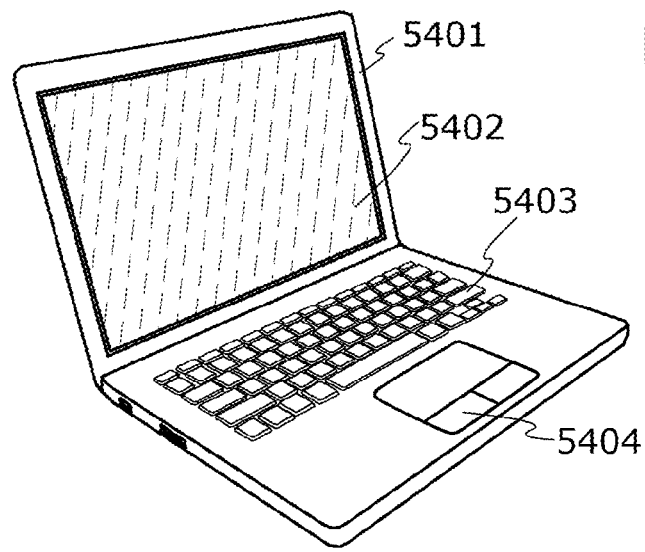

FIG. 22C illustrates a notebook type personal computer including a housing 5401, a display portion 5402, a keyboard 5403, a pointing device 5404, and the like. The semiconductor device of one embodiment of the present invention can be used for a variety of integrated circuits included in notebook type personal computers.

Figure 22D:
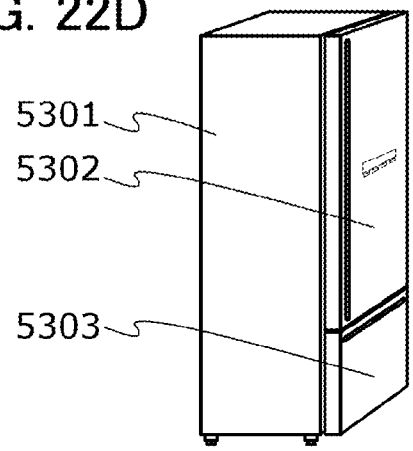

FIG. 22D illustrates an electric refrigerator-freezer including a housing 5301, a refrigerator door 5302, a freezer door 5303, and the like. The semiconductor device of one embodiment of the present invention can be used for a variety of integrated circuits included in electric refrigerator-freezers.

Figure 22E:
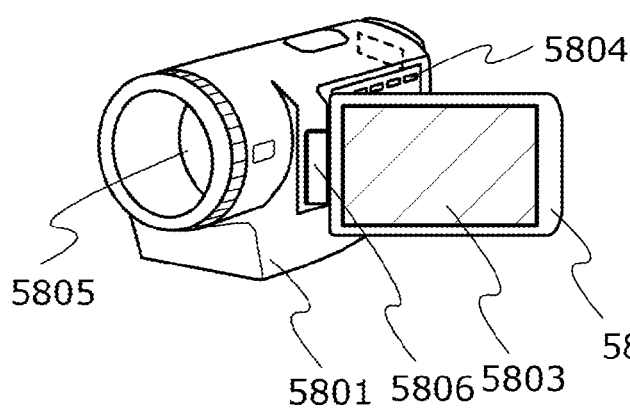

FIG. 22E illustrates a video camera including a first housing 5801, a second housing 5802, a display portion 5803, operation keys 5804, a lens 5805, a joint 5806, and the like. The semiconductor device of one embodiment of the present invention can be used for a variety of integrated circuits included in video cameras. The operation keys 5804 and the lens 5805 are provided in the first housing 5801, and the display portion 5803 is provided in the second housing 5802. The first housing 5801 and the second housing 5802 are connected to each other with the joint 5806, and the angle between the first housing 5801 and the second housing 5802 can be changed with the joint 5806. Images displayed on the display portion 5803 may be switched in accordance with the angle at the joint 5806 between the first housing 5801 and the second housing 5802.

Figure 22F:
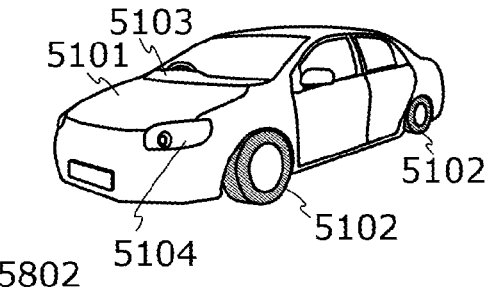

FIG. 22F illustrates a passenger car including a car body 5101, wheels 5102, a dashboard 5103, lights 5104, and the like. The semiconductor device of one embodiment of the present invention can be used for a variety of integrated circuits included in passenger cars.

Example 1

A ring oscillator 802 with a 101-stage circuit 801 in which inverters 800 and the circuits 13 each including the transistor 11, the transistor 12, and a capacitor 810 were used was fabricated, and the operating frequency of the transistor 11 in the circuit 13 was measured from the frequency of an output signal OUT from the ring oscillator 802.

Note that two types of ring oscillators 802 with different configurations of the circuit 13 were used for the frequency measurement. One type of ring oscillator 802 includes a circuit 13(CAAC-OS PSW) illustrated in FIG. 23A, which includes a transistor 11(Si) in which a channel formation region is formed in a silicon film, a transistor 12(OS) in which a channel formation region is formed in a CAAC-OS film, and the capacitor 810. In the circuit 13(CAAC-OS PSW), the transistor 12(OS) has a channel length L of 1 µm and a channel width W of 4 µm. The transistor 11(Si) is an n-channel transistor having a channel length L of 0.5 µm and a channel width W of 16 µm.

Figure 23A:
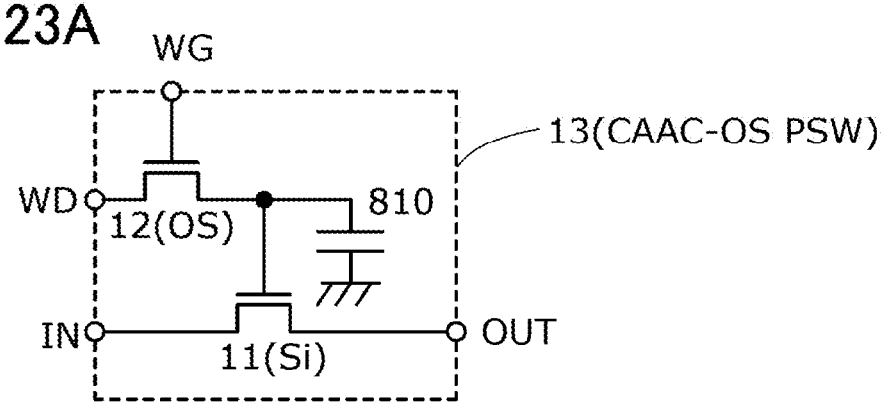
FIGS. 23A to 23C illustrate structures of a circuit 13 and a ring oscillator.
Figure 23B:
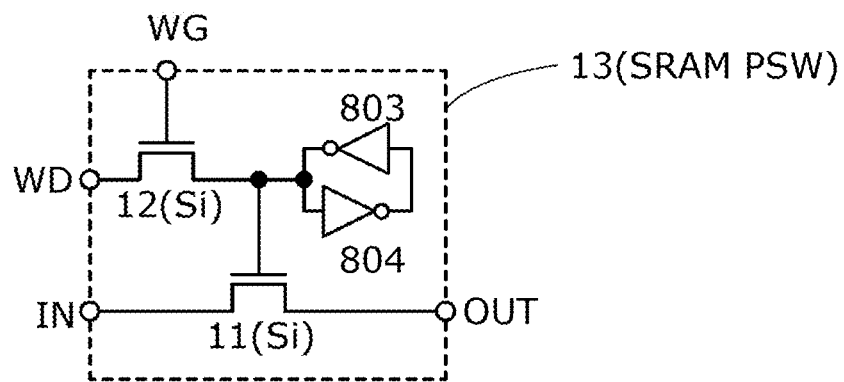

The other type of ring oscillator 802 includes a circuit 13(SRAM PSW) illustrated in FIG. 23B, which includes the transistor 11(Si) in which a channel formation region is formed in a silicon film, a transistor 12(Si) in which a channel formation region is formed in a Si film, and an SRAM which is electrically connected to a gate of the transistor 11(Si). In the circuit 13(SRAM PSW), the transistor 12(Si) is an n-channel transistor having a channel length L of 0.5 µm and a channel width W of 8 µm. The transistor 11(Si) is an n-channel transistor having a channel length L of 0.5 µm and a channel width W of 16 µm.

Note that the circuit 13(SRAM PSW) in FIG. 23B includes, as the SRAM, inverters 803 and 804 to each of which an output signal of the other is supplied as an input signal. As the inverters 803 and 804, n-channel and p-channel transistors in each of which a channel formation region is formed in a Si film were used. The n-channel transistors each have a channel length L of 0.5 µm and a channel width W of 16 µm. The p-channel transistors each have a channel length L of 0.5 µm and a channel width W of 32 µm.

Figure 23C:
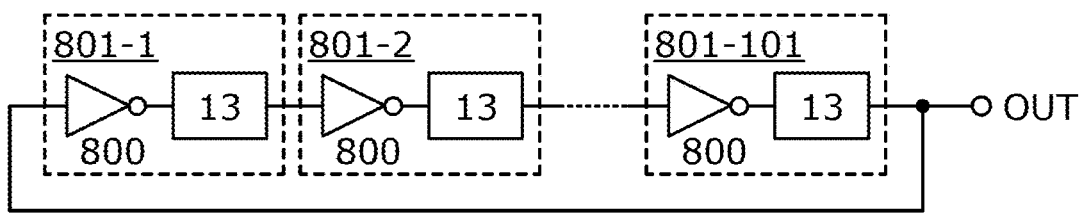

FIG. 23C illustrates a circuit configuration of the fabricated ring oscillator 802. As illustrated in FIG. 23C, the ring oscillator 802 includes a 101-stage circuit (circuits 801-1 to 801-101) which is electrically connected in a ring configuration such that an output of one stage serves as an input of the subsequent stage. Then, the frequency of a potential output from the circuit 801-101 was measured as an output signal OUT.

Figure 24:
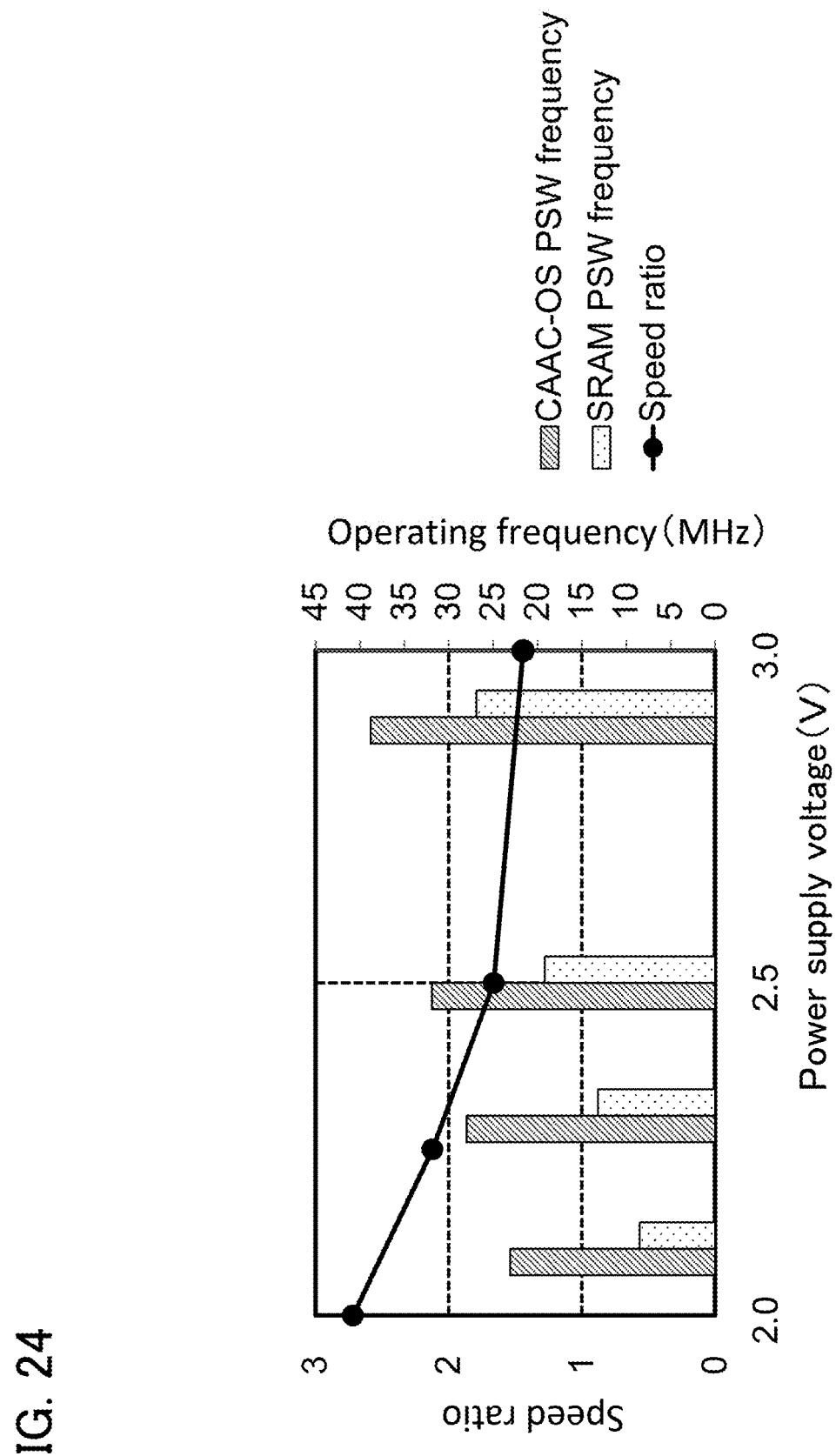
FIG. 24 shows a relationship between a power supply voltage supplied to a ring oscillator and an operating frequency of a transistor 11 included in a circuit 13, which is obtained by measurement.

FIG. 24 shows a relationship between a power supply voltage (V) supplied to the ring oscillator 802 and the operating frequency (MHz) of the transistor 11 in one circuit 13, which is obtained by the measurement. In addition, FIG. 24 shows the ratio of the operating frequency of the transistor 11 in the circuit 13(SRAM PSW) to the operating frequency of the transistor 11 in the circuit 13(CAAC-OS PSW), as a speed ratio. It can be seen from FIG. 24 that the operating frequency of the ring oscillator 802 with the circuit 13(CAAC-OS PSW) is higher than that of the ring oscillator 802 with the circuit 13(SRAM PSW) when the same power supply voltage is supplied.

Next, a prototype FPGA fabricated using the circuit 13(CAAC-OS PSW) will be described.

Figure 25:
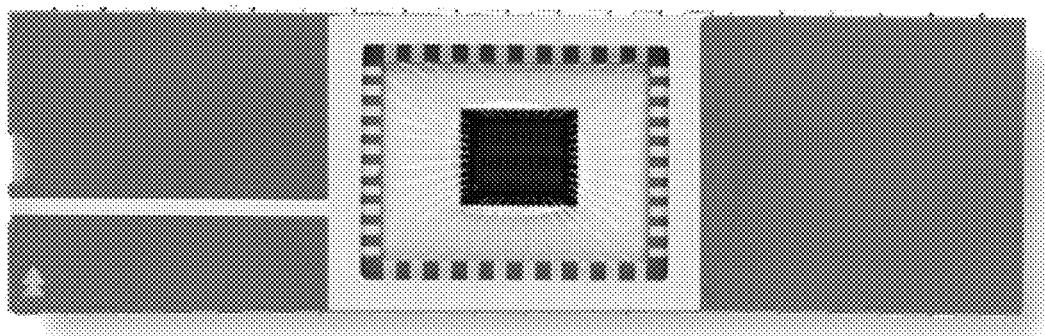
FIG. 25 is a photograph of a prototype chip including an FPGA.
Figure 26:
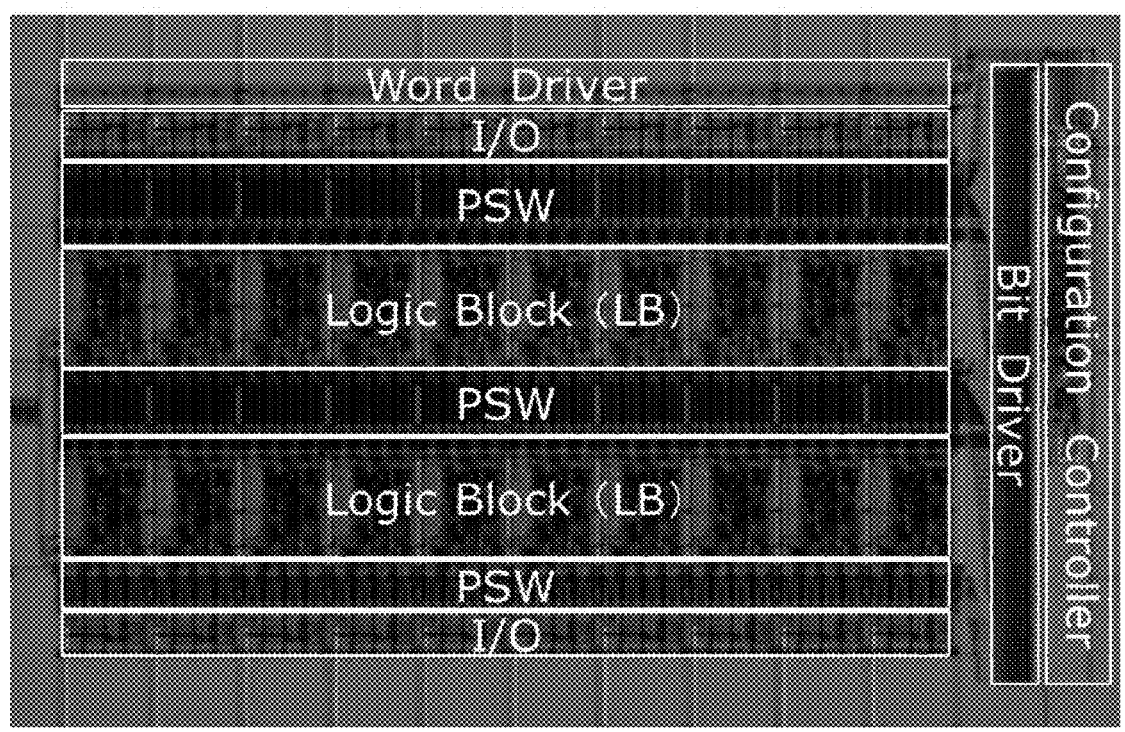
FIG. 26 is an enlarged photograph of the prototype chip.

FIG. 25 shows a photograph of a chip including the prototype FPGA. FIG. 26 shows an enlarged photograph of the chip in FIG. 25. Table 1 given below shows specifications of the prototype FPGA.

TABLE 1

| | | |
|---|---|---|
| Core size | 2.6 × 4.4 mm | |
| Number of LBs | 20 | |
| Number of user I/Os | 20 | |
| Number of configuration memories | 7,520 bits | |
| Look-up table inputs | 4 | |
| Power supply voltage | 2.5-3.3 V | |
| Channel length | CMOS | 0.5 µm |
| | CAAC-IGZO | 1.0 µm |
| Number of transistors | CMOS | 9,040 |
| | CAAC-IGZO | 45,411 |

Figure 27:
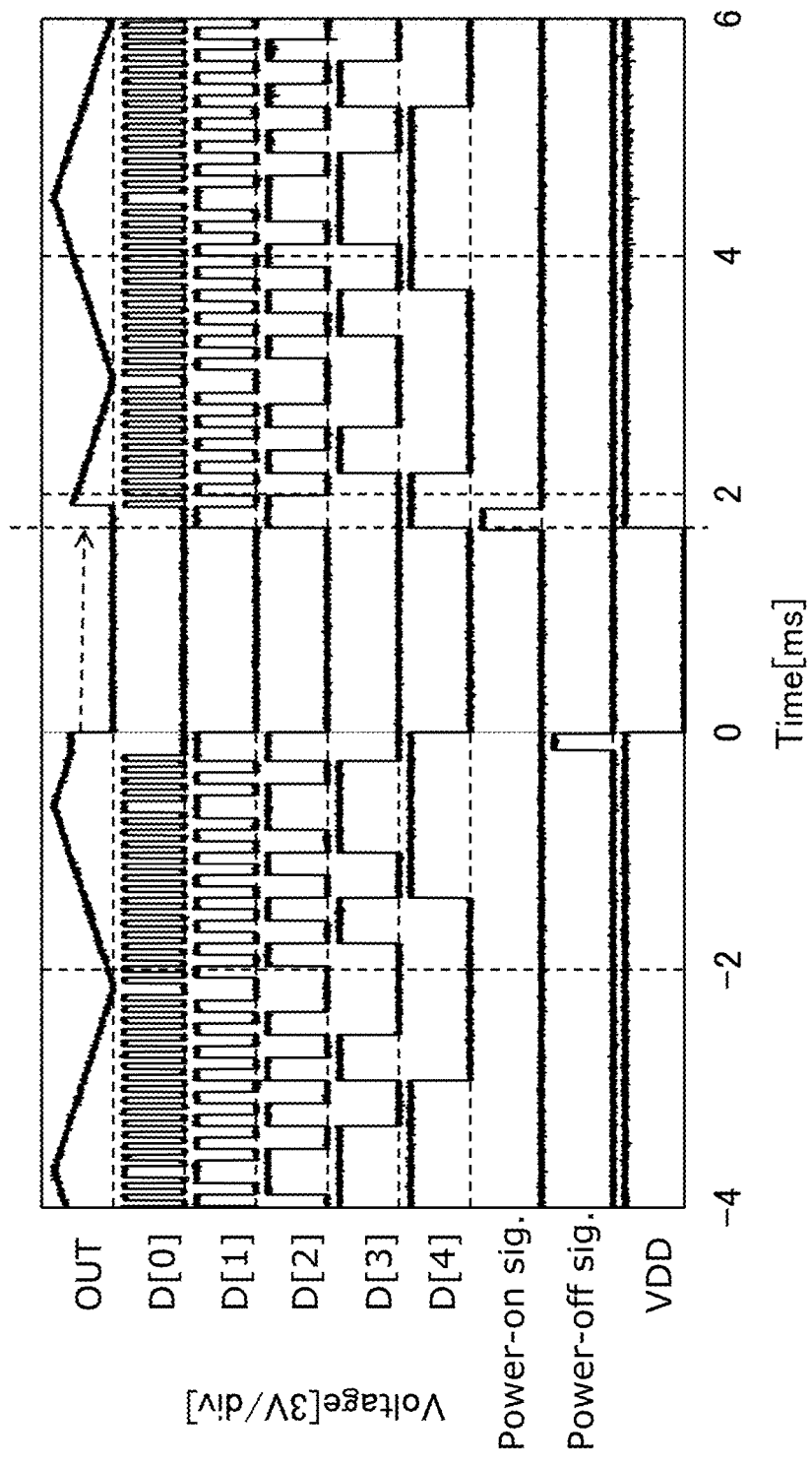
FIG. 27 is a timing chart used for an operation of a prototype FPGA.

FIG. 27 shows a timing chart used for operation of the prototype FPGA. Note that the supply of power supply voltage to the FPGA is stopped in a period indicated by a dashed arrow in the timing chart in FIG. 27. In the prototype FPGA, data including circuit information is stored in a memory circuit without being lost. Therefore, the circuit configuration of the FPGA is maintained without rewriting of the circuit information of the FPGA to the memory circuit after restart of the supply of the power supply voltage, and the same operation as before the stop of the supply of the power supply voltage can be performed.

Figure 28:
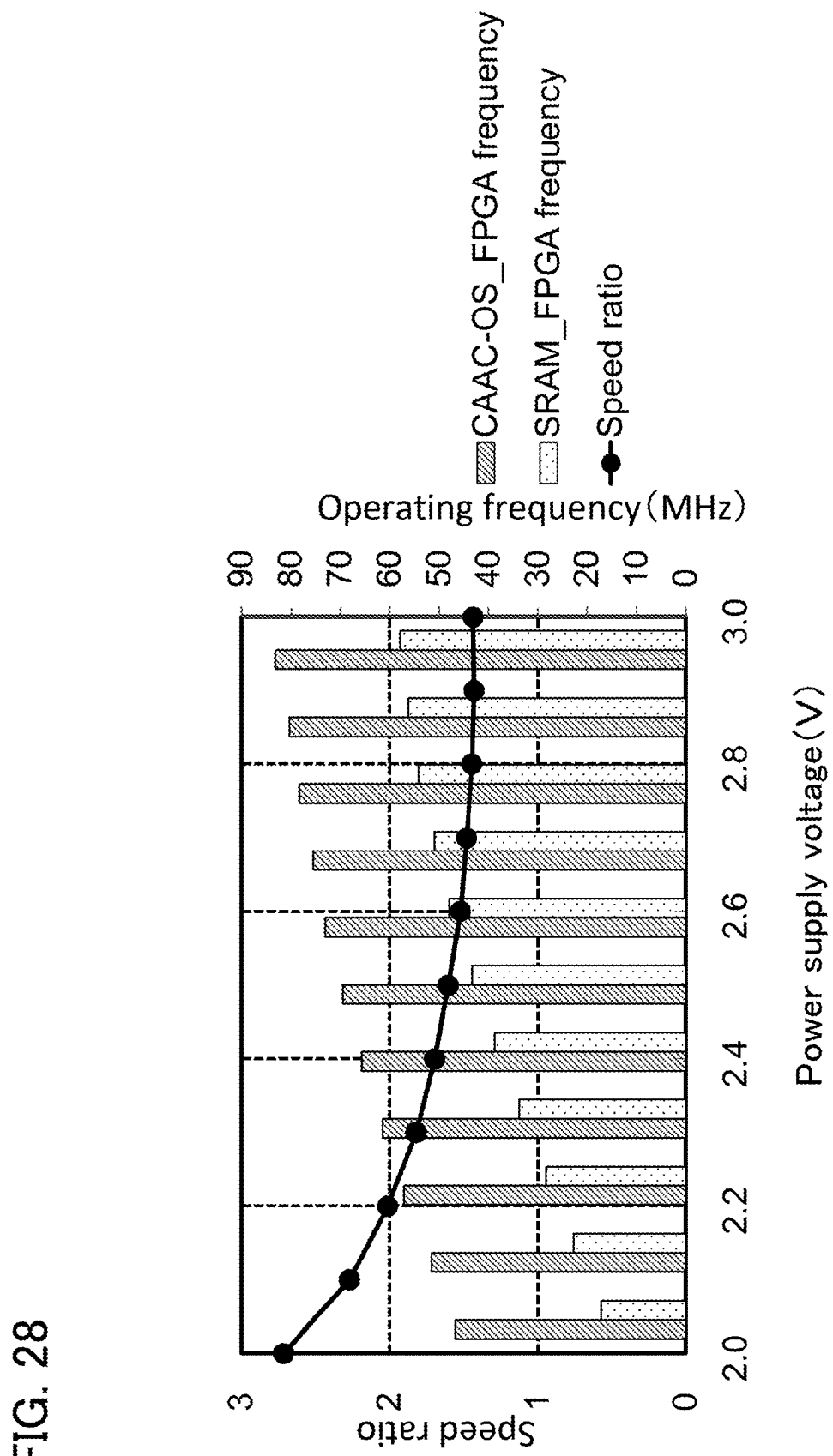
FIG. 28 shows a relationship between a power supply voltage supplied to an FPGA and an operating frequency of the FPGA, which is obtained by measurement.

Next, a description is made of measurement results of the operating frequency (MHz) of an FPGA in which the circuit 13(CAAC-OS PSW) in FIG. 23A is used as a switch for controlling a connection between logic blocks and the operating frequency (MHz) of an FPGA in which the circuit 13(SRAM PSW) in FIG. 23B is used as a switch for controlling a connection between logic blocks. FIG. 28 shows a relationship between a power supply voltage (V) supplied to each FPGA and the operating frequency (MHz) of each FPGA, which is obtained by measurement. In addition, FIG. 28 shows the ratio of the operating frequency of the FPGA with the circuit 13(SRAM PSW) to the operating frequency of the FPGA with the circuit 13(CAAC-OS PSW), as a speed ratio. It can be seen from FIG. 28 that the operating frequency of the FPGA with the circuit 13(CAAC-OS PSW) is higher than that of the FPGA with the circuit 13(SRAM PSW) when the same power supply voltage is supplied.

In the FPGA in which the circuit 13(CAAC-OS PSW) in FIG. 23A was used as a switch for controlling a connection between logic blocks and also as a memory circuit for storing circuit information, power consumptions (μW) of each logic block (LB) without power gating (at the time of non-PG) and with power gating (at the time of PG) were calculated from a measured value of power consumption of the whole FPGA.

Specifically, the power consumptions were calculated as follows. First, the power consumption of the whole FPGA was measured under the same operating conditions at the time of non-PG and at the time of PG. Next, the proportion of the power consumption of each logic block (LB) in the power consumption of the whole FPGA was calculated using SPICE simulation. Then, the power consumption of each logic block (LB) was calculated using the measured power consumption of the whole FPGA and the above-described proportion calculated by SPICE simulation.

Figure 29:
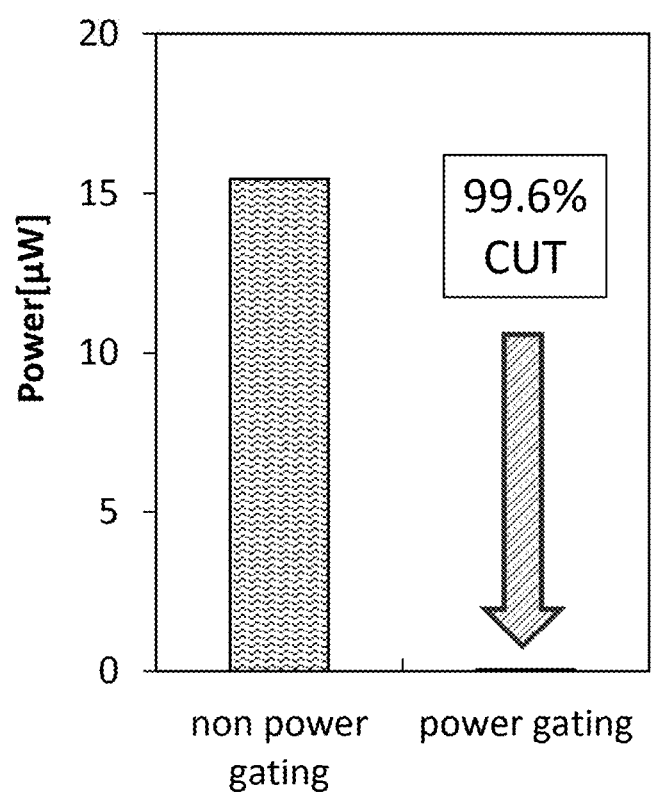
FIG. 29 shows calculated values of power consumption of each logic block.

FIG. 29 shows calculated values of the power consumption of each logic block (LB). It can be seen from FIG. 29 that the power consumption is reduced by 99.6% at the time of power gating (PG).

EXPLANATION OF REFERENCE

10: semiconductor device, 11: transistor, 12: transistor, 13: circuit, 13a: circuit, 13b: circuit, 13c: circuit, 13d: circuit, 13e: circuit, 13f: circuit, 14: circuit, 20: transistor, 21: transistor, 22: circuit, 22-1: circuit, 22-2: circuit, 30: D-FF, 31: XOR circuit, 32: inverter, 33: LS, 33a: LS, 33b: LS, 34: transistor, 35: transistor, 36: transistor, 37: transistor, 38: inverter, 40: PLD, 41: logic block, 42: wiring, 43: LUT, 44: flip-flop, 45: input terminal, 46: output terminal, 47: AND circuit, 48: multiplexer, 49: memory circuit, 50: multiplexer, 51: memory circuit, 52: terminal, 60: memory circuit, 61: circuit, 62: circuit, 62a: circuit, 62b: circuit, 63: multiplexer, 64: transistor, 65: transistor, 66: transistor, 67: transistor, 68: capacitor, 69: capacitor, 70: wiring, 71: wiring, 72: wiring, 75: MUX, 76: wiring, 76a: wiring, 76b: wiring, 76d: wiring, 77: wiring, 77a: wiring, 78: inverter, 78a: inverter, 78b: inverter, 79: wiring, 79a: wiring, 79b: wiring, 80: PLD, 81a: switch circuit, 81b: switch circuit, 81c: switch circuit, 81d: switch circuit, 90: transistor, 91: insulating film, 92a: oxide semiconductor film, 92b: oxide semiconductor film, 92c: oxide semiconductor film, 93: conductive film, 94: conductive film, 95: insulating film, 96: conductive film, 97: substrate, 400: substrate, 401: element isolation region, 402: impurity region, 403: impurity region, 404: channel formation region, 405: insulating film, 406: gate electrode, 411: insulating film, 412: conductive film, 413: conductive film, 414: conductive film, 416: conductive film, 417: conductive film, 418: conductive film, 420: insulating film, 421: insulating film, 422: insulating film, 430: semiconductor film, 430a: oxide semiconductor film, 430c: oxide semiconductor film, 431: gate insulating film, 432: conductive film, 433: conductive film, 434: gate electrode, 601: semiconductor substrate, 610: element isolation region, 611: insulating film, 612: insulating film, 613: insulating film, 625: conductive film, 626: conductive film, 627: conductive film, 634: conductive film, 635: conductive film, 636: conductive film, 637: conductive film, 644: conductive film, 651: conductive film, 652: conductive film, 653: conductive film, 661: insulating film, 662: gate insulating film, 663: insulating film, 701: semiconductor film, 710: region, 711: region, 721: conductive film, 722: conductive film, 731: gate electrode, 800: inverter, 801: circuit, 802: ring oscillator, 803: inverter, 804: inverter, 810: capacitor, 5001: housing, 5002: housing, 5003: display portion, 5004: display portion, 5005: microphone, 5006: speaker, 5007: operation key, 5008: stylus, 5101: car body, 5102: wheel, 5103: dashboard, 5104: light, 5301: housing, 5302: refrigerator door, 5303: freezer door, 5401: housing, 5402: display portion, 5403: keyboard, 5404: pointing device, 5601: housing, 5602: housing, 5603: display portion, 5604: display portion, 5605: joint, 5606: operation key, 5801: housing, 5802: housing, 5803: display portion, 5804: operation key, 5805: lens, and 5806: joint.

This application is based on Japanese Patent Application serial no. 2013-268613 filed with Japan Patent Office on Dec. 26, 2013 and Japanese Patent Application serial no. 2014-050958 filed with Japan Patent Office on Mar. 14, 2014, the entire contents of which are hereby incorporated by reference.

The invention claimed is:
1. A semiconductor device comprising:
    a first circuit comprising a first transistor and a second transistor one of a source and a drain of which is electrically connected to a gate of the first transistor; and
    a second circuit comprising a third transistor and a fourth transistor one of a source and a drain of which is electrically connected to a gate of the third transistor,
    wherein a gate of the second transistor is electrically connected to a gate of the fourth transistor,
    wherein a first signal is supplied to the gate of the second transistor and the gate of the fourth transistor,
    wherein a second signal is supplied to the other of the source and the drain of the second transistor,
    wherein a third signal is supplied to the other of the source and the drain of the fourth transistor,
    wherein an amplitude of the first signal is larger than an amplitude of the second signal and an amplitude of the third signal, and wherein when one of the second signal and the third signal is high, the other of the second signal and the third signal is low.

2. The semiconductor device according to claim 1, further comprising a circuit configured to generate the first signal.

3. The semiconductor device according to claim 1, wherein a high-level potential of the first signal is higher than a high-level potential of the second signal and a high-level potential of the third signal.

4. The semiconductor device according to claim 1, wherein a low-level potential of the first signal is lower than a low-level potential of the second signal and a low-level potential of the third signal.

5. The semiconductor device according to claim 1, wherein each of the second transistor and the fourth transistor comprises a channel formation region in an oxide semiconductor film.

6. The semiconductor device according to claim 5, wherein the oxide semiconductor film comprises indium, gallium, and zinc.

7. A semiconductor device comprising:
a first circuit comprising a first transistor and a second transistor one of a source and a drain of which is electrically connected to a gate of the first transistor;
a second circuit comprising a third transistor and a fourth transistor one of a source and a drain of which is electrically connected to a gate of the third transistor; and
a third circuit configured to generate a first signal which is supplied to a gate of the second transistor and a gate of the fourth transistor,
wherein a second signal is supplied to the other of the source and the drain of the second transistor,
wherein a third signal is supplied to the other of the source and the drain of the fourth transistor,
wherein the first signal comprises a pulse signal,
wherein an amplitude of the pulse signal is larger than an amplitude of the second signal and an amplitude of the third signal, and
wherein when one of the second signal and the third signal is high, the other of the second signal and the third signal is low.

8. The semiconductor device according to claim 7, wherein a high-level potential of the pulse signal is higher than a high-level potential of the second signal and a high-level potential of the third signal.

9. The semiconductor device according to claim 7, wherein a low-level potential of the pulse signal is lower than a low-level potential of the second signal and a low-level potential of the third signal.

10. The semiconductor device according to claim 7, wherein each of the second transistor and the fourth transistor comprises a channel formation region in an oxide semiconductor film.

11. The semiconductor device according to claim 10, wherein the oxide semiconductor film comprises indium, gallium, and zinc.

12. The semiconductor device according to claim 1, wherein the semiconductor device is configured so that a high-level potential of the first signal is set higher than a high-level potential of the second signal by a threshold voltage of the second transistor.

13. The semiconductor device according to claim 7, wherein the semiconductor device is configured so that a high-level potential of the pulse signal is set higher than a high-level potential of the second signal by a threshold voltage of the second transistor, and
wherein the semiconductor device is configured so that a high-level potential of the pulse signal is set higher than a high-level potential of the third signal by a threshold voltage of the fourth transistor.

14. A semiconductor device comprising:
a programmable logic device comprising a switch circuit comprising:
a first transistor; and
a second transistor comprising a channel formation region in an oxide semiconductor film,
wherein a first signal is supplied to a gate of the second transistor,
wherein a second signal is supplied to one of a source and a drain of the second transistor,
wherein a gate of the first transistor is electrically connected to the other of the source and the drain of the second transistor,
wherein an amplitude of the first signal is larger than an amplitude of the second signal.

15. The semiconductor device according to claim 14, further comprising a circuit configured to generate the first signal.

16. The semiconductor device according to claim 14, wherein a high-level potential of the first signal is higher than a high-level potential of the second signal.

17. The semiconductor device according to claim 14, wherein the semiconductor device is configured so that a high-level potential of the first signal is set higher than a high-level potential of the second signal by a threshold voltage of the second transistor.

18. The semiconductor device according to claim 14, wherein the oxide semiconductor film comprises indium, gallium, and zinc.

19. The semiconductor device according to claim 1, wherein the first signal comprises a pulse signal.

20. The semiconductor device according to claim 14, wherein the first signal comprises a pulse signal.

* * * * *